United States Patent
Hwang et al.

(10) Patent No.: US 11,793,063 B2
(45) Date of Patent: Oct. 17, 2023

(54) CONDENSED-CYCLIC COMPOUND AND ORGANIC LIGHT EMITTING DEVICE INCLUDING THE SAME

(71) Applicant: SAMSUNG DISPLAY CO., LTD., Yongin (KR)

(72) Inventors: Seokhwan Hwang, Yongin (KR); Hyejin Jung, Yongin (KR); Sooyon Kim, Yongin (KR); Youngkook Kim, Yongin (KR); Mieun Jun, Yongin (KR); Sanghyun Han, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 638 days.

(21) Appl. No.: 14/797,853

(22) Filed: Jul. 13, 2015

(65) Prior Publication Data
US 2016/0190450 A1    Jun. 30, 2016

(30) Foreign Application Priority Data

Dec. 24, 2014 (KR) .......................... 10-2014-0188648

(51) Int. Cl.
*H10K 85/60* (2023.01)
*H10K 50/11* (2023.01)
(Continued)

(52) U.S. Cl.
CPC .............. *H10K 85/322* (2023.02); *C07F 5/02* (2013.01); *C07F 7/0803* (2013.01);
(Continued)

(58) Field of Classification Search
CPC ..... H01L 51/0054; H01L 51/0059–006; H01L 51/5012; H01L 51/0061; H01L 51/008;
(Continued)

(56) References Cited

U.S. PATENT DOCUMENTS

2003/0152800 A1   8/2003   Tamao et al.
2003/0157366 A1   8/2003   Matsuura et al.
(Continued)

FOREIGN PATENT DOCUMENTS

EP      1 142 895 A1    10/2001
JP      2000-294373 A   10/2000
(Continued)

OTHER PUBLICATIONS

Crawford et al. J. Am. Chem. Soc. 2011, 133, 13349-13362 (Year: 2011).*
WO-2013039184-A1, machine translation (Year: 2013).*

*Primary Examiner* — Dylan C Kershner
*Assistant Examiner* — Elizabeth M. Dahlburg
(74) *Attorney, Agent, or Firm* — Lewis Roca Rothgerber Christie LLP

(57) ABSTRACT

A condensed-cyclic compound and an organic light-emitting device, the condensed-cyclic compound being represented by the following Formula 1:

<Formula 1>

(Continued)

2 Claims, 4 Drawing Sheets

(51) Int. Cl.
*H10K 85/30* (2023.01)
*C07F 7/08* (2006.01)
*C07F 5/02* (2006.01)

(52) U.S. Cl.
CPC ......... *H10K 85/622* (2023.02); *H10K 85/633* (2023.02); *H10K 50/11* (2023.02)

(58) Field of Classification Search
CPC .......... C07F 5/02; C07F 5/027; C07F 7/0803; C07F 5/27; C07F 7/08; C07C 2603/50; C09K 11/06; H10K 50/00; H10K 50/11; H10K 50/12; Y02E 10/542
See application file for complete search history.

(56) References Cited

U.S. PATENT DOCUMENTS

| | | | |
|---|---|---|---|
| 2006/0036114 A1* | 2/2006 | Wang | C07F 5/027 568/1 |
| 2007/0237984 A1 | 10/2007 | Matsuura et al. | |
| 2010/0052526 A1 | 3/2010 | Je et al. | |
| 2010/0163852 A1* | 7/2010 | Nagao | H05B 33/14 257/40 |
| 2010/0277061 A1 | 11/2010 | Matsuura et al. | |
| 2011/0248246 A1* | 10/2011 | Ogita | C09K 11/06 257/E51.026 |
| 2012/0056165 A1 | 3/2012 | Kawamura et al. | |
| 2013/0234118 A1* | 9/2013 | Kwon | C07D 307/91 257/40 |
| 2014/0326985 A1* | 11/2014 | Mizuki | H01L 51/0073 257/40 |
| 2014/0346482 A1 | 11/2014 | Mizuki et al. | |

FOREIGN PATENT DOCUMENTS

| | | | | |
|---|---|---|---|---|
| JP | 2003-234192 | A | 8/2003 | |
| JP | 2007-119454 | A | 5/2007 | |
| JP | WO 2007145136 | A1 * | 12/2007 | ............ H05B 33/14 |
| JP | 2008 280331 | A | 11/2008 | |
| JP | 4221050 | B2 | 11/2008 | |
| JP | 2010-056190 | A | 3/2010 | |
| JP | 2013-63930 | A | 4/2013 | |
| JP | 2013-63931 | A | 4/2013 | |
| KR | 1020090017475 | A | 2/2009 | |
| KR | 10-2011-0015213 | A | 2/2011 | |
| KR | 10-2011-0094271 | A | 8/2011 | |
| KR | 10-1132635 | B1 | 4/2012 | |
| WO | WO-2013039184 | A1 * | 3/2013 | ........... C07D 307/91 |

* cited by examiner

| 190 |
|-----|
| 150 |
| 110 |

| 190 |
|---|
| 150 |
| 110 |
| 210 |

| 220 |
|---|
| 190 |
| 150 |
| 110 |

| 220 |
|-----|
| 190 |
| 150 |
| 110 |
| 210 |

CONDENSED-CYCLIC COMPOUND AND ORGANIC LIGHT EMITTING DEVICE INCLUDING THE SAME

CROSS-REFERENCE TO RELATED APPLICATION

Korean Patent Application No. 10-2014-0188648, filed on Dec. 24, 2014, in the Korean Intellectual Property Office, and entitled: "Condensed-Cyclic Compound and Organic Light Emitting Device Comprising The Same," is incorporated by reference herein in its entirety.

BACKGROUND

1. Field

Embodiments relate to a condensed-cyclic compound and an organic light-emitting device including the same.

2. Description of the Related Art

Organic light-emitting devices (OLEDs) are self-emission devices that have wide viewing angles, high contrast ratios, and short response times. The OLEDs may exhibit excellent luminance, driving voltage, and response speed characteristics, and produce full-color images.

The organic light-emitting device may include a first electrode disposed on a substrate, and a hole transport region, an emission layer, an electron transport region, and a second electrode, which are sequentially disposed on the first electrode. Holes provided from the first electrode may move toward the emission layer through the hole transport region, and electrons provided from the second electrode may move toward the emission layer through the electron transport region. The holes and the electrons may be recombined in the emission layer to produce excitons. These excitons change from an excited state to a ground state to thereby generate light.

SUMMARY

Embodiments are directed to a condensed-cyclic compound and an organic light-emitting device including the same.

According to one or more exemplary embodiments, a condensed-cyclic compound represented by Formula 1 is provided:

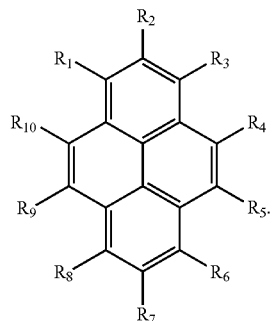

<Formula 1>

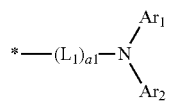

<Formula 2A>

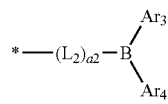

<Formula 2B> wherein in Formulae 1, 2A, and 2B, $L_1$ and $L_2$ are each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

a1 and a2 are each independently selected from 0, 1, 2, and 3, when a1 is 2 or more, a plurality of $L_1$s are identical to or different from each other, and when a2 is 2 or more, a plurality of $L_2$s are identical to or different from each other;

$Ar_1$ to $Ar_4$ are each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

$R_1$ to $R_{10}$ are each independently selected from a group represented by Formula 2A, a group represented by Formula 2B, a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, and —Si($Q_1$)($Q_2$)($Q_3$);

one selected from $R_1$ to $R_{10}$ is the group represented by Formula 2A, and another one selected from $R_1$ to $R_{10}$ is the group represented by Formula 2B;

at least one of substituents of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group is selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{11}$)($Q_{12}$)($Q_{13}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{21}$)($Q_{22}$)($Q_{23}$); and —Si($Q_{31}$)($Q_{32}$)($Q_{33}$);

wherein $Q_1$ to $Q_3$, $Q_{11}$ to $Q_{13}$, $Q_{21}$ to $Q_{23}$, and $Q_{31}$ to $Q_{33}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

According to one or more exemplary embodiments, an organic light-emitting device includes: a first electrode; a second electrode facing the first electrode; and an organic layer that is disposed between the first electrode and the second electrode and including an emission layer; wherein the organic layer includes at least one the condensed-cyclic compound described above.

BRIEF DESCRIPTION OF THE DRAWINGS

Features will be apparent to those of skill in the art by describing in detail exemplary embodiments with reference to the attached drawings in which:

FIGS. 1 to 4 illustrate schematic views of an organic light-emitting device according to an exemplary embodiment.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list A condensed-cyclic compound may be represented by Formula 1.

<Formula 1>

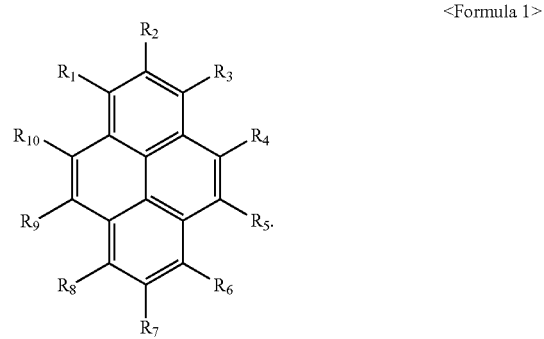

In Formula 1, $R_1$ to $R_{10}$ may each independently be selected from or include, e.g., a group represented by Formula 2A, a group represented by Formula 2B, a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, and —Si($Q_1$)($Q_2$)($Q_3$).

In Formula 1, one selected from $R_1$ to $R_{10}$ may be a group represented by Formula 2A, and another one selected from $R_1$ to $R_{10}$ may be a group represented by Formula 2B.

In Formula 2A and 2B, $L_1$ and $L_2$ may each independently be selected from or include, e.g., a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group.

In some embodiments, in Formulae 2A and 2B, $L_1$ and $L_2$ may be each independently selected from:
a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, a dibenzocarbazolylene group, a thiadiazolylene group, an imidazopyridinylene group, and an imidazopyrimidinylene group; and a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isoxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a carbazolylene group, a phenanthridinylene group, an acridinylene group, a phenanthrolinylene group, a phenazinylene group, a benzimidazolylene group, a benzofuranylene group, a benzothiophenylene group, an isobenzothiazolylene group, a benzoxazolylene group, an isobenzoxazolylene group, a triazolylene group, a tetrazolylene group, an oxadiazolylene group, a triazinylene group, a dibenzofuranylene group, a dibenzothiophenylene group, a benzocarbazolylene group, a dibenzocarbazolylene group, a thiadiazolylene group, an imidazopyridinylene group, and an imidazopyrimidinylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a phenylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group.

In some embodiments, in Formulae 2A and 2B, $L_1$ and $L_2$ may each independently be a group represented by one of the following Formulae 3-1 to 3-35.

Formula 3-1
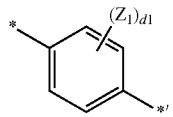

Formula 3-2
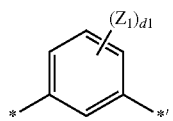

Formula 3-3
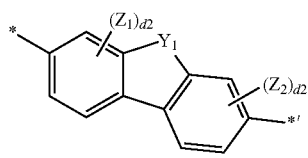

Formula 3-4
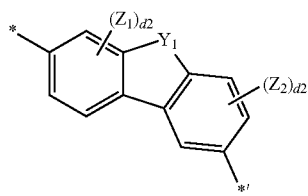

Formula 3-5
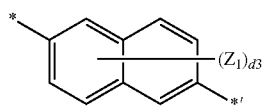

Formula 3-6
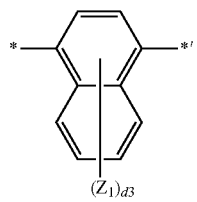

Formula 3-7
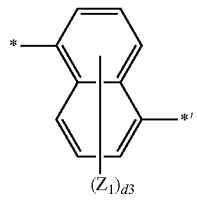

Formula 3-8
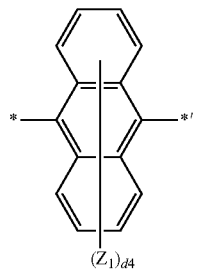

Formula 3-9
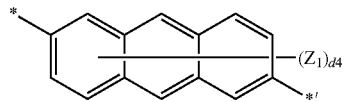

Formula 3-10
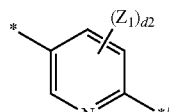

Formula 3-11
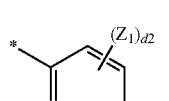

Formula 3-12
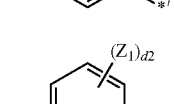

Formula 3-13
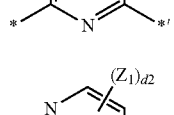

Formula 3-14
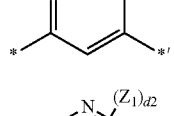

Formula 3-15
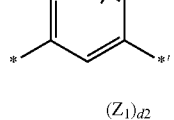

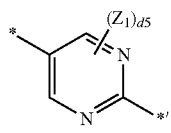
Formula 3-16
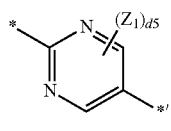
Formula 3-17
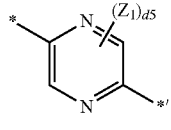
Formula 3-18
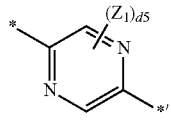
Formula 3-19
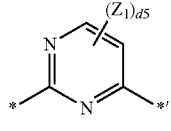
Formula 3-20
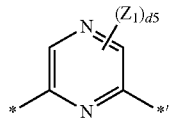
Formula 3-21
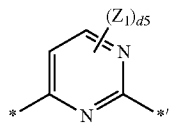
Formula 3-22
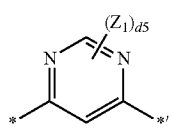
Formula 3-23
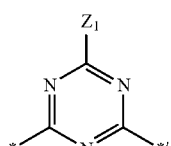
Formula 3-24
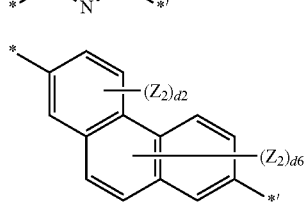
Formula 3-25
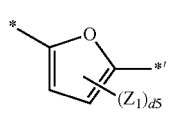
Formula 3-26
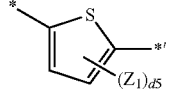
Formula 3-27
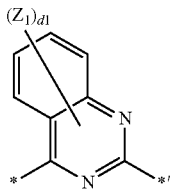
Formula 3-28
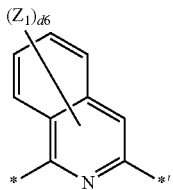
Formula 3-29
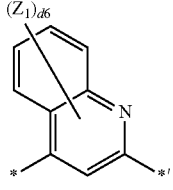
Formula 3-30
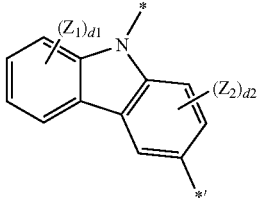
Formula 3-31
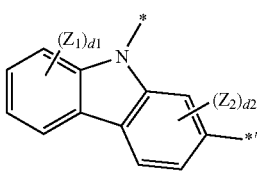
Formula 3-32
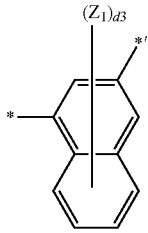
Formula 3-33
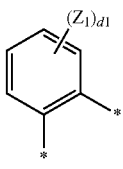
Formula 3-34

Formula 3-35

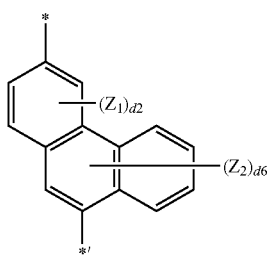

In Formulae 3-1 to 3-35,
$Y_1$ may be selected from O, S, $C(Z_3)(Z_4)$, $N(Z_5)$, and $Si(Z_6)(Z_7)$;
$Z_1$ to $Z_7$ may each independently be selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;
d1 may be an integer selected from 1 to 4;
d2 may be an integer selected from 1 to 3;
d3 may be an integer selected from 1 to 6;
d4 may be an integer selected from 1 to 8;
d5 may be an integer selected from 1 and 2;
d6 may be an integer selected from 1 to 5; and
* and *′ each indicates a binding site to an adjacent atom.

In some embodiments, in Formulae 2A and 2B, $L_1$ and $L_2$ may each independently be selected from:
a phenylene group, a naphthylene group, a pyridinylene group, a dibenzofuranylene group, and a dibenzothiophenylene group; and
a phenylene group, a naphthylene group, a pyridinylene group, a dibenzofuranylene group, and a dibenzothiophenylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a phenyl group, a naphthyl group, a pyridinyl group, a pyrimidinyl group, and a triazinyl group.

In some embodiments, in Formula 2, in Formulae 2A and 2B, $L_1$ and $L_2$ may each independently be a group represented by one of the following Formulae 4-1 to 4-28.

Formula 4-1

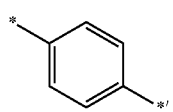

Formula 4-2

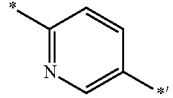

Formula 4-3

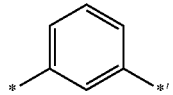

Formula 4-4

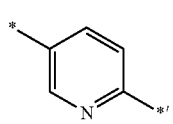

Formula 4-5

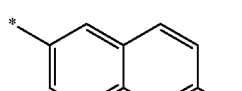

Formula 4-6

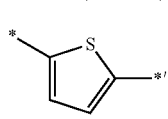

Formula 4-7

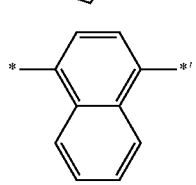

Formula 4-8

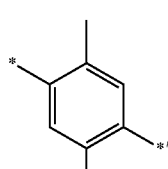

Formula 4-9

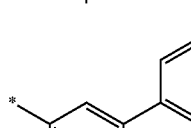

Formula 4-10

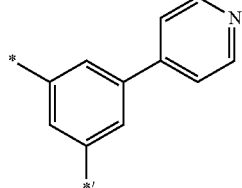

Formula 4-11

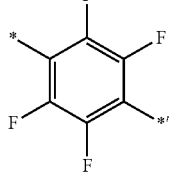

Formula 4-12

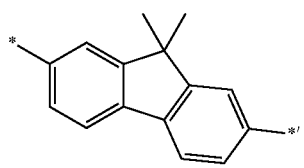

-continued

Formula 4-13
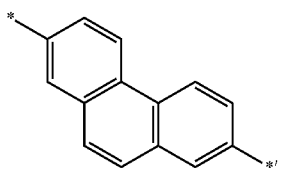

Formula 4-14
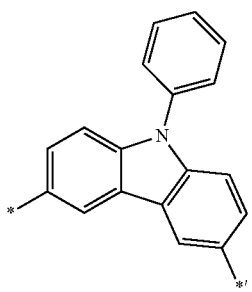

Formula 4-15
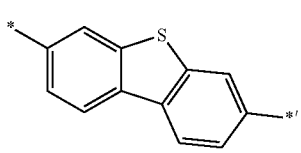

Formula 4-16
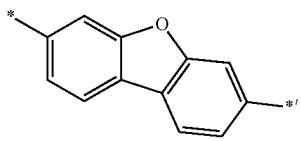

Formula 4-17
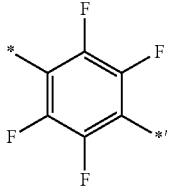

Formula 4-18
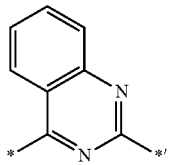

Formula 4-19
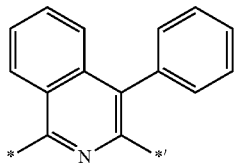

Formula 4-20
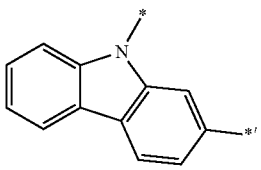

-continued

Formula 4-21
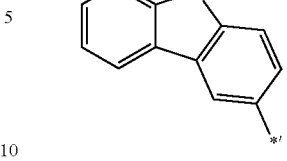

Formula 4-22
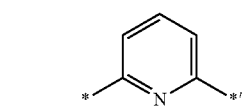

Formula 4-23

Formula 4-24
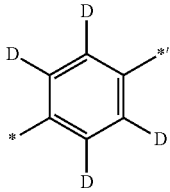

Formula 4-25

Formula 4-26

Formula 4-27

Formula 4-28

In Formulae 4-1 to 4-28, * and *' each indicates a binding site to an adjacent atom.

In Formula 2A and 2B, a1 and a2 may each independently be selected from, e.g., 0, 1, 2, and 3. a1 in Formula 2A indicates the number of $L_1$. When a1 is 2 or more, a plurality of $L_1$s may be identical to or different from each other. When a1 is 0, *-$(L_1)_{a1}$-*' may be a single bond. In some embodiments, a2 may be selected from 0, 1, and 2. a2 in Formula 2B indicates the number of $L_2$. When a2 is 2 or more, a plurality of $L_2$s may be identical to or different from each other. When a2 is 0, *-(L$_2$)$_{a2}$-*' may be a single bond. In some embodiments, a2 may be selected from 0, 1, and 2. In some embodiments, a2 may be selected from 0, 1, and 2. In some embodiments, in Formulae 2A and 2B, a1 and a2 may both be 0.

In Formulae 2A and 2B, Ar$_1$ to Ar$_4$ may each independently be selected from or include, e.g., a substituted or unsubstituted C$_3$-C$_{10}$ cycloalkyl group, a substituted or unsubstituted C$_1$-C$_{10}$ heterocycloalkyl group, a substituted or unsubstituted C$_3$-C$_{10}$ cycloalkenyl group, a substituted or unsubstituted C$_1$-C$_{10}$ heterocycloalkenyl group, a substituted or unsubstituted C$_6$-C$_{60}$ aryl group, a substituted or unsubstituted C$_1$-C$_{60}$ heteroaryl group, a substituted or unsubstituted monovalent non-aromatic condensed polycyclic group, and a substituted or unsubstituted monovalent non-aromatic condensed heteropolycyclic group;

In some embodiments, in Formulae 2A and 2B, Ar$_1$ and Ar$_4$ may each independently be selected from:

a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group a dibenzosilolyl group, a thiadiazolyl group, an imidazopyridinyl group, and an imidazopyrimidinyl group; and a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, an imidazopyrimidinyl group, and —Si(Q$_{31}$)(Q$_{32}$)(Q$_{33}$).

Q$_{31}$ to Q$_{33}$ may each independently be selected from a C$_1$-C$_{10}$ alkyl group, a C$_1$-C$_{10}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, an oxadiazolyl group, a triazinyl group, a dibenzofuranyl group, a dibenzothiophenyl group, a benzocarbazolyl group, a dibenzocarbazolyl group, a dibenzosilolyl group, a thiadiazolyl group, an imidazopyridinyl group, and an imidazopyrimidinyl group.

In some embodiments, in Formulae 2A and 2B, $Ar_1$ and $Ar_4$ may each independently be selected from:
- a phenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a phenalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, and an imidazopyrimidinyl group; and
- a phenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a phenalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, and an imidazopyrimidinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a $C_1$-$C_{10}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, an imidazopyrimidinyl group, and —Si($Q_{31}$)($Q_{32}$)($Q_{33}$);

wherein $Q_{31}$ to $Q_{33}$ may each independently be selected from a $C_1$-$C_{10}$ alkyl group, a $C_1$-$C_{10}$ alkoxy group, a phenyl group, and a naphthyl group.

In some embodiments, in Formulae 2A and 2B, $Ar_1$ and $Ar_4$ may each independently be selected from:
- a phenyl group, a naphthyl group, a fluorenyl group, a phenanthrenyl group, a phenalenyl group, a pyridinyl group, a pyrimidinyl group, a triazinyl group, a dibenzofuranyl group, and a dibenzothiophenyl group; and
- a phenyl group, a naphthyl group, a fluorenyl group, a phenanthrenyl group, a phenalenyl group, a pyridinyl group, a pyrimidinyl group, a triazinyl group, a dibenzofuranyl group, and a dibenzothiophenyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a $C_1$-$C_{10}$ alkoxy group, a phenyl group, a naphthyl group, a fluorenyl group, a phenanthrenyl group, a phenalenyl group, a pyridinyl group, a pyrimidinyl group, a triazinyl group, a dibenzofuranyl group, a dibenzothiophenyl group, and —Si($Q_{31}$)($Q_{32}$)($Q_{33}$);

wherein $Q_{31}$ to $Q_{33}$ may each independently be selected from a $C_1$-$C_{10}$ alkyl group, a $C_1$-$C_{10}$ alkoxy group, a phenyl group, and a naphthyl group.

In Formula 1, $R_1$ to $R_{10}$ may each independently be selected from:
- the group represented by Formula 2A, the group represented by Formula 2B, a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, and a $C_1$-$C_{20}$ alkoxy group;
- a phenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a phenalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, and an imidazopyrimidinyl group;
- a phenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, and an imidazopyrimidinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a $C_1$-$C_{10}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a phenalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, a quinolinyl group, an isoquinolinyl group, a benzoquinolinyl group, a quinoxalinyl group, a quinazolinyl group, a carbazolyl group, a benzoimidazolyl group, a benzofuranyl group, a benzothiophenyl group, an isobenzothiazolyl group, a benzoxazolyl group, an isobenzoxazolyl group, an oxadiazolyl group, a triazinyl group, a dibenzofuranyl group, a dibenzothiophenyl group, an imidazopyridinyl group, an imidazopyrimidinyl group, and —Si($Q_{31}$)($Q_{32}$)($Q_{33}$); and —Si($Q_1$)($Q_2$)($Q_3$);

wherein $Q_1$ to $Q_3$ and $Q_{31}$ to $Q_{33}$ may be each independently selected from a $C_1$-$C_{10}$ alkyl group, a $C_1$-$C_{10}$ alkoxy group, a phenyl group, and a naphthyl group.

In some embodiments, in Formula 1, $R_1$ to $R_{10}$ may each independently be selected from:

the group represented by Formula 2A, the group represented by Formula 2B, a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, and a $C_1$-$C_{10}$ alkoxy group;

a phenyl group, a naphthyl group, a phenalenyl group, a pyridinyl group, a pyrimidinyl group, and a triazinyl group;

a phenyl group, a naphthyl group, a phenalenyl group, a pyridinyl group, a pyrimidinyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a $C_1$-$C_{10}$ alkoxy group, a phenyl group, a naphthyl group, a pyridinyl group, a pyrimidinyl group, a triazinyl group, and —Si($Q_{31}$)($Q_{32}$)($Q_{33}$); and —Si($Q_1$)($Q_2$)($Q_3$);

wherein $Q_1$ to $Q_3$ and $Q_{31}$ to $Q_{33}$ may each independently be selected from a $C_1$-$C_{10}$ alkyl group, a $C_1$-$C_{10}$ alkoxy group, a phenyl group, and a naphthyl group.

In some embodiments, in Formulae 1, 2A, and 2B, $Ar_1$ to $Ar_4$ may each independently be a group represented by one of the following Formulae 5-1 to 5-43;

$R_1$ to $R_{10}$ may each independently be selected from the group represented by Formula 2A, the group represented by Formula 2B, a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, —Si($Q_1$)($Q_2$)($Q_3$), and groups represented by Formulae 5-1 to 5-43; wherein $Q_1$ to $Q_3$ may be each independently selected from a $C_1$-$C_{10}$ alkyl group, a $C_1$-$C_{10}$ alkoxy group, a phenyl group, and a naphthyl group.

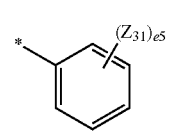

Formula 5-1

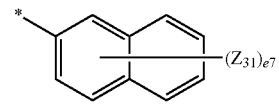

Formula 5-2

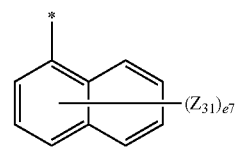

Formula 5-3

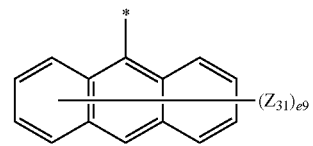

Formula 5-4

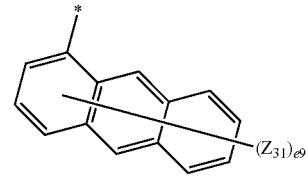

Formula 5-5

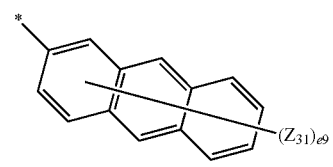

Formula 5-6

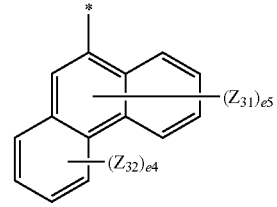

Formula 5-7

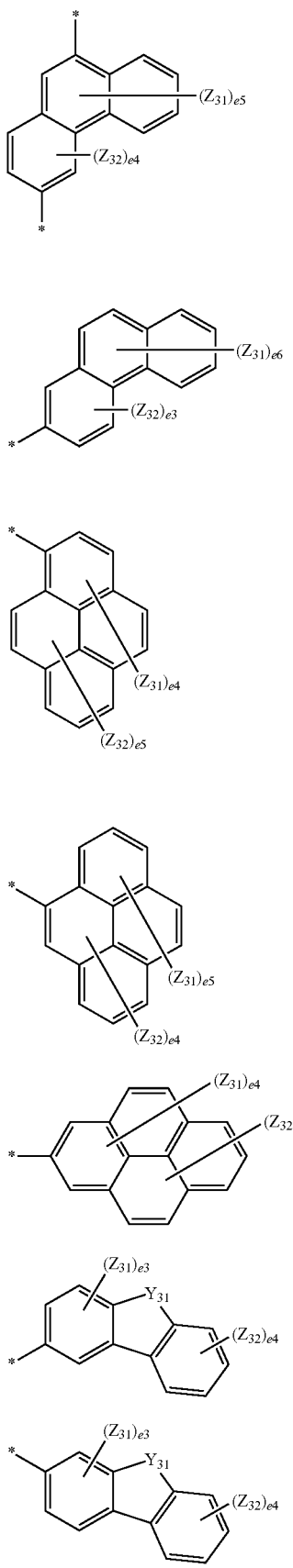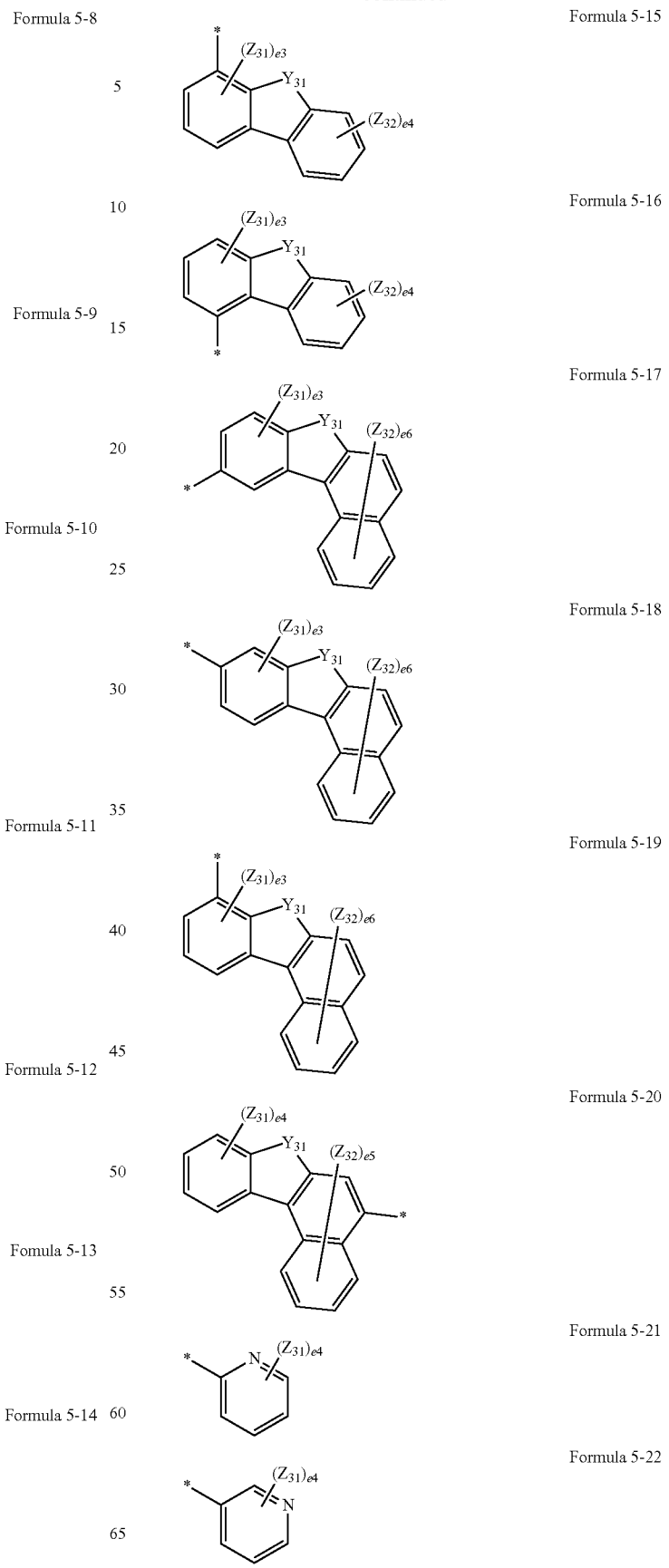

-continued

Formula 5-23
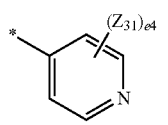

Formula 5-24
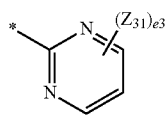

Formula 5-25
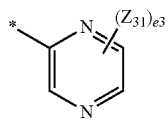

Formula 5-26
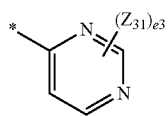

Formula 5-27
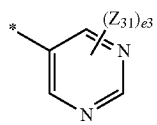

Formula 5-28
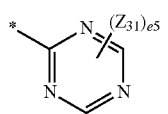

Formula 5-29
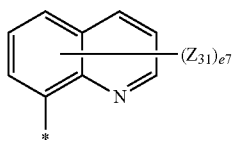

Formula 5-30
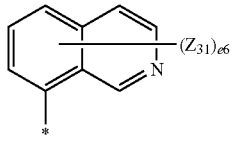

Formula 5-31
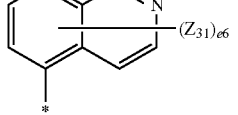

Formula 5-32
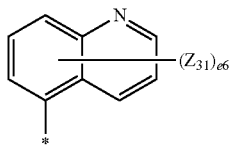

Formula 5-33
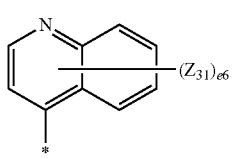

Formula 5-34
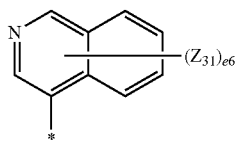

Formula 5-35
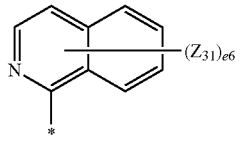

Formula 5-36
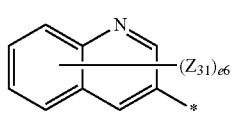

Formula 5-37
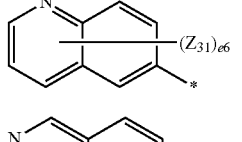

Formula 5-38
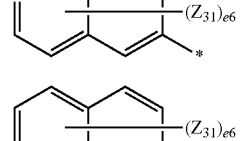

Formula 5-39
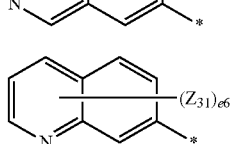

Formula 5-40
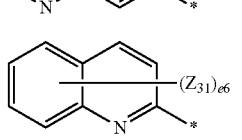

Formula 5-41
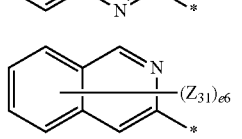

Formula 5-42
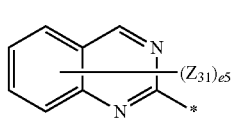

Formula 5-43
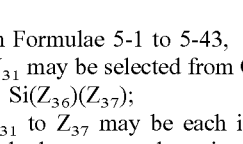

In Formulae 5-1 to 5-43, $Y_{31}$ may be selected from O, S, $C(Z_{33})(Z_{34})$, $N(Z_{35})$, and $Si(Z_{36})(Z_{37})$;

$Z_{31}$ to $Z_{37}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;
e3 may be an integer selected from 1 to 3,
e4 may be an integer selected from 1 to 4,
e5 may be an integer selected from 1 to 5,
e6 may be an integer selected from 1 to 6,
e7 may be an integer selected from 1 to 7,
e8 may be an integer selected from 1 to 8,
e9 may be an integer selected from 1 to 9, and
* indicates a binding site to an adjacent atom.

In some embodiments, in Formulae 5-1 to 5-43,
$Y_{31}$ may be selected from O, S, $C(Z_{33})(Z_{34})$, $N(Z_{35})$, and $Si(Z_{36})(Z_{37})$;
$Z_{31}$ to $Z_{37}$ may each independently be selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a $C_1$-$C_{10}$ alkoxy group, a phenyl group, a naphthyl group, a fluorenyl group, a spiro-fluorenyl group, a benzofluorenyl group, a dibenzofluorenyl group, a phenanthrenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;
e3 to e9 may each independently be an integer selected from 1 to 3; and
* indicates a binding site to an adjacent atom.

In some embodiments, in Formulae 1, 2A, and 2B,
$Ar_1$ to $Ar_4$ may each independently be a group represented by one of the following Formulae 6-1 to 6-41; and
$R_1$ to $R_{10}$ may each independently be selected from the group represented by Formula 2A, the group represented by Formula 2B, a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, —Si($Q_1$)($Q_2$)($Q_3$), a phenyl group, a naphthyl group, a phenalenyl group, a pyridinyl group, a pyrimidinyl group, and a triazinyl group, wherein $Q_1$ to $Q_3$ may each independently be selected from a $C_1$-$C_{10}$ alkyl group, a $C_1$-$C_{10}$ alkoxy group, a phenyl group, and a naphthyl group.

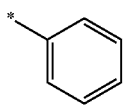

Formula 6-1

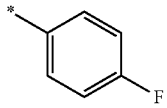

Formula 6-2

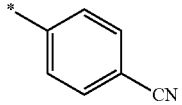

Formula 6-3

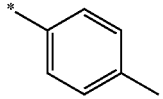

Formula 6-4

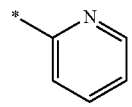

Formula 6-5

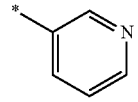

Formula 6-6

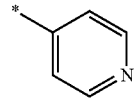

Formula 6-7

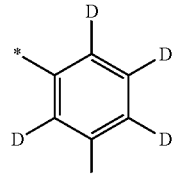

Formula 6-8

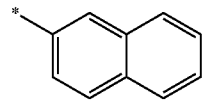

Formula 6-9

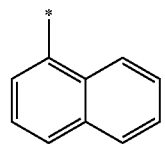

Formula 6-10

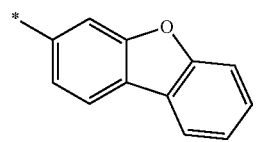

Formula 6-11

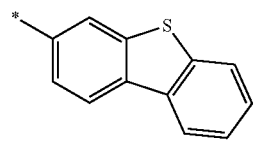

Formula 6-12

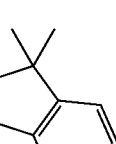

Formula 6-13

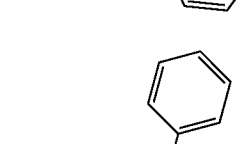

Formula 6-14

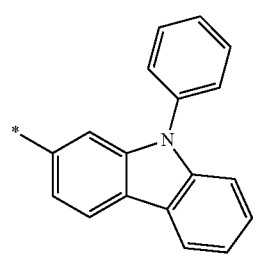

-continued

Formula 6-15

Formula 6-16

Formula 6-17

Formula 6-18

Formula 6-19

Formula 6-20

Formula 6-21

Formula 6-22

Formula 6-23

Formula 6-24

Formula 6-25

Formula 6-26

Formula 6-27

Formula 6-28

Formula 6-29

Formula 6-30

Formula 6-31

Formula 6-32 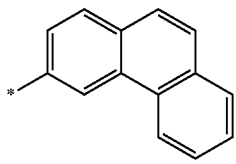

Formula 6-33 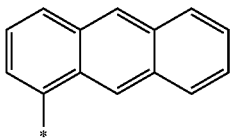

Formula 6-34 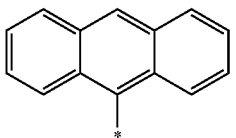

Formula 6-35 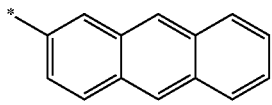

Formula 6-36 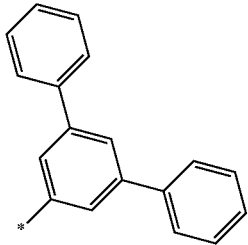

Formula 6-37 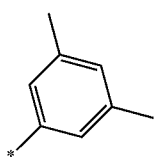

Formula 6-38 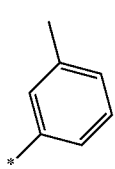

Formula 6-39 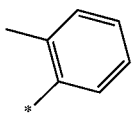

Formula 6-40 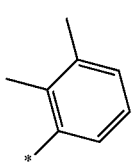

Formula 6-41 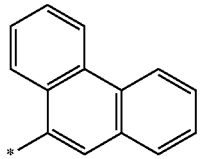

In Formulae 6-1 to 6-41, * indicates a binding site to an adjacent atom.

In Formula 1, $R_2$, $R_4$, $R_5$, $R_7$, $R_9$, and $R_{10}$ may each independently be selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a pyridinyl group, a pyrimidinyl group, and a triazinyl group.

In some embodiments, in Formula 1, $R_2$, $R_4$, $R_5$, $R_7$, $R_9$, and $R_{10}$ may be a hydrogen.

In some embodiments, in Formula 1, $R_1$ and $R_6$ may both be a hydrogen; one of $R_1$ and $R_6$ may not be a hydrogen; or both $R_1$ and $R_6$ may not be a hydrogen.

In some embodiments, the condensed-cyclic compound represented by Formula 1 may be represented by one of Formulae 1A to 1C.

<Formula 1A>
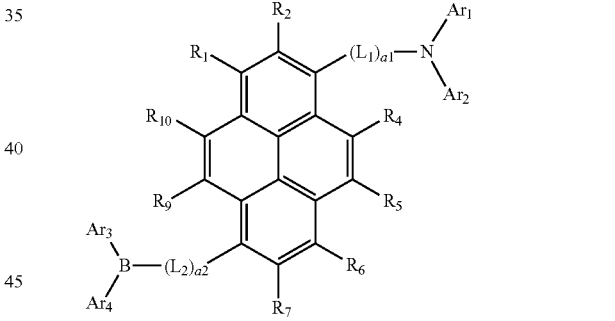

<Formula 1B>
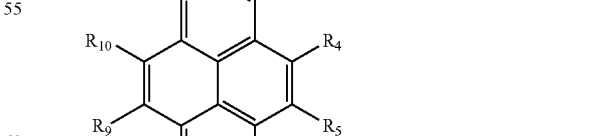
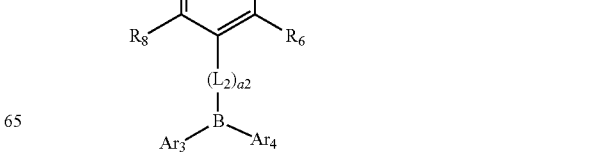

<Formula 1C>

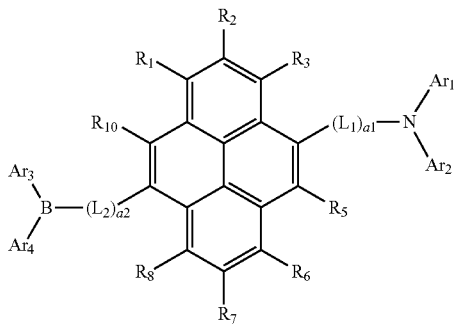

<Formula 1(1)>

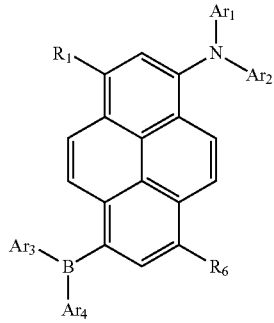

<Formula 1(2)>

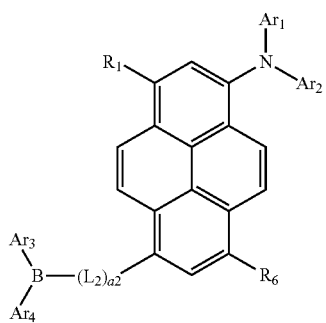

<Formula 1(3)>

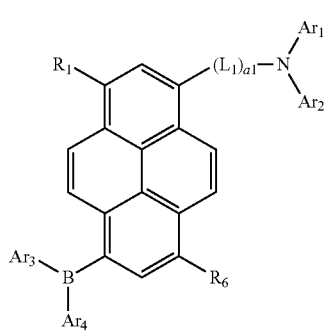

<Formula 1(4)>

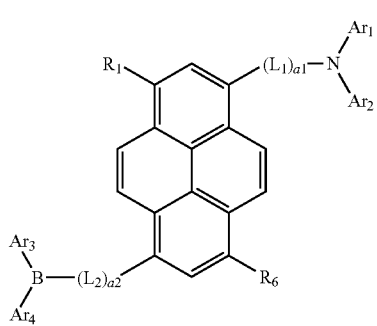

In Formulae 1A to 1C, $L_1$, $L_2$, a1, a2, $Ar_1$ to $Ar_4$, and $R_1$ to $R_{10}$ may be understood by referring to the description provided herein with respect to Formulae 1, 2A, and 2B.

In some embodiments, in Formulae 1A to 1C, a1 and a2 may both be 0;

a1 may be 0, and a2 may be 1 or 2;

a1 may be 1 or 2, and a2 may be 0;

a1 and a2 may both be 1;

a1 may be 1, and a2 may be 2;

a1 may be 2, and a2 may be 1; or a1 and a2 may both be 2.

In some embodiments, in Formulae 1A to 1C, a1 and a2 may both be 0;

a1 may be 0, and a2 may be 1;

a1 may be 1, and a2 may be 0; or a1 and a2 may both be 1.

In Formulae 1A to 1C, $Ar_1 = Ar_2 = Ar_3 = Ar_4$;

$Ar_1 = Ar_3$, $Ar_2 = Ar_4$, and $Ar_2 \neq Ar_3$;

$Ar_1 = Ar_3$, $Ar_2 \neq Ar_4$, and $Ar_2 \neq Ar_3$; or $Ar_1 \neq Ar_2 \neq Ar_3 \neq Ar_4$.

In some embodiments, in Formulae 1A to 1C, $R_1$ to $R_{10}$ may each independently be selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, —Si($Q_1$)($Q_2$)($Q_3$), a phenyl group, a naphthyl group, a phenalenyl group, a pyridinyl group, a pyrimidinyl group, and a triazinyl group;

wherein $Q_1$ to $Q_3$ may each independently be selected from a $C_1$-$C_{10}$ alkyl group, a $C_1$-$C_{10}$ alkoxy group, a phenyl group, and a naphthyl group;

$L_1$ and $L_2$ may each independently be selected from groups represented by Formulae 3-1 to 3-35 (e.g., groups represented by Formulae 4-1 to 4-28);

a1 and a2 may be each independently selected from 0, 1, and 2; and $Ar_1$ to $Ar_4$ may each independently be selected from groups represented by Formulae 5-1 to 5-43 (e.g., groups represented by Formulae 6-1 to 6-41).

In some embodiments, the condensed-cyclic compound represented by Formula 1 may be represented by one of the following Formulae 1(1) to 1(4).

In Formulae 1(1) to 1(4), $L_1$, $L_2$, a1, a2, $Ar_1$ to $Ar_4$, $R_1$, and $R_6$ may be the same as defined herein with respect to Formulae 1, 2A, and 2B.

In some embodiments, in Formulae 1(1) to 1(4), both $R_1$ and $R_6$ may both be a hydrogen; one of $R_1$ and $R_6$ may not be a hydrogen; or both $R_1$ and $R_6$ may not be a hydrogen.

In some embodiments, in Formulae 1(1) to 1(4), $R_1$ and $R_6$ may each independently be selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, —Si($Q_1$)($Q_2$)($Q_3$), a phenyl group, a naphthyl group, a pyridinyl group, a pyrimidinyl group, and a triazinyl group;

wherein $Q_1$ to $Q_3$ may each independently be selected from a $C_1$-$C_{10}$ alkyl group, a $C_1$-$C_{10}$ alkoxy group, a phenyl group, and a naphthyl group;

$L_1$ and $L_2$ may each independently be selected from groups represented by Formulae 3-1 to 3-35 (e.g., groups represented by Formulae 4-1 to 4-28 above);

a1 and a2 may be each independently selected from 0, 1, and 2; and $Ar_1$ to $Ar_4$ may each independently be selected from groups represented by Formulae 5-1 to 5-43 (e.g., groups represented by Formulae 6-1 to 6-41).

In some embodiments, the condensed-cyclic compound represented by Formula 1 may be one of the following Compounds 1 to 84.

1

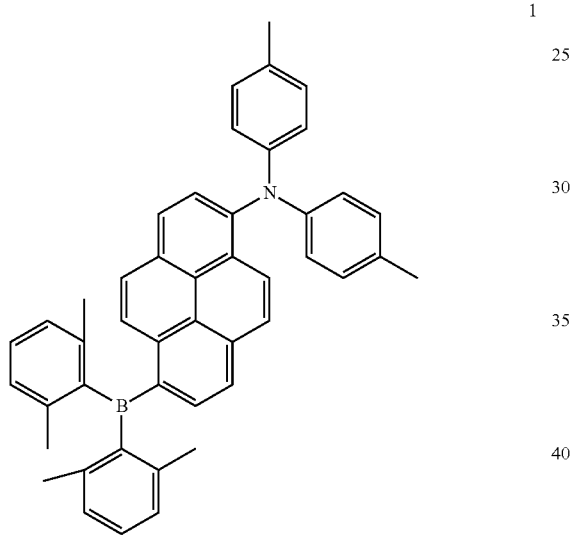

2

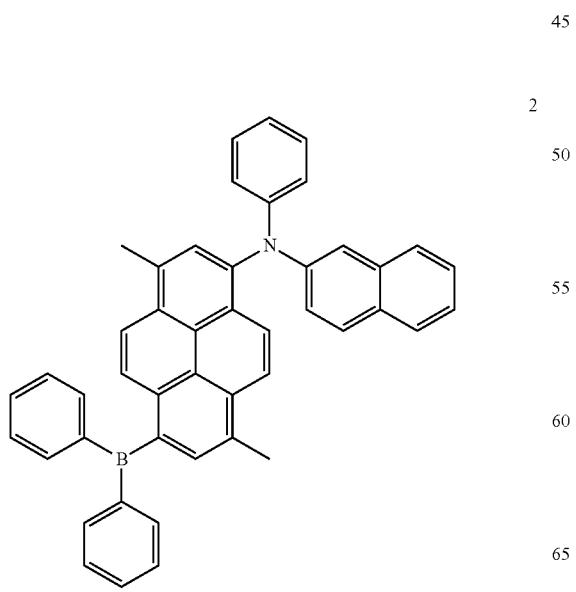

3

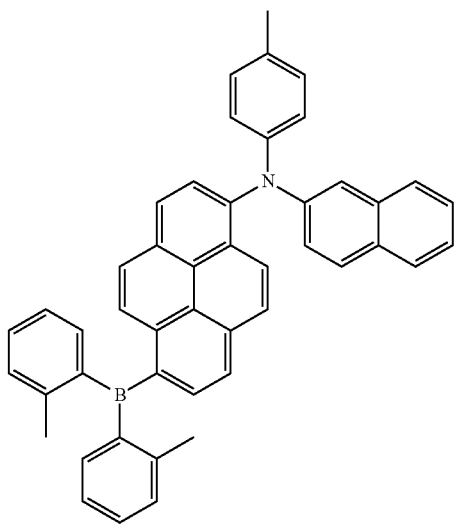

4

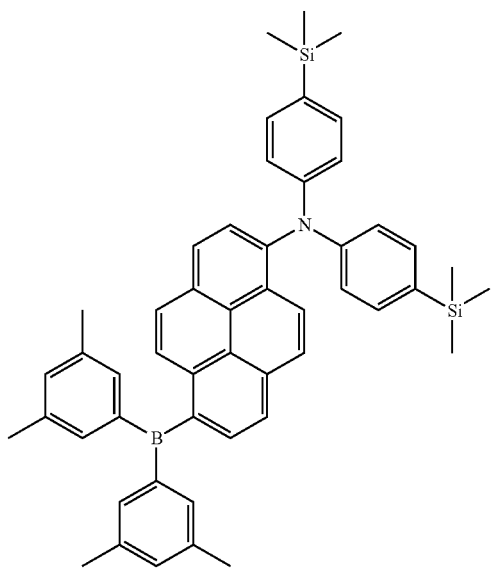

5
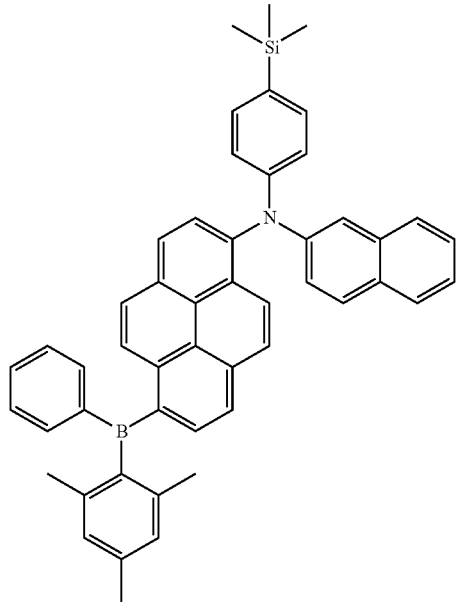
6
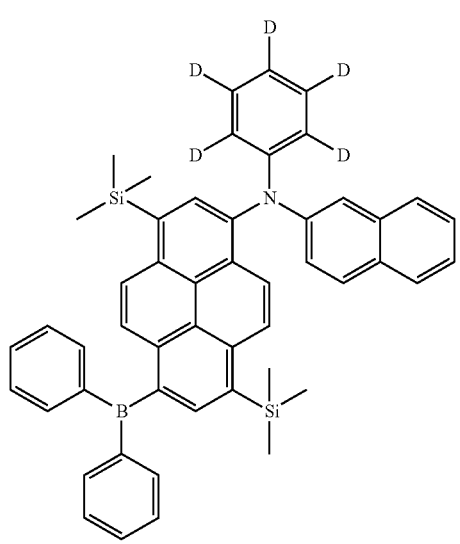
7
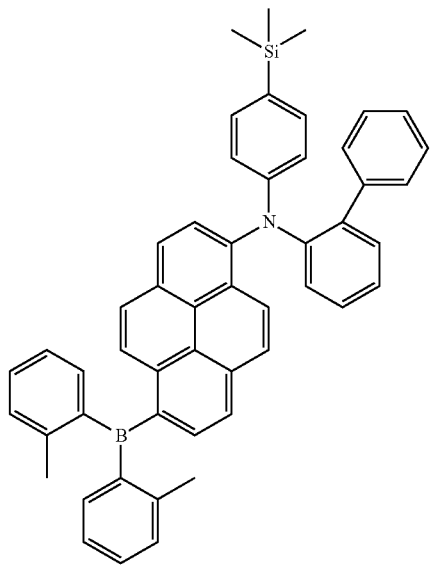
8
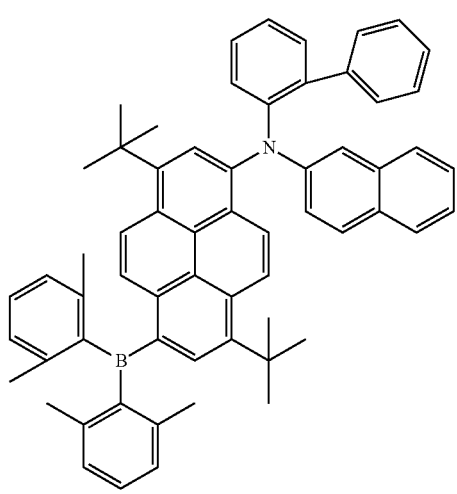
9

37
-continued
10
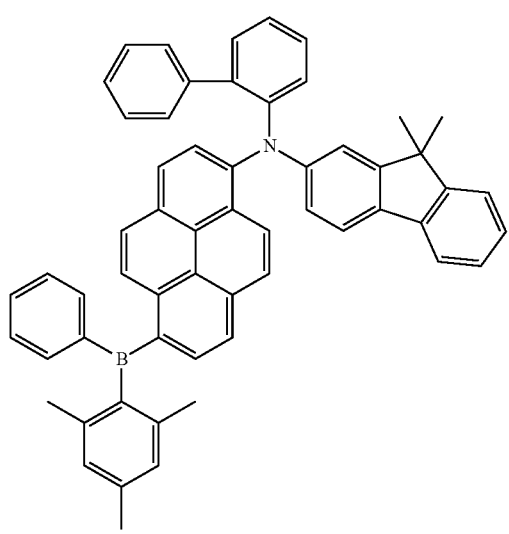
11
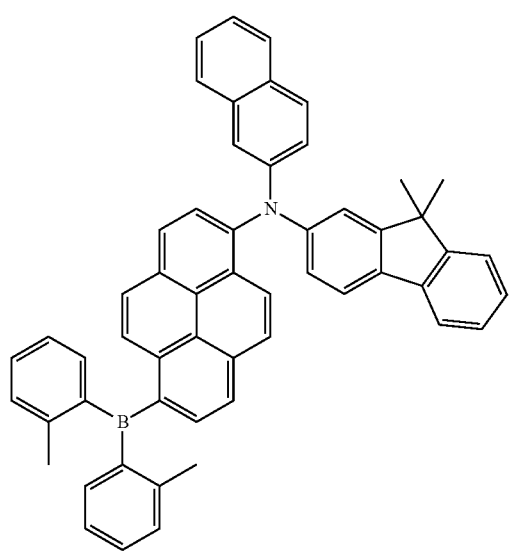
12
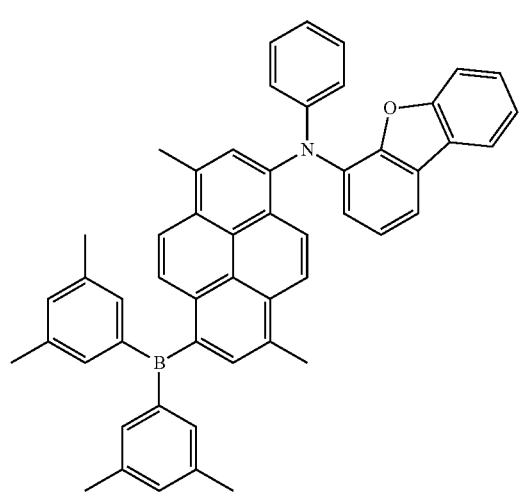
38
-continued
13
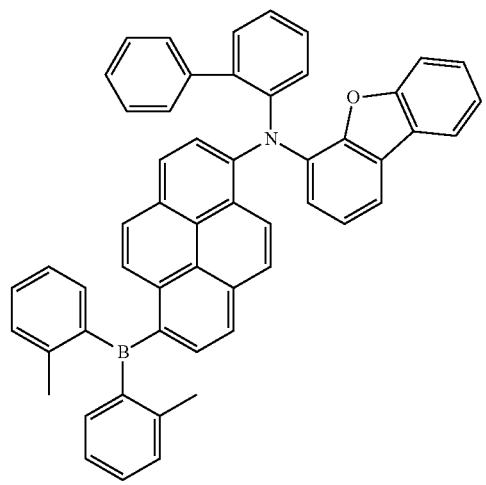
14
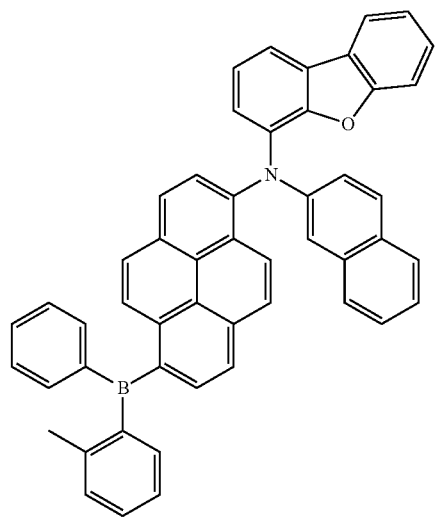
15
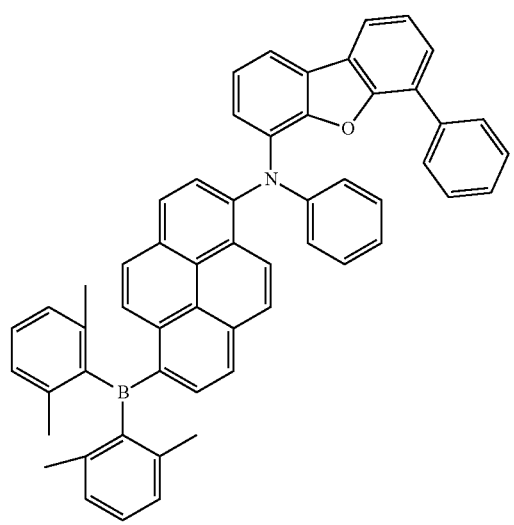

16
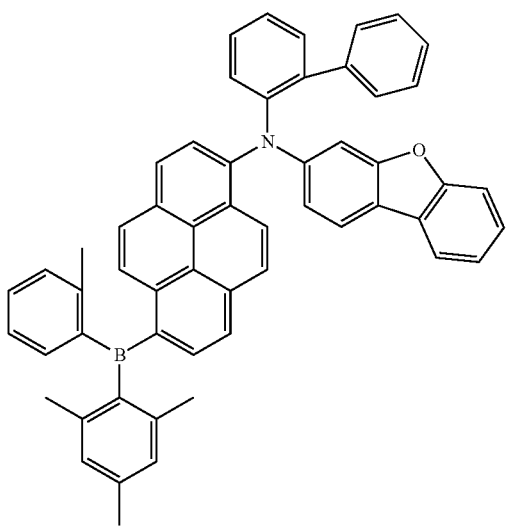
17
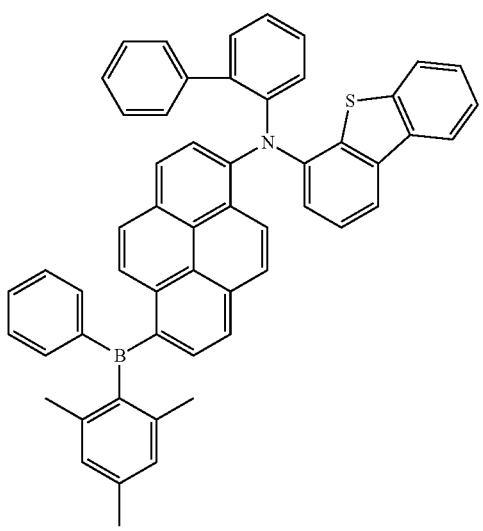
18
19
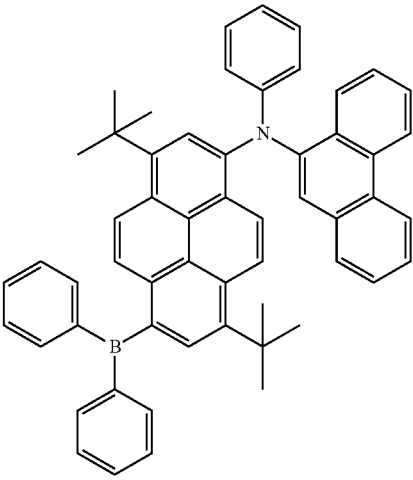
20
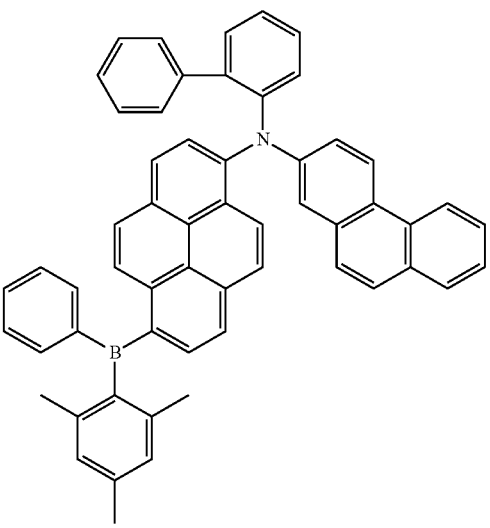
21
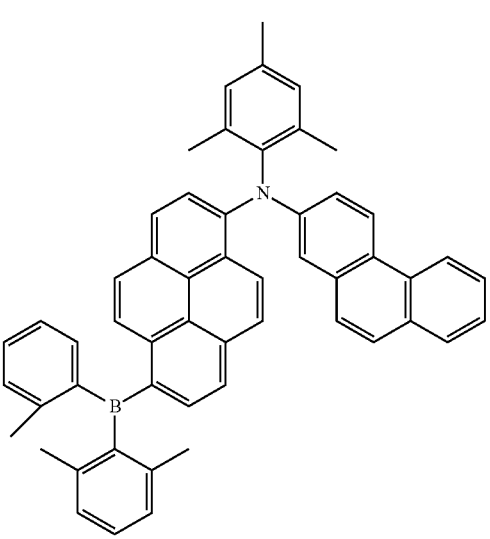

22
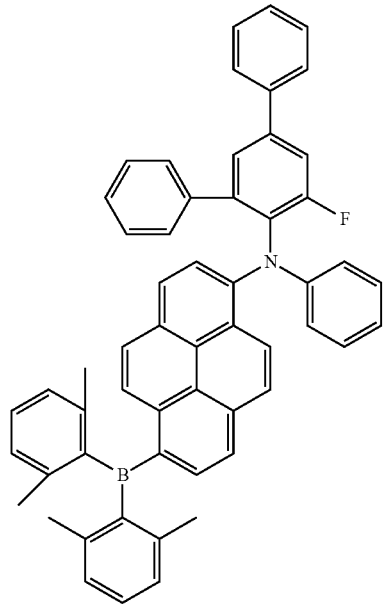
23
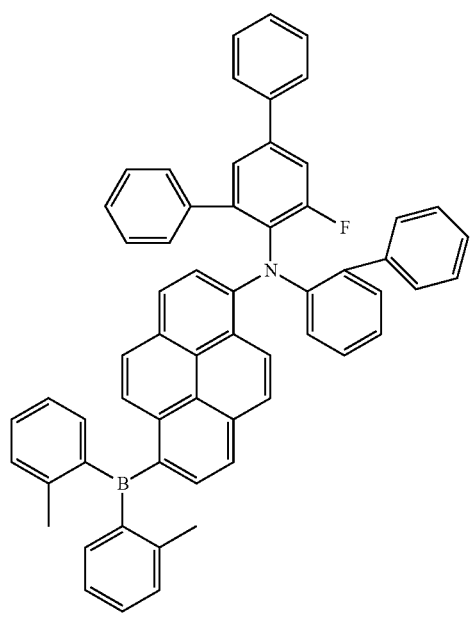
24
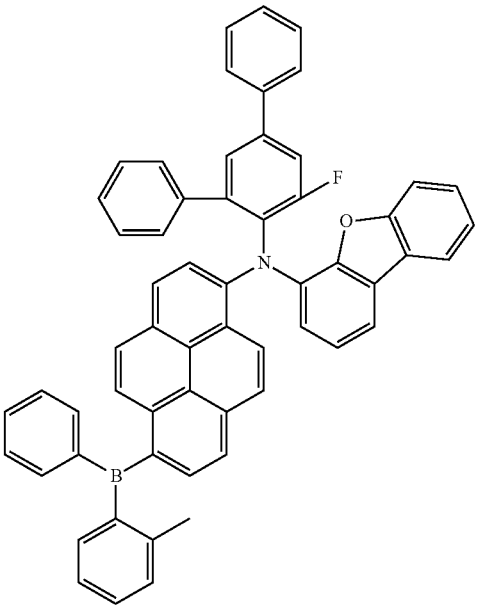
25
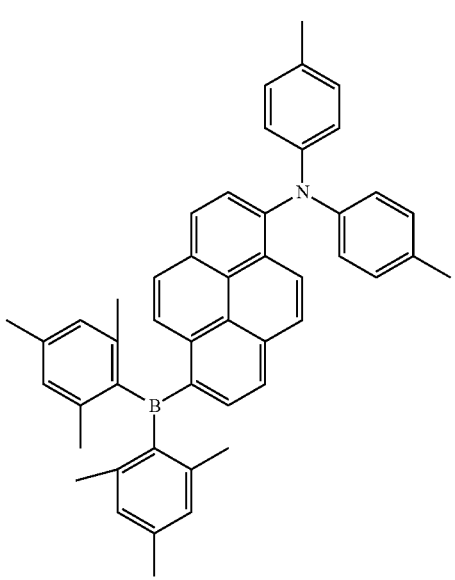

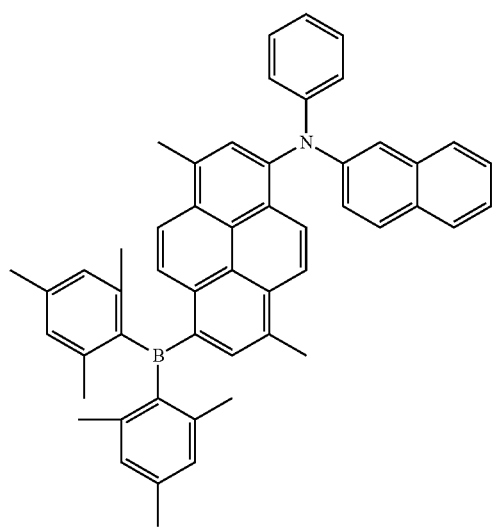
26
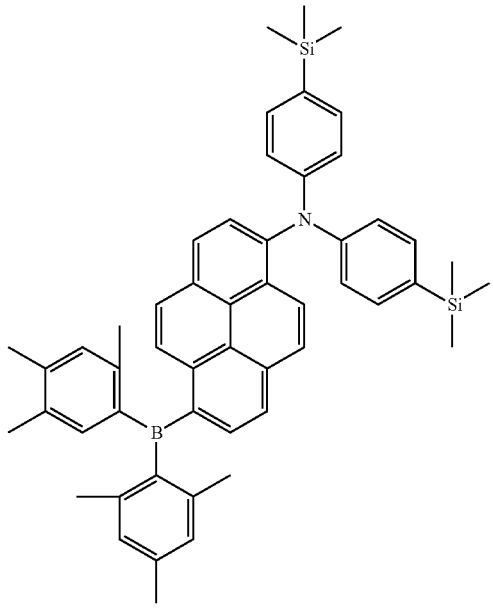
28
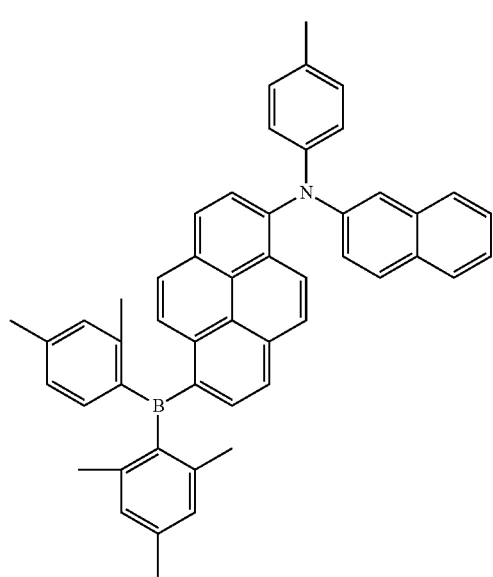
27
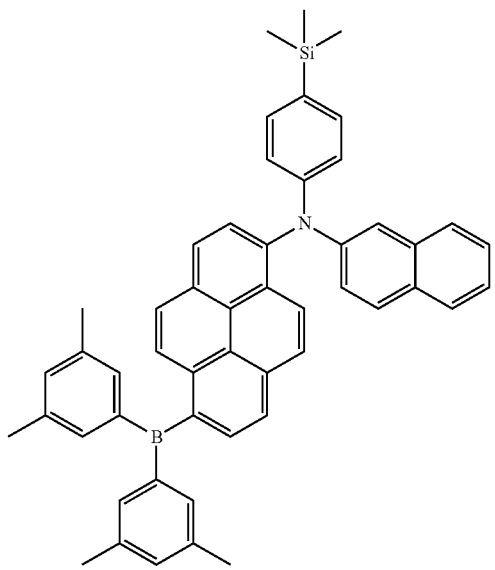
29

30
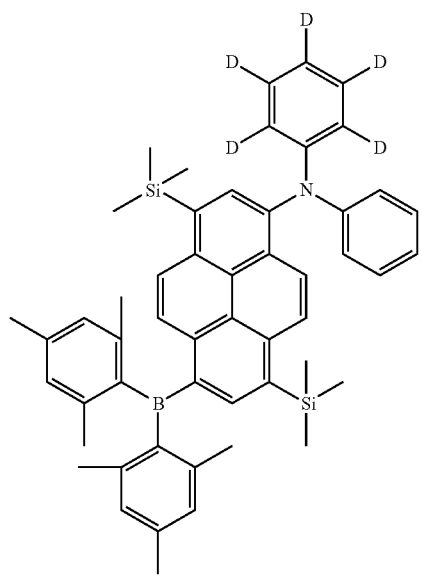
31
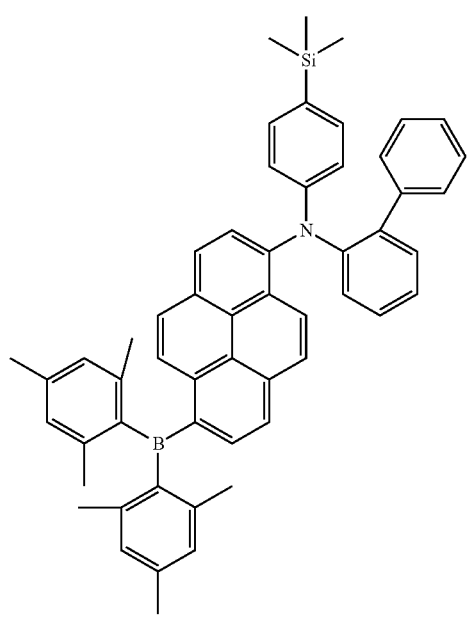
32
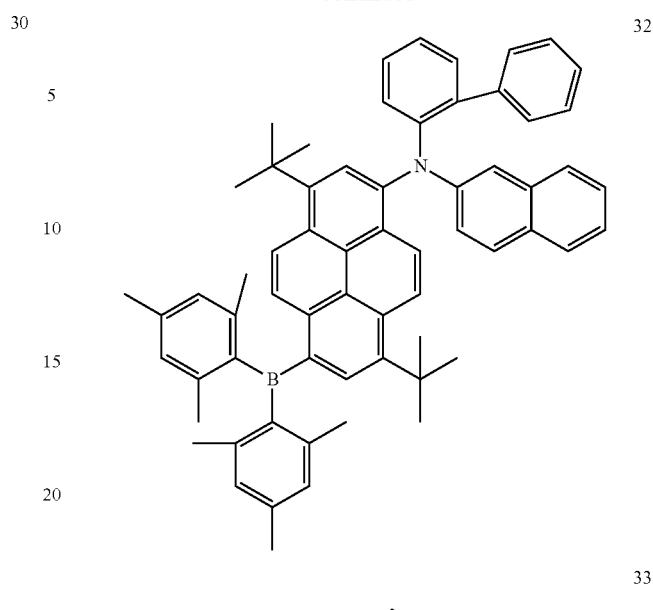
33
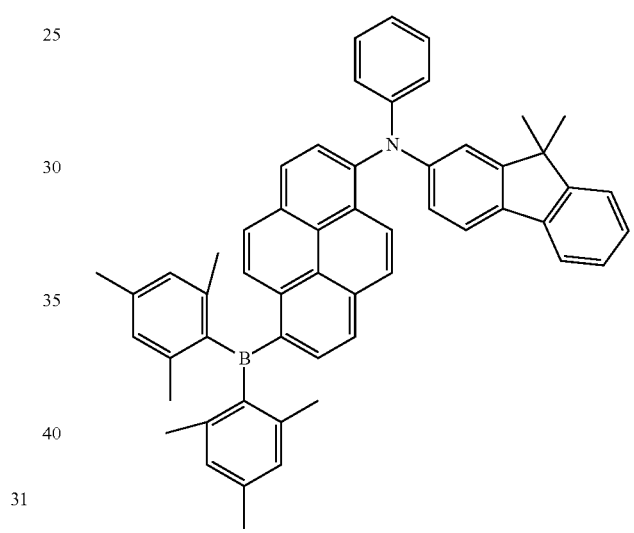
34

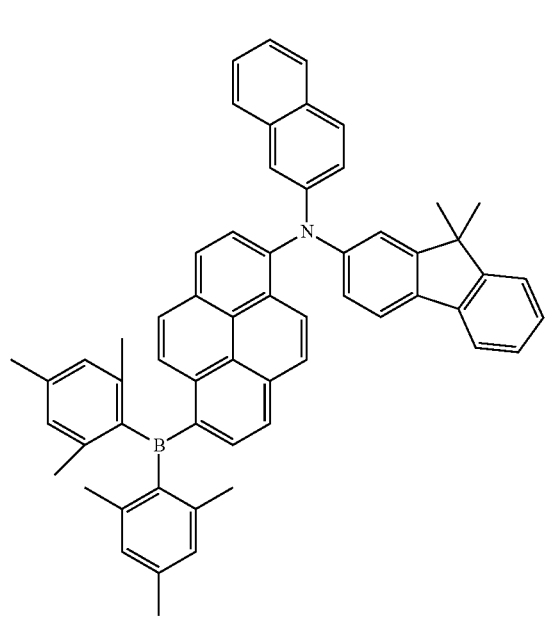
35
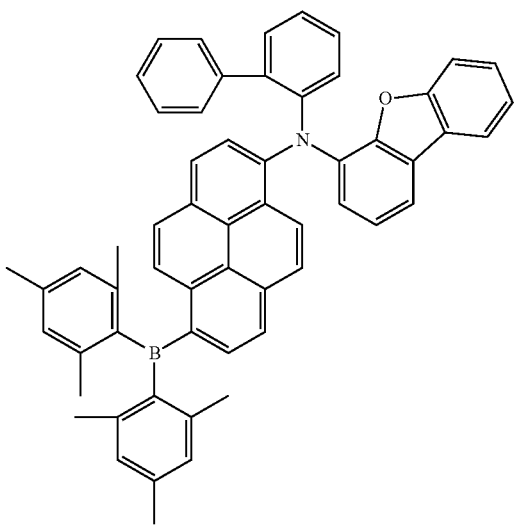
37
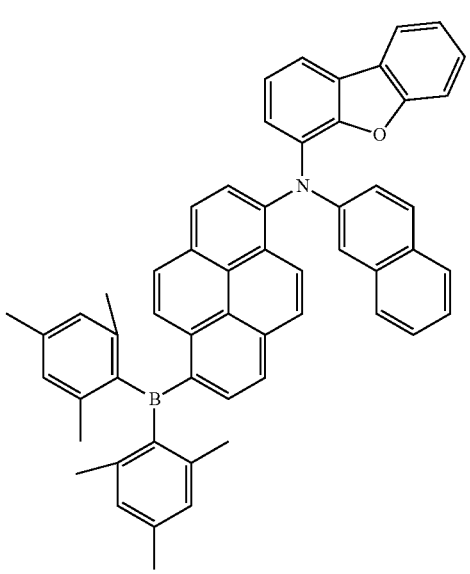
38
36

39
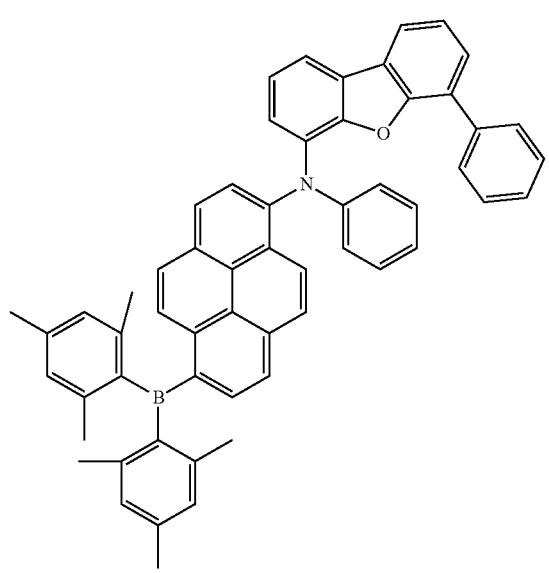
40
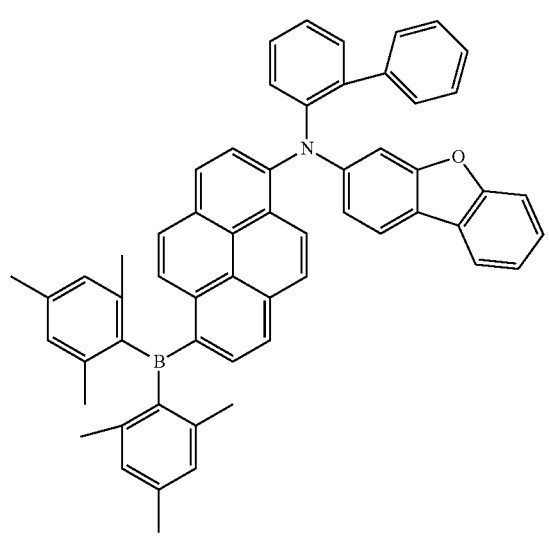
41
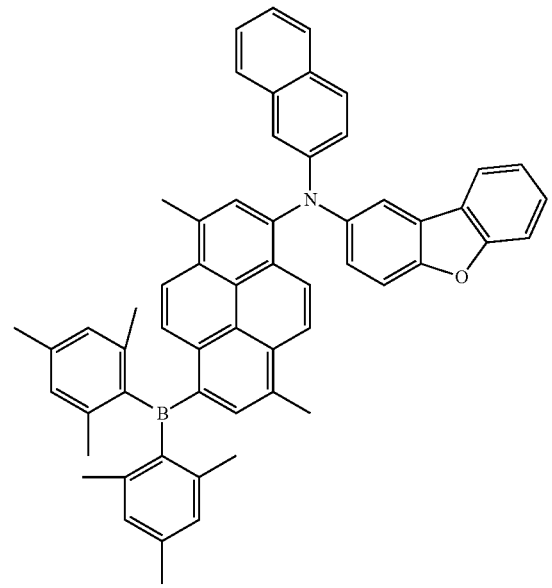
42
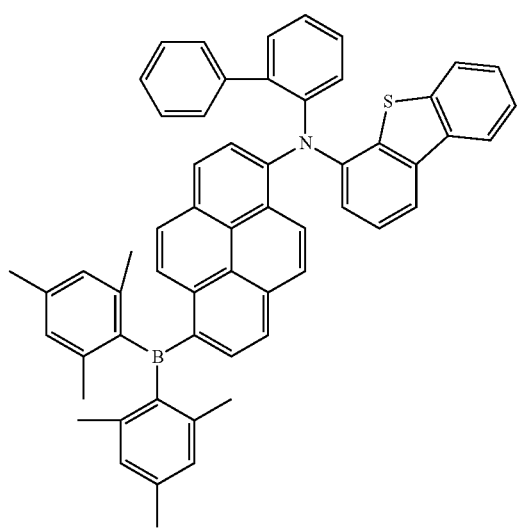
43
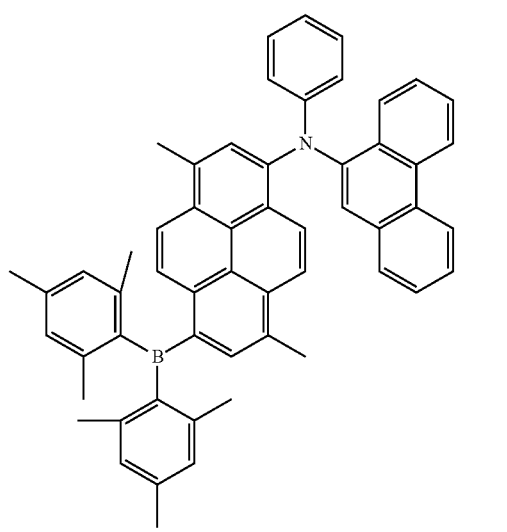

44
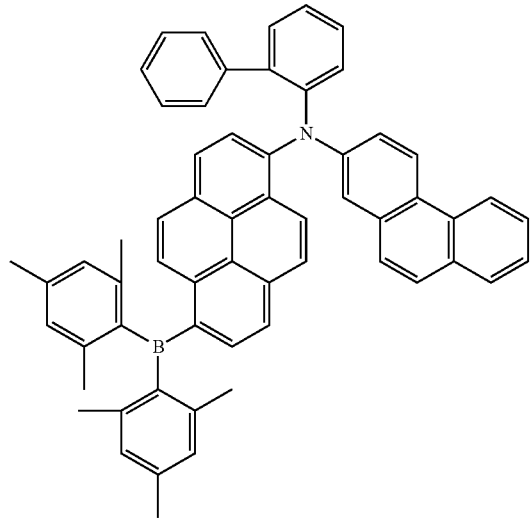
46
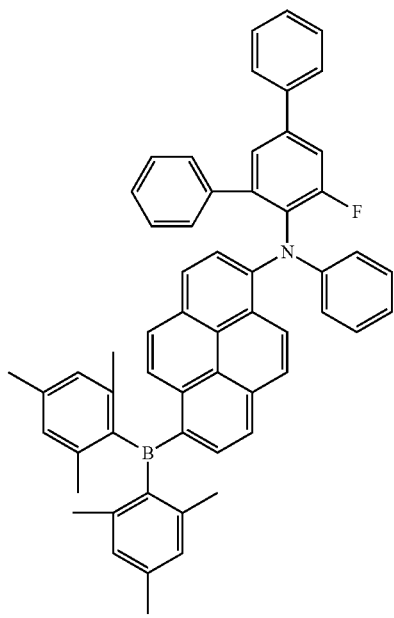
45
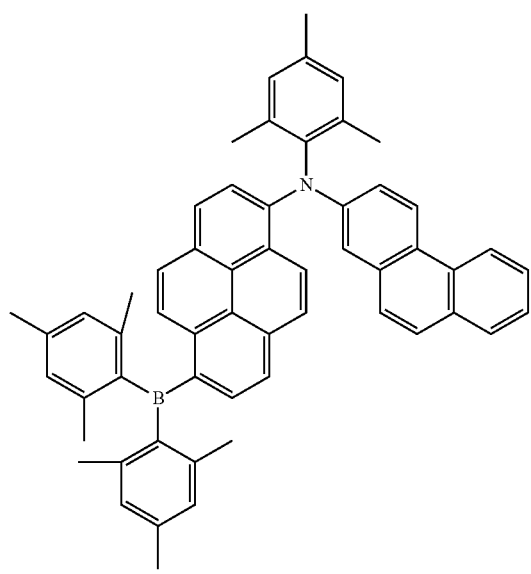
47
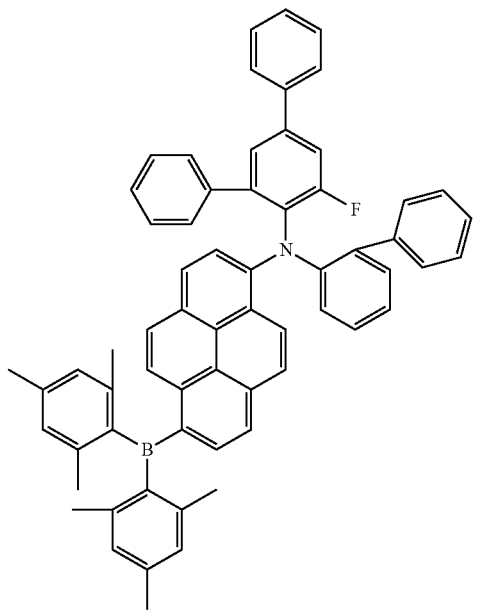

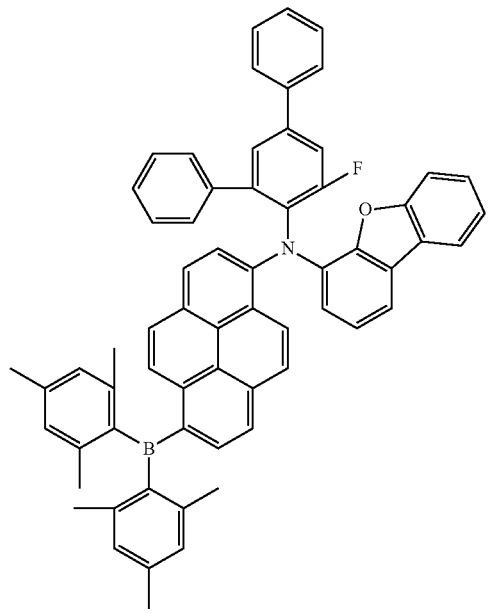
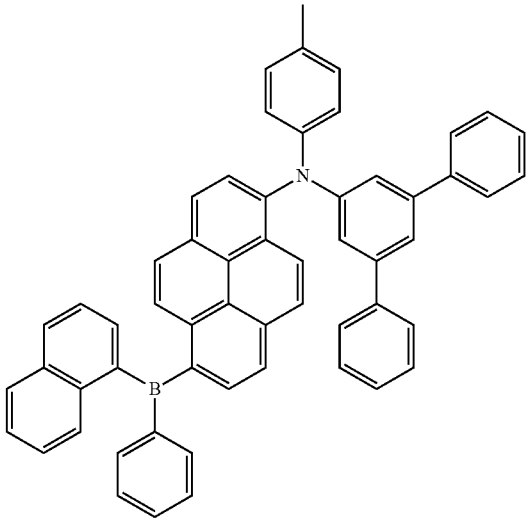
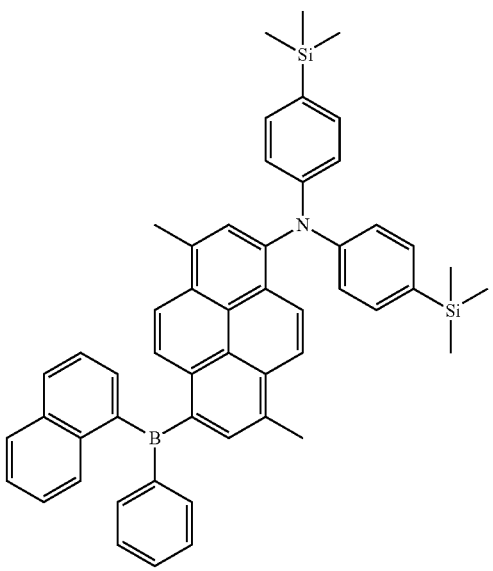

-continued
53
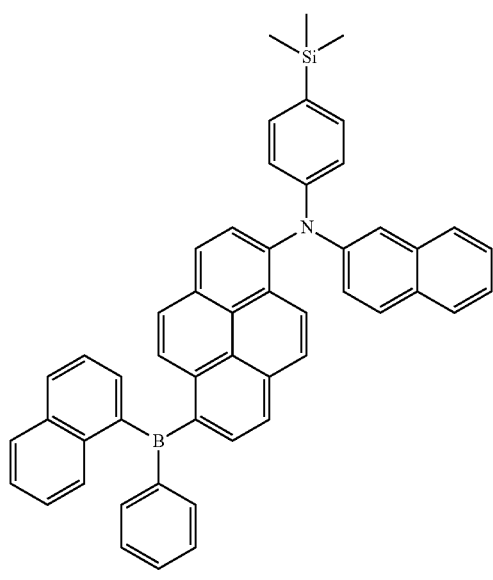
54
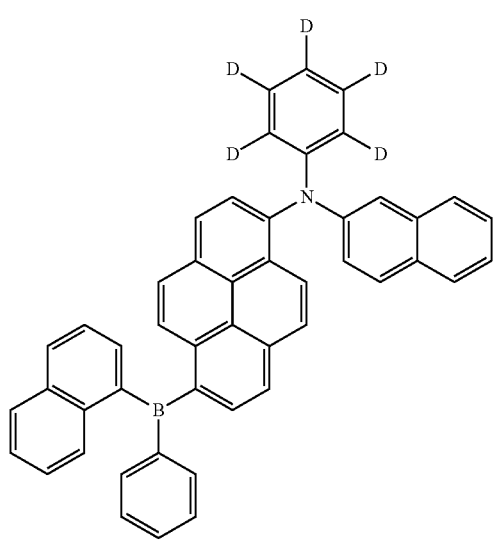
55
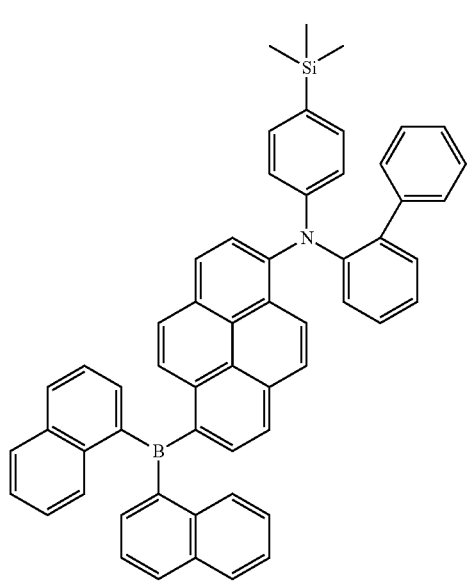
-continued
56
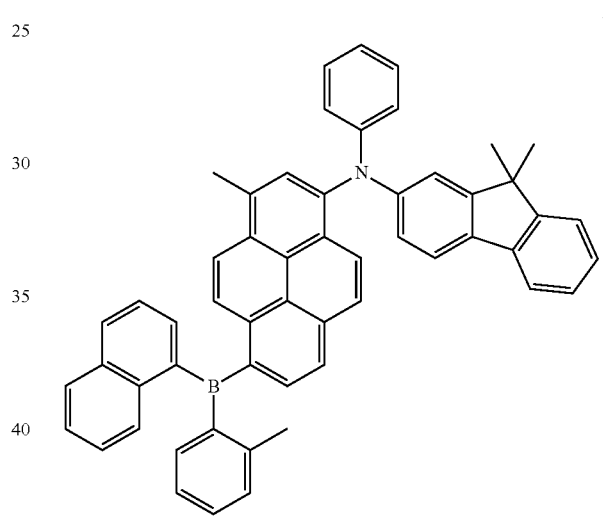
57
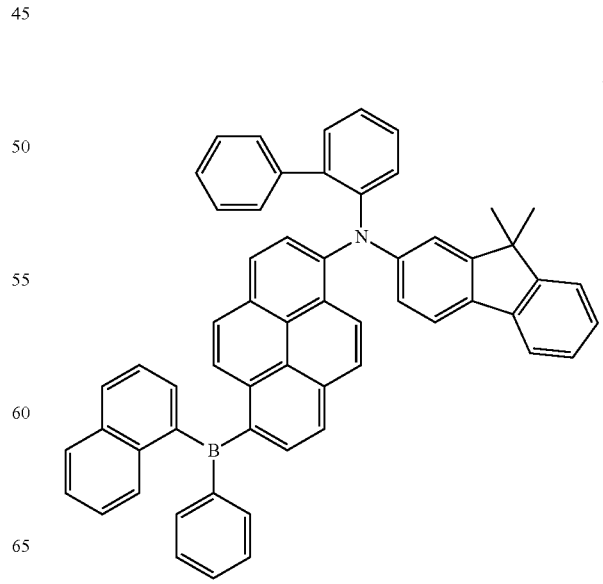
58

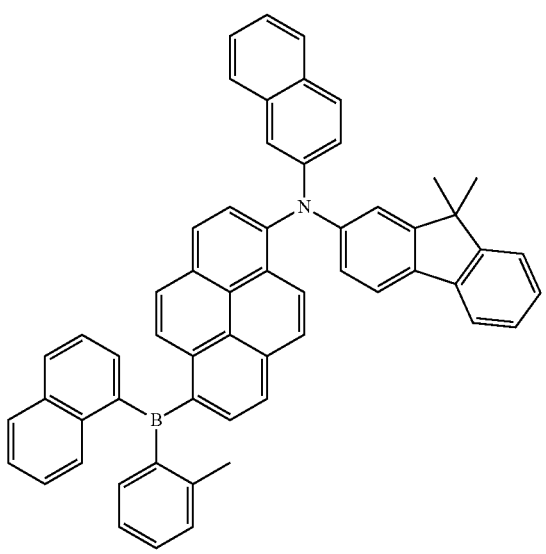
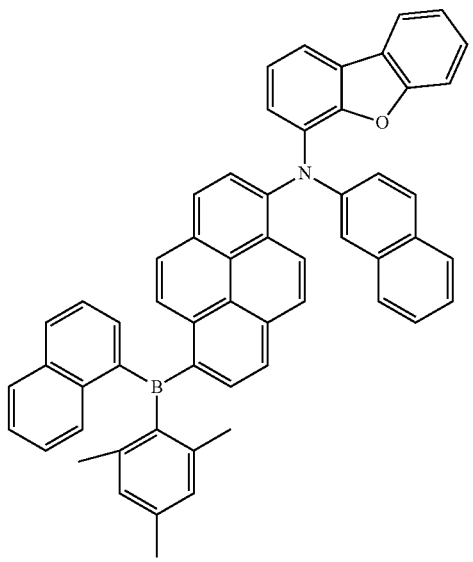

65
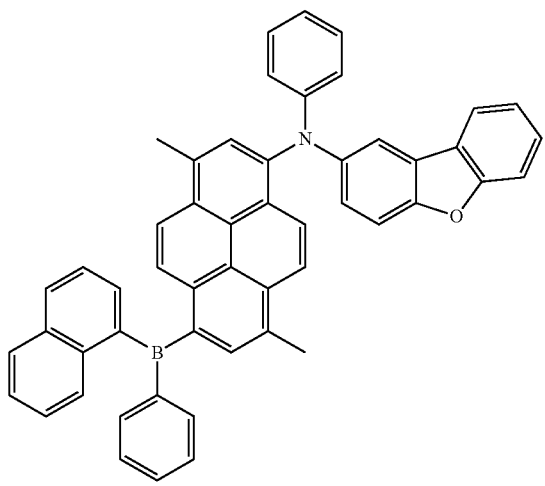
66
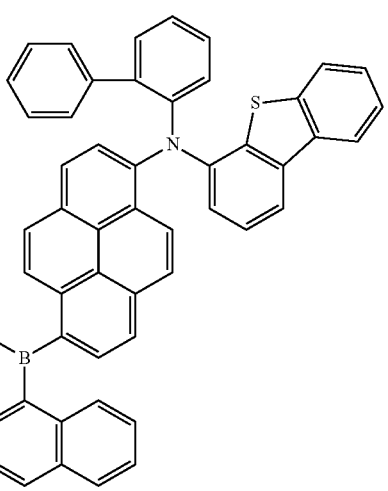
67
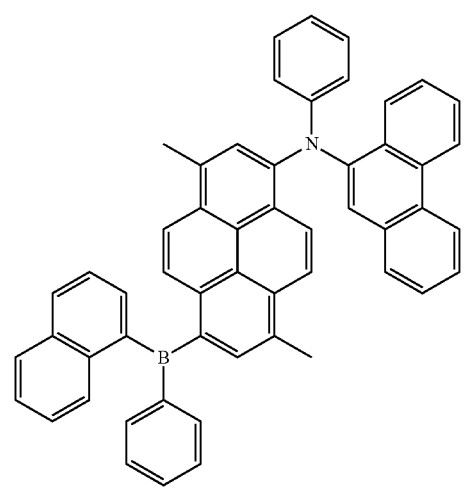
68
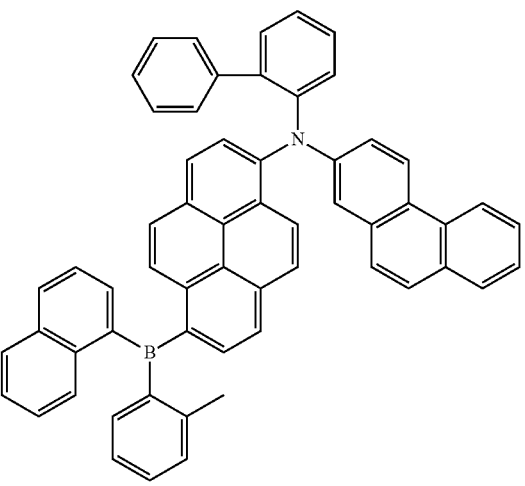
69
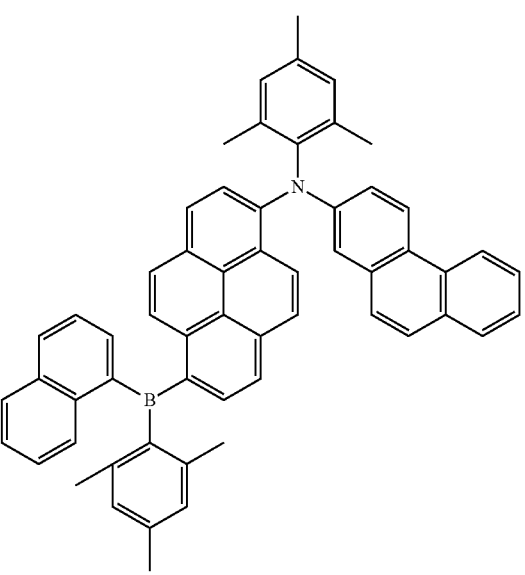

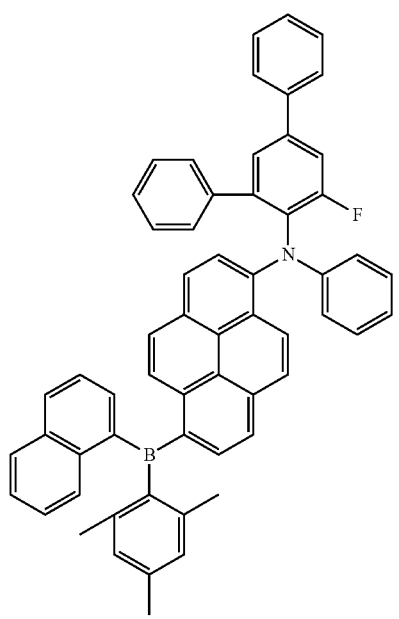
70
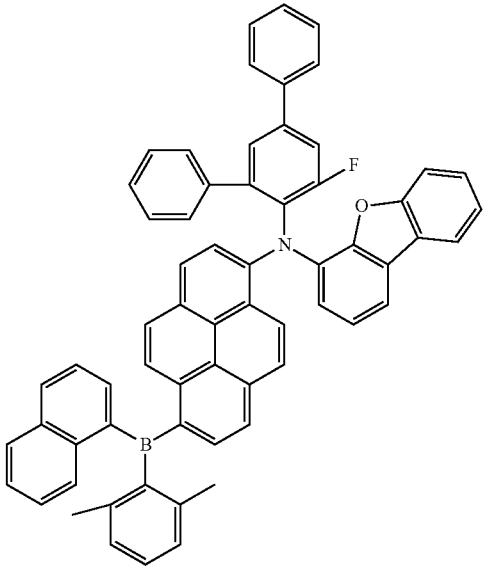
72
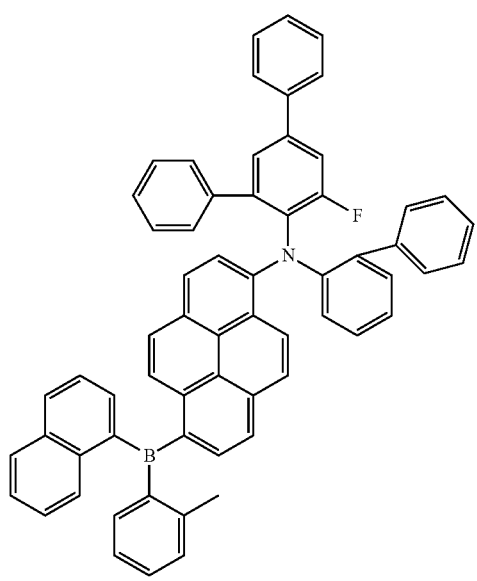
71
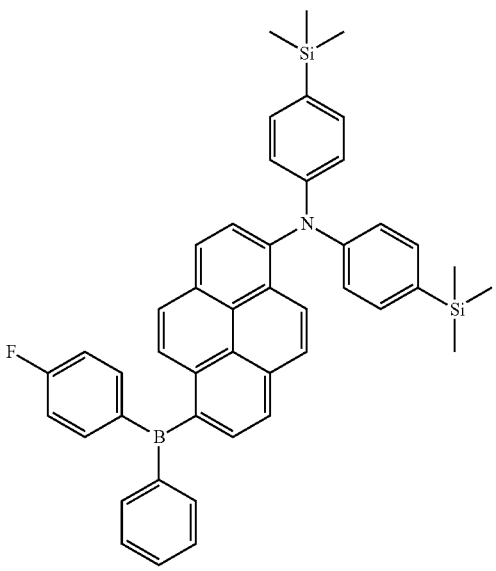
73
74

75
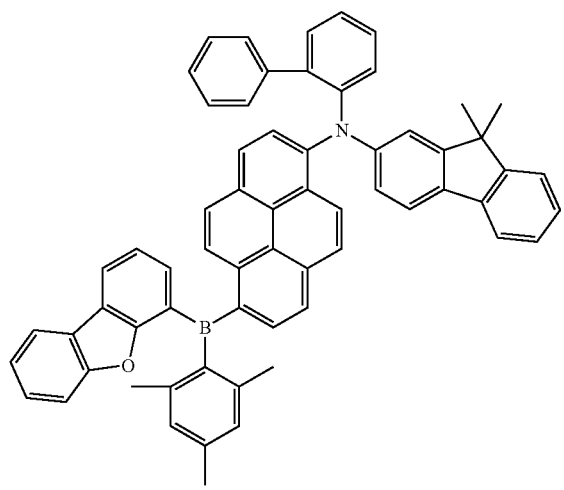
76
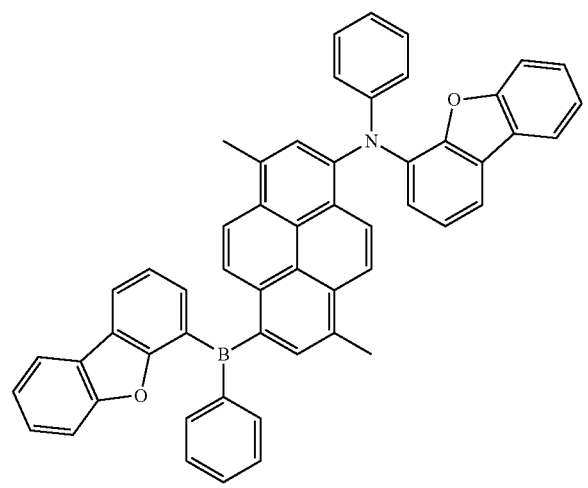
77
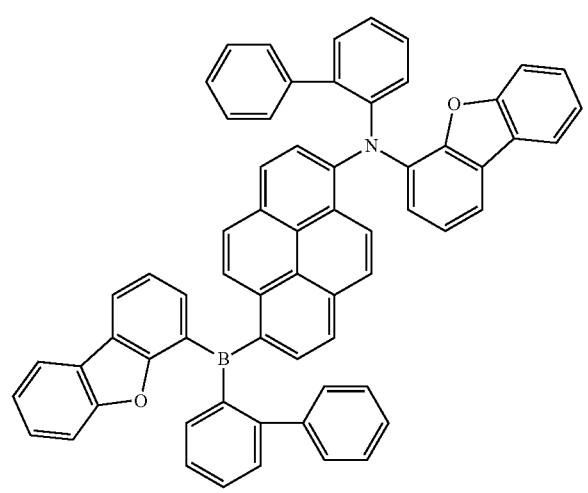
78
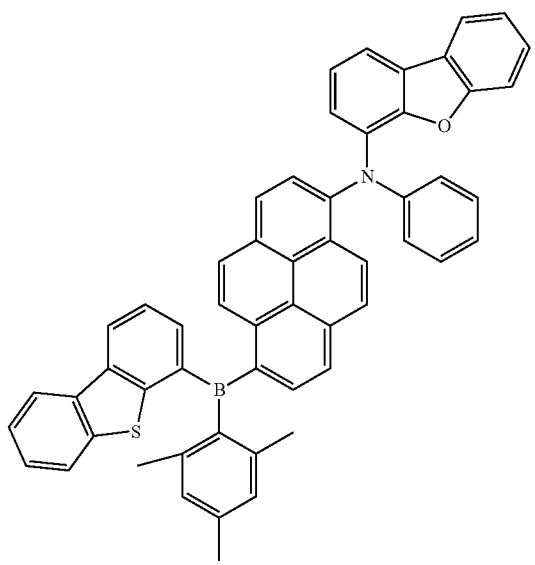
79
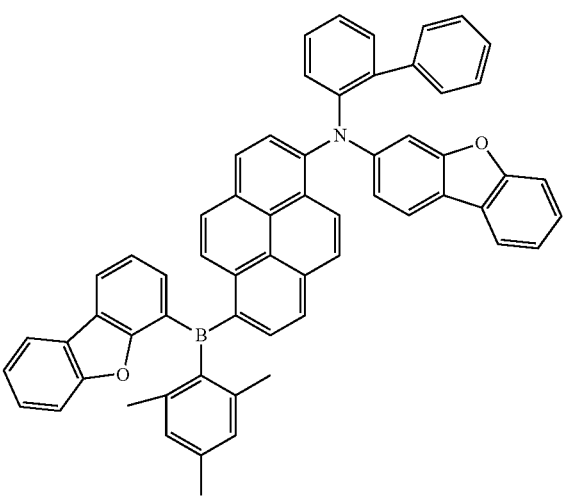
80

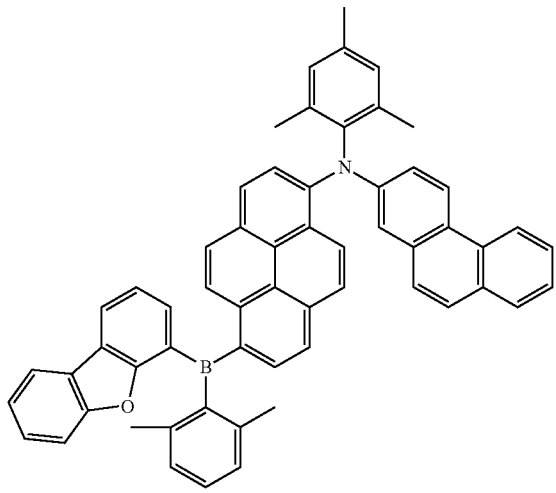

81

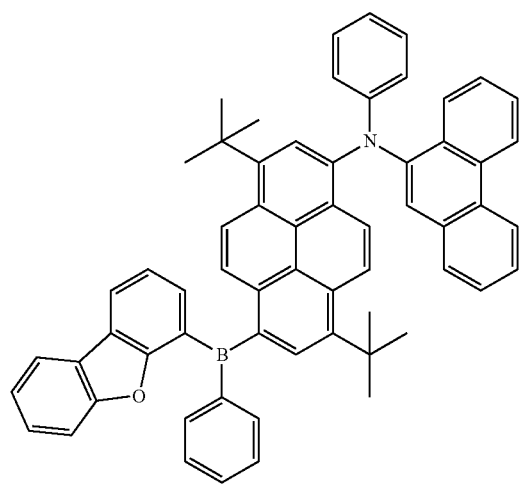

82

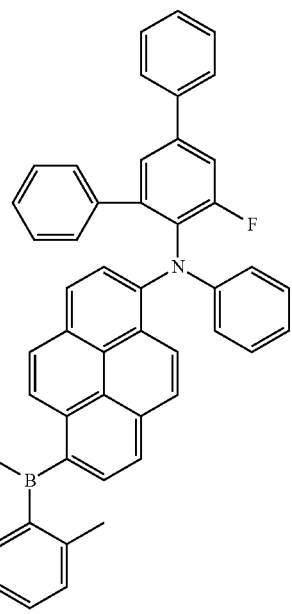

83

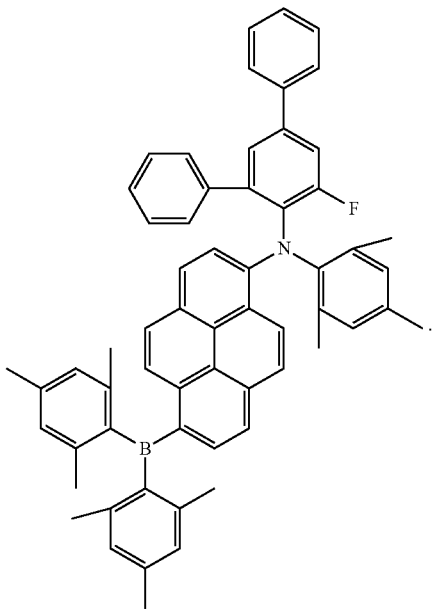

84

The condensed-cyclic compound represented by Formula 1 may include a pyrene-based core, one selected from $R_1$ to $R_{10}$ in Formula 1 may be the group represented by Formula 2A, and another one selected from $R_1$ to $R_{10}$ may be the group represented by Formula 2B. Thus, an organic light-emitting device including the condensed-cyclic compound represented by Formula 1 may have a high efficiency and long lifespan.

The condensed-cyclic compound represented by Formula 1 may be synthesized by using a suitable organic synthetic method. A method of synthesizing the condensed-cyclic compound may be understood by referring to examples used herein.

At least one of the condensed-cyclic compounds represented by Formula 1 may be included between a pair of electrodes in an organic light-emitting device. In some embodiments, the condensed-cyclic compound represented by Formula 1 may be used as a material for a capping layer, which is disposed on outer sides of a pair of electrodes in an organic light-emitting device. In some embodiments, the condensed-cyclic compound represented by Formula 1 may be included in, e.g., an emission layer.

Accordingly, there is provided an organic light-emitting device including a first electrode; a second electrode facing the first electrode; and an organic layer between the first electrode and the second electrode, wherein the organic layer includes an emission layer and at least one condensed-cyclic compound represented by Formula 1.

As used herein, the expression the "(organic layer) includes at least one condensed-cyclic compound" may be construed as meaning the "(organic layer) may include one condensed-cyclic compound represented by Formula 1 or two different condensed-cyclic compounds represented by Formula 1".

For example, the organic layer may include only Compound 1 as the condensed-cyclic compound. In this regard, Compound 1 may be included in the emission layer of the organic light-emitting device. In some embodiments, the organic layer may include Compound 1 and Compound 2 as the condensed-cyclic compounds. In this regard, Compound 1 and Compound 2 may be included in the same layer (for example, both Compound 1 and Compound 2 may be included in the emission layer).

The organic layer may further include i) a hole transport region disposed between the first electrode (anode) and the emission layer and includes at least one selected from a hole injection layer, a hole transport layer, a buffer layer, and an electron blocking layer, and ii) an electron transport region that is disposed between the emission layer and the second electrode (cathode) and includes at least one selected from a hole blocking layer, an electron transport layer, and an electron injection layer. At least one selected from the hole transport region and the emission layer may include at least one selected from the condensed-cyclic compounds represented by Formula 1.

In some embodiments, the emission layer may include at least one selected from the condensed-cyclic compounds represented by Formula 1. In some embodiments, the emission layer may include at least one selected from the condensed-cyclic compounds represented by Formula 1, and may further include a host. The condensed-cyclic compound may serve as a dopant in the emission layer, and an amount of the condensed-cyclic compound may be less than an amount of the host.

In an implementation, the organic light-emitting device may further include at least one selected from the first capping layer disposed in a path of light extracted or emitted from the emission layer, allowing the light to pass through to the outside after passing the first electrode and the second capping layer disposed in a path of light extracted or emitted from the emission layer, allowing the light to pass through to the outside after passing the second electrode, wherein the at least one selected the first capping layer and the second capping layer may include at least one condensed-cyclic compound.

In some embodiments, the organic light-emitting device may have a structure of i) first electrode, organic layer, second electrode, and second capping layer, ii) first capping layer, first electrode, organic layer, and second electrode, or iii) first capping layer, first electrode, organic layer, second electrode, and second capping layer, wherein layers of each structure are sequentially stacked in the stated order. At least one selected from the first capping layer and the second capping layer may include the condensed-cyclic compound.

As used herein, the term the "organic layer" refers to a single and/or a plurality of layers disposed between the first electrode and the second electrode in an organic light-emitting device. A material included in the "organic layer" is not limited to an organic material.

Figure 1:
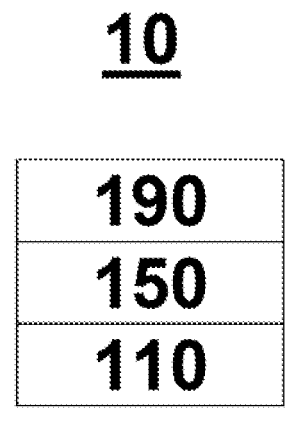

FIG. 1 illustrates a schematic view of an organic light-emitting device 10 according to an embodiment. The organic light-emitting device 10 may include a first electrode 110, an organic layer 150, and a second electrode 190.

Hereinafter, a structure and a method of manufacturing the organic light-emitting device according to an embodiment will be described with reference to FIG. 1.

Referring to FIG. 1, a substrate may be additionally disposed under the first electrode 110 or on the second electrode 190. The substrate may be a glass substrate or transparent plastic substrate, each with excellent mechanical strength, thermal stability, transparency, surface smoothness, ease of handling, and water resistance.

The first electrode 110 may be formed by depositing or sputtering a material for forming the first electrode on the substrate. When the first electrode 110 is an anode, the material for the first electrode may be selected from materials with a high work function to facilitate hole injection.

The first electrode 110 may be a reflective electrode, a semi-transmissive electrode, or a transmissive electrode. The material for the first electrode may be a transparent and highly conductive material, and examples of such a material may include indium tin oxide (ITO), indium zinc oxide (IZO), tin oxide ($SnO_2$), and zinc oxide (ZnO). When the first electrode 110 is a semi-transmissive electrode or a reflective electrode, as a material for forming the first electrode, at least one selected from magnesium (Mg), aluminum (Al), aluminum-lithium (Al—Li), calcium (Ca), magnesium-indium (Mg—In), and magnesium-silver (Mg—Ag) may be used.

The first electrode 110 may have a single-layer structure, or a multi-layer structure including a plurality of layers. For example, the first electrode 110 may have a triple-layer structure of ITO/Ag/ITO.

The organic layer 150 is disposed on the first electrode 110. The organic layer 150 may include an emission layer.

The organic layer 150 may further include a hole transport region disposed between the first electrode and the emission layer, and an electron transport region disposed between the emission layer and the second electrode.

The hole transport region may include at least one selected from a hole injection layer (HIL), a hole transport layer (HTL), a buffer layer, and an electron blocking layer (EBL), and the electron transport region may include at least one selected from a hole blocking layer (HBL), an electron transport layer (ETL), and an electron injection layer (EIL).

The hole transport region may have a single-layered structure formed of a single material, a single-layered structure formed of a plurality of different materials, or a multi-layered structure having a plurality of layers formed of a plurality of different materials.

For example, the hole transport region may have a single-layered structure formed of a plurality of different materials, or a structure of hole injection layer/hole transport layer, a structure of hole injection layer/hole transport layer/buffer layer, a structure of hole injection layer/buffer layer, a structure of hole transport layer/buffer layer, or a structure of hole injection layer/hole transport layer/electron blocking layer, wherein layers of each structure are sequentially stacked from the first electrode 110 in this stated order.

When the hole transport region includes a hole injection layer, the hole injection layer may be formed on the first electrode 110 by using various methods, e.g., vacuum-deposition, spin coating, casting, Langmuir-Blodgett (LB) method, ink jet printing, laser-printing, or laser-induced thermal imaging (LITI).

When the hole injection layer is formed by vacuum-deposition, e.g., the vacuum-deposition may be performed at a temperature of a deposition temperature of about 100° C. to about 500° C., at a vacuum degree of about $10^{-8}$ Torr to about $10^{-3}$ Torr, and at a vacuum-deposition rate in a range of about 0.01 Å/sec to about 100 Å/sec in consideration of a compound for the hole injection layer to be deposited, and the structure of the hole injection layer to be formed.

When a hole injection layer is formed by spin coating, the spin coating may be performed at a coating rate of about 2,000 rpm to about 5,000 rpm, and at a temperature of about 80° C. to 200° C. in consideration of a compound for a hole injection layer to be deposited, and the structure of a hole injection layer to be formed.

When the hole transport region includes a hole transport layer, the hole transport layer may be formed on the first electrode 110 or the hole injection layer by using various methods, e.g., vacuum-deposition, spin coating, casting, LB method, ink jet printing, laser-printing, or LITI. When the hole transport layer is formed by vacuum-deposition or spin coating, conditions for vacuum-deposition and coating may be similar to the above-described vacuum-deposition and coating conditions for forming the hole injection layer.

In an implementation, the hole transport region may include the condensed-cyclic compound represented by Formula 1. In some embodiments, the hole transport region may include a hole transport layer, wherein the hole transport layer may include the condensed-cyclic compound represented by Formula 1.

In an implementation, the hole transport region may include at least one selected from m-MTDATA, TDATA, 2-TNATA, NPB, β-NPB, TPD, a spiro-TPD, a spiro-NPB, methylated NPB, TAPC, HMTPD, 4,4',4"-tris(N-carbazolyl) triphenylamine (TCTA), polyaniline/dodecylbenzenesulfonic acid (Pani/DBSA), poly(3,4-ethylenedioxythiophene)/poly(4-styrenesulfonate) (PEDOT/PSS), polyaniline/camphor sulfonicacid (Pani/CSA), (polyaniline)/poly(4-styrenesulfonate) (PANI/PSS), a compound represented by Formula 201, and a compound represented by Formula 202 below.

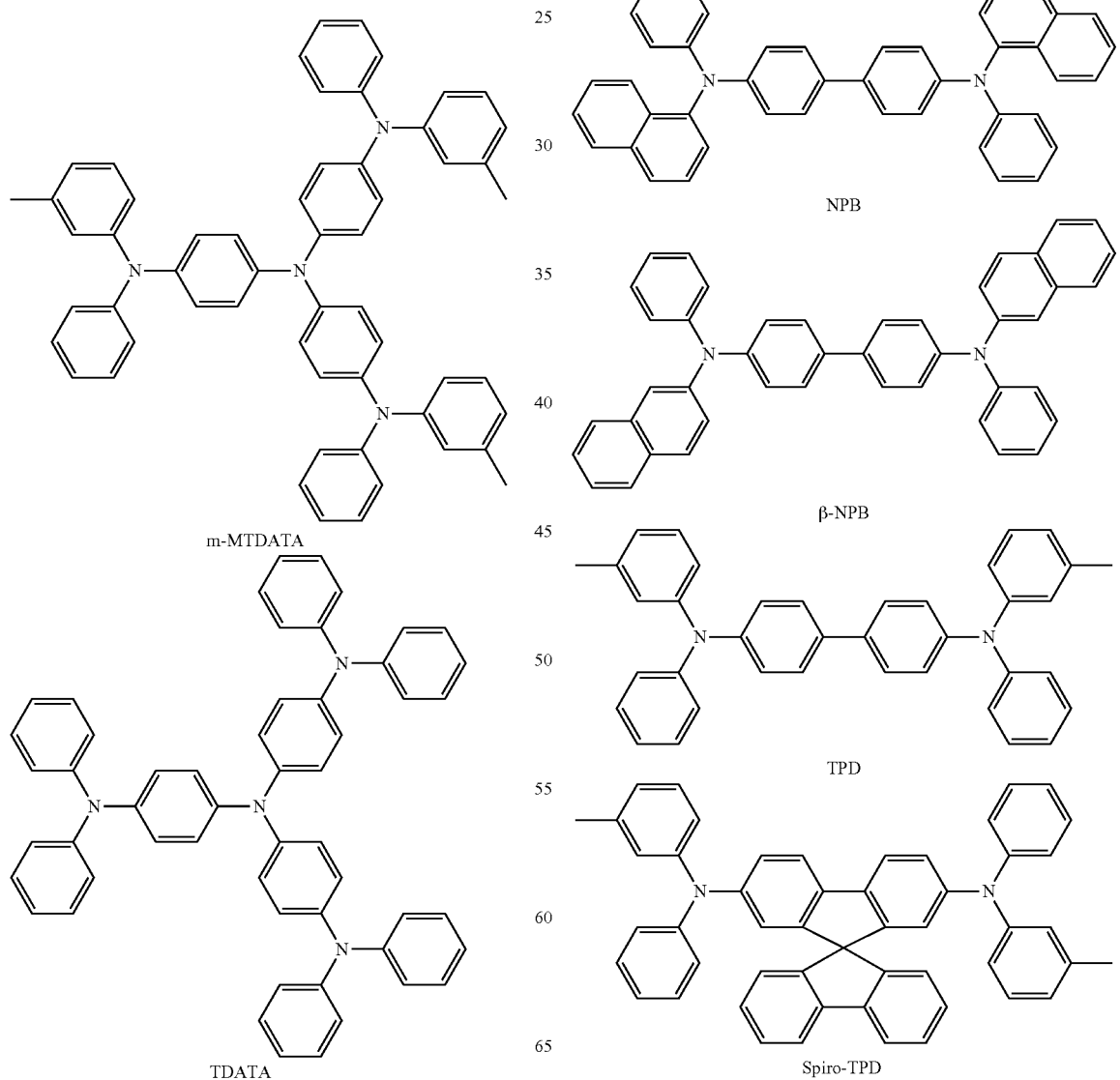

-continued

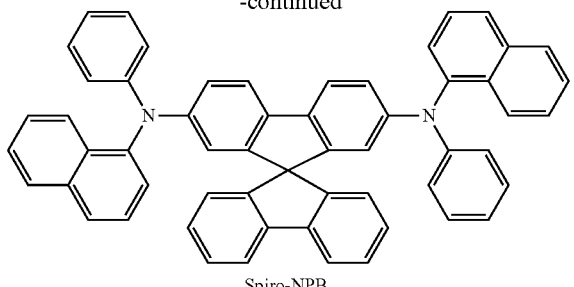
Spiro-NPB

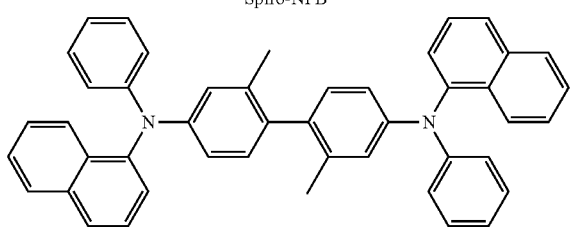
methylated NPB

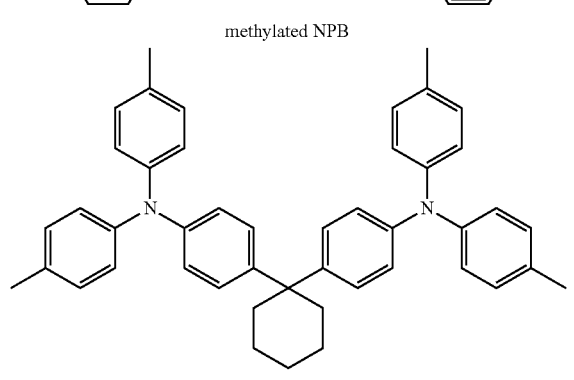
TAPC

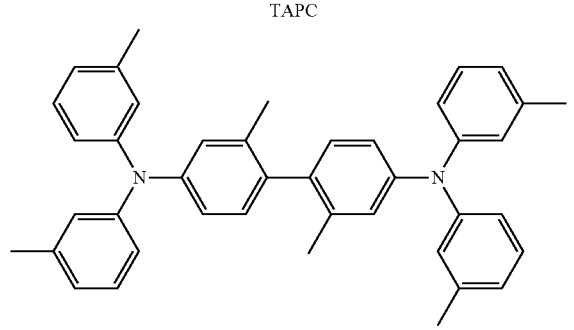
HMTPD

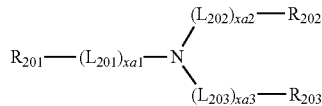
<Formula 201>

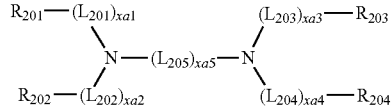
<Formula 202>

In Formulae 201 and 202,
$L_{201}$ to $L_{205}$ may be the same as defined in connection with $L_1$ provided herein;
xa1 to xa4 may each independently be selected from 0, 1, 2, and 3; and
xa5 may be selected from 1, 2, 3, 4, and 5;
$R_{201}$ to $R_{204}$ may each independently be selected from or include a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In some embodiments, in Formulae 201 and 202,
$L_{201}$ to $L_{205}$ may each independently be selected from:
a phenylene group, a naphthylene group, a fluorenylene group, a spiro-fluorenylene group, a benzofluorene group, a dibenzofluorene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and
a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, an isoindolyl group, a quinolinyl group, an isoquinolinyl group, a quinoxalinyl group, a quinazolinyl group, a carbazolyl group, and a triazinyl group;
xa1 to xa4 may each independently be selected from 0, 1, and 2;
xa5 may be selected from 1, 2, and 3;
$R_{201}$ to $R_{204}$ may each independently be selected from:
a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and
a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group.

The compound represented by Formula 201 may be represented by Formula 201A.

<Formula 201A>

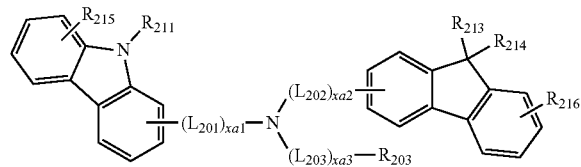

In some embodiments, the compound represented by Formula 201 may be represented by Formula 201A-1.

<Formula 201A-1>

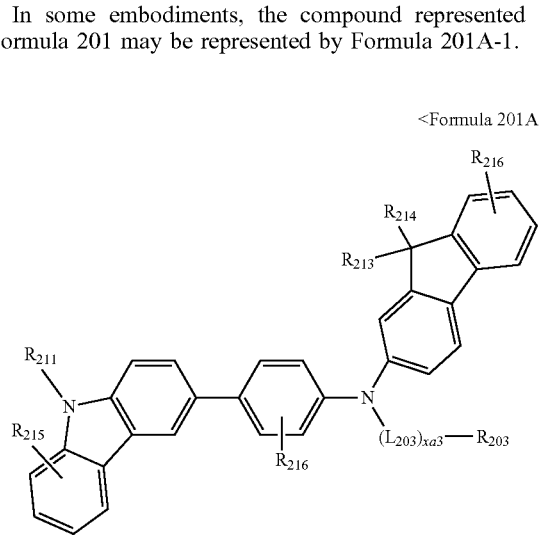

In some embodiments, the compound represented by Formula 202 may be represented by Formula 202A.

<Formula 202A>

In Formulae 201A, 201A-1, and 202A, $L_{201}$ to $L_{203}$, xa1 to xa3, xa5, and $R_{202}$ to $R_{204}$ may be understood by referring to the descriptions provided herein, and $R_{211}$ and $R_{212}$ may be the same as defined in connection with $R_{203}$; and $R_{213}$ to $R_{216}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

The compound represented by Formula 201 and/or the compound represented by Formula 202 may include Compounds HT1 to HT20.

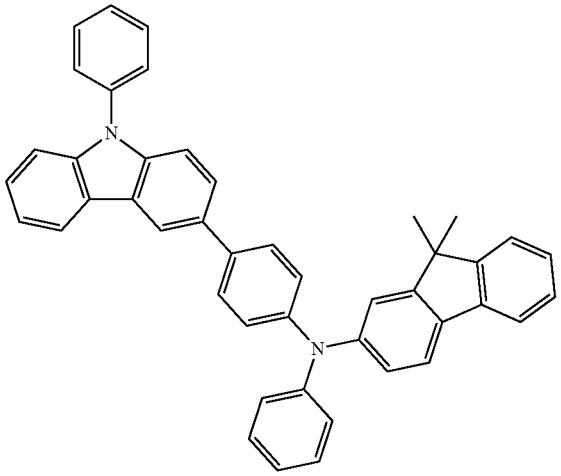

HT3
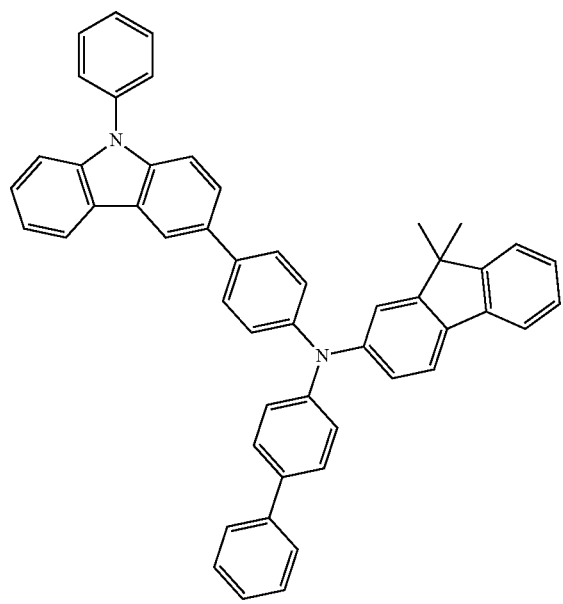
HT4
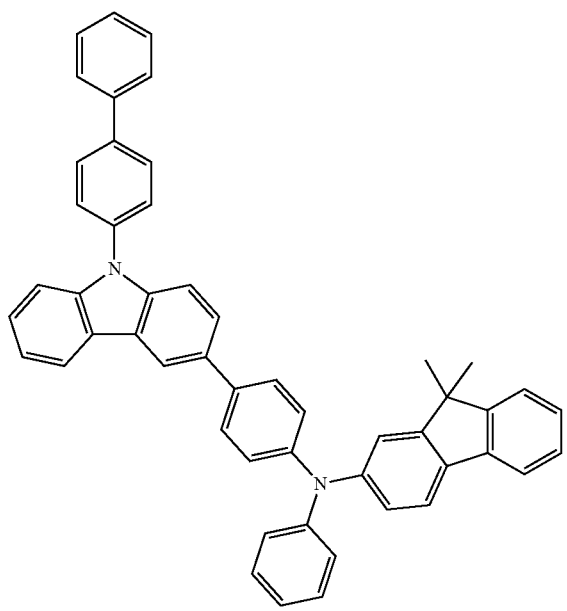
HT5
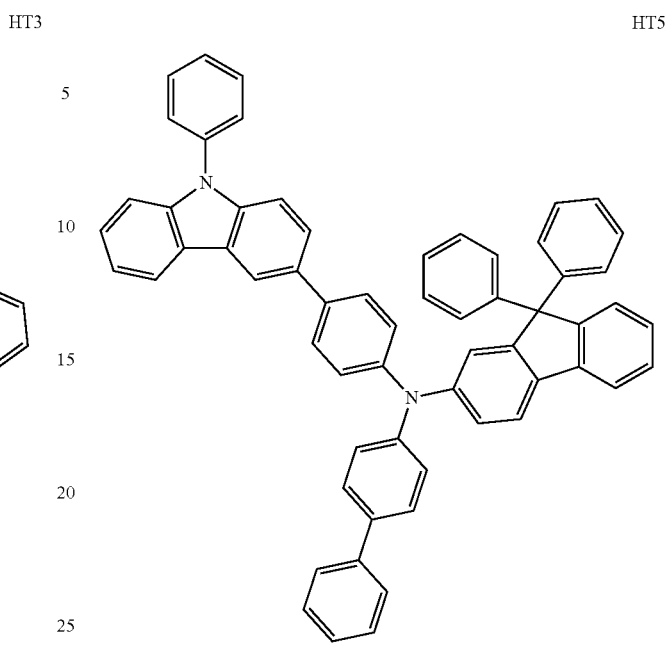
HT6
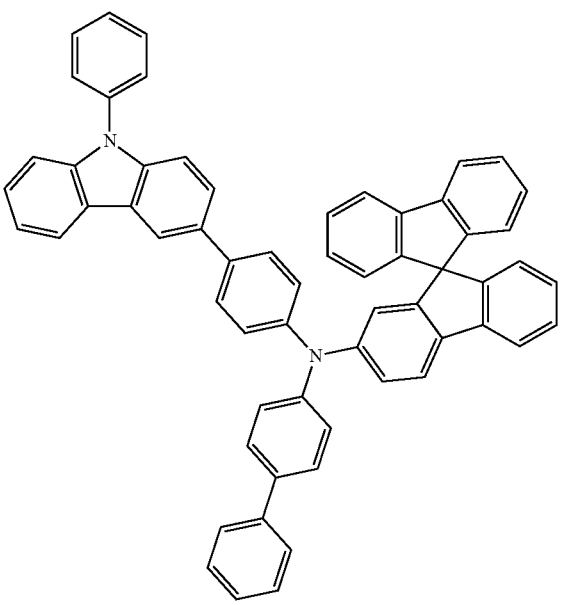

HT7
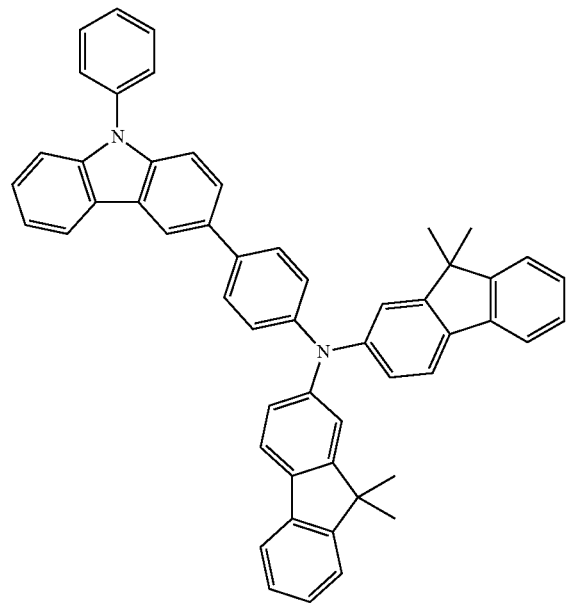
HT8
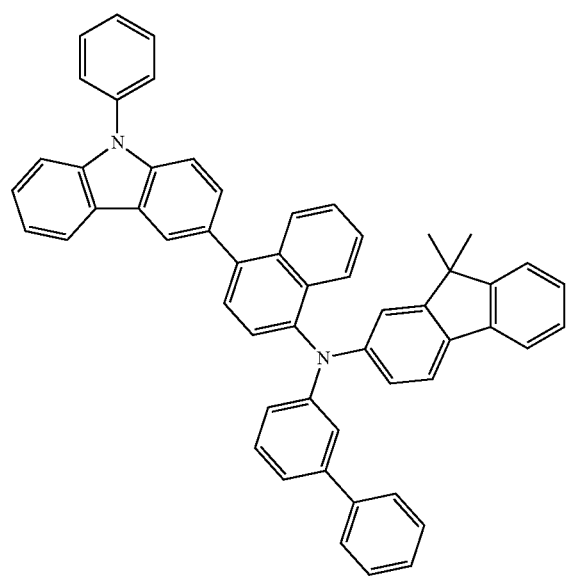
HT9
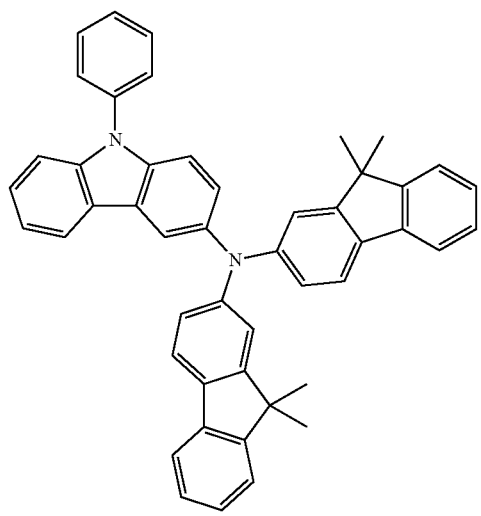
HT10
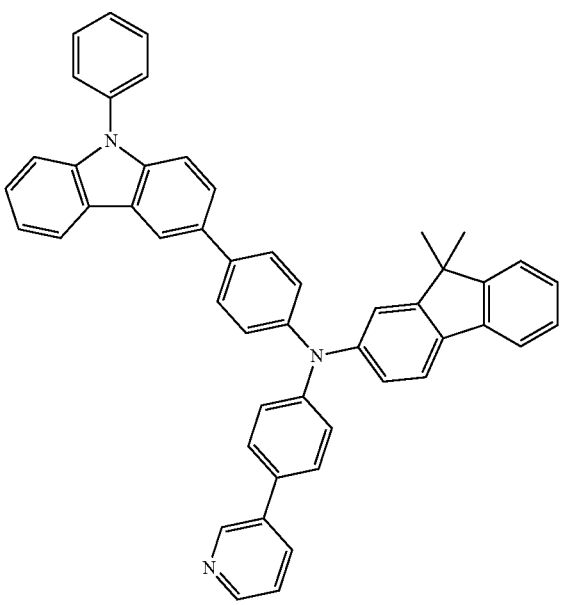

HT11
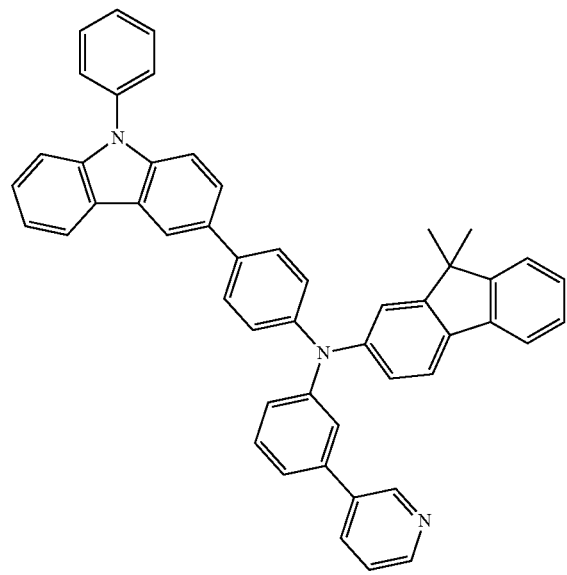
HT12
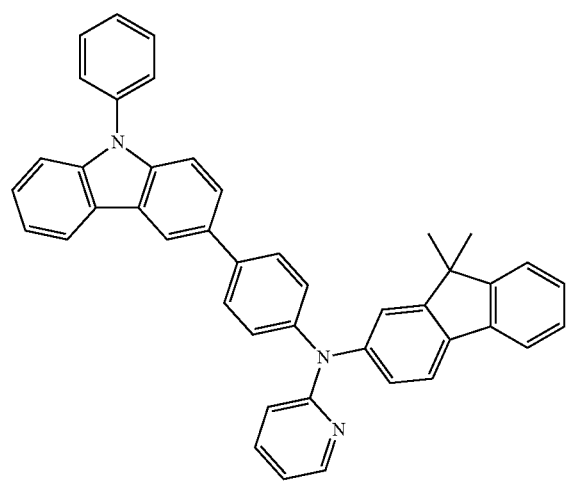
HT13
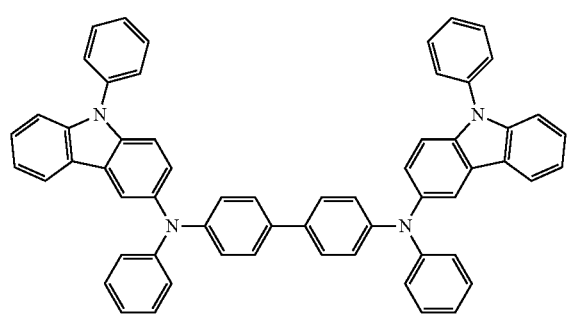
HT14
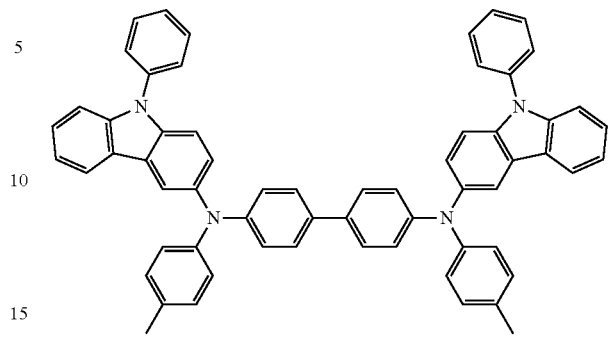
HT15
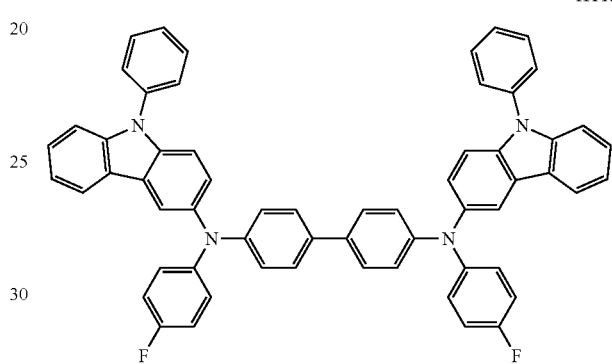
HT16
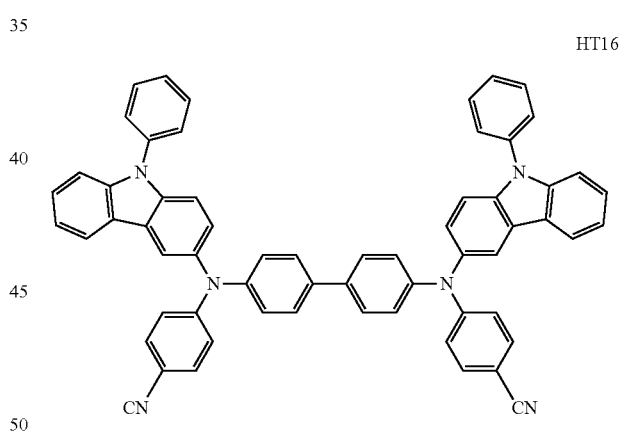
HT17
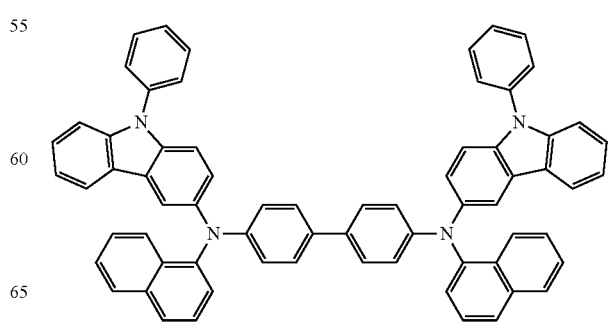

-continued

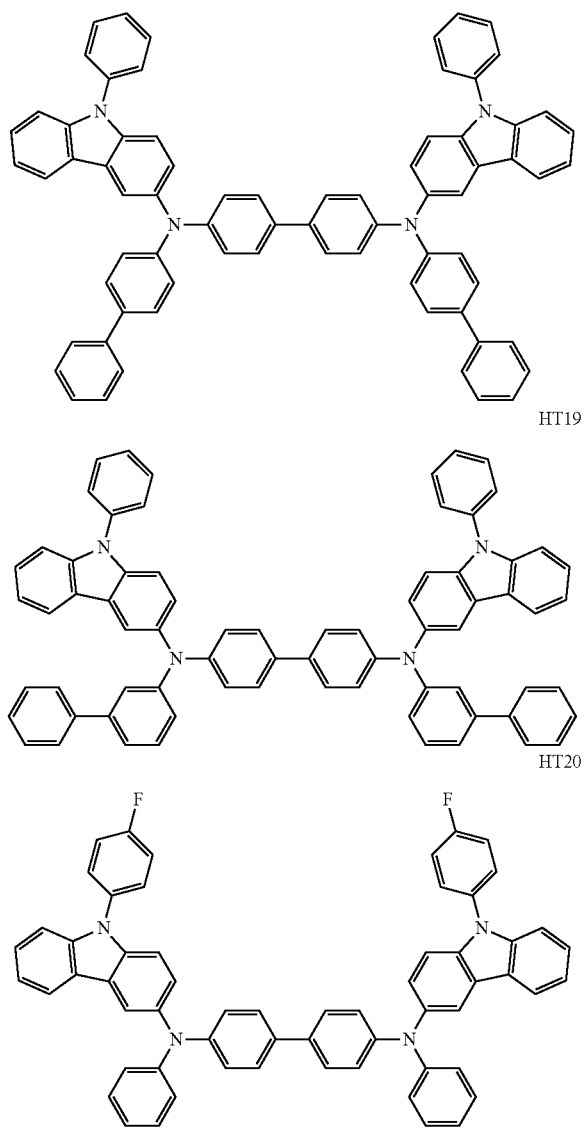

A thickness of the hole transport region may be in a range of about 100 Å to about 10,000 Å, e.g., about 100 Å to about 1,000 Å. When the hole transport region includes a hole injection layer and a hole transport layer, the thickness of the hole injection layer may be in a range of about 100 Å to about 10,000 Å, e.g., about 100 Å to about 1,000 Å, and the thickness of the hole transport layer may be in a range of about 50 Å to about 2,000 Å, e.g., about 100 Å to about 1500 Å. When the thicknesses of the hole transport region, the hole injection layer, and the hole transport layer are within these ranges, excellent hole transport characteristics may be obtained without a substantial increase in driving voltage.

The hole transport region may further include, in addition to the mentioned materials above, a charge-generating material to improve conductive properties. The charge-generating material may be homogeneously or non-homogeneously dispersed throughout the hole transport region.

The charge-generating material may be, e.g., a p-dopant. The p-dopant may include one selected from a quinone derivative, a metal oxide, and a cyano group-containing compound. Examples of the p-dopant may include a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenum oxide, and Compound HT-D1 illustrated below.

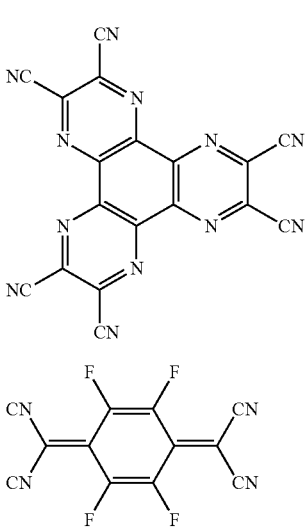

The hole transport region may further include, in addition to the hole injection layer and the hole transport layer, at least one selected from a buffer layer and an electron blocking layer. The buffer layer may compensate for an optical resonance distance according to a wavelength of light emitted from the emission layer, and light-emission efficiency of a formed organic light-emitting device may be improved. For use as a material included in the buffer layer, materials that are included in the hole transport region may be used. The electron blocking layer prevents injection of electrons from the electron transport region.

An emission layer may be formed on the first electrode 110 or the hole transport region by using various methods, e.g., vacuum-deposition, spin coating, casting, LB method, ink jet printing, laser-printing, or LITI. When the emission layer is formed by vacuum-deposition or spin coating, deposition and coating conditions for the emission layer may be determined by referring to the deposition and coating conditions for the hole injection layer.

When the organic light-emitting device 10 is a full color organic light-emitting device, the emission layer may be patterned into a red emission layer, a green emission layer, or a blue emission layer, according to a sub pixel. In an implementation, the emission layer may have a stacked structure of a red emission layer, a green emission layer, and a blue emission layer, or may include a red-light emission material, a green-light emission material, and a blue-light emission material, which are mixed with each other in a single layer, to emit white light.

The emission layer may include a host and a dopant.

In an implementation, the host may include a compound represented by Formula 301.

$Ar_{301}-[(L_{301})_{xb1}-R_{301}]_{xb2}$ <Formula 301>

In Formula 301, $Ar_{301}$ may be selected from:

a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene;

a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{301}$)($Q_{302}$)($Q_{303}$); wherein $Q_{301}$ to $Q_{303}$ may be each independently selected from a hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group;

$L_{301}$ may be the same as defined in connection with $L_1$;

$R_{301}$ may be selected from:

a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazole group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazole group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xb1 may be selected from 0, 1, 2, and 3;

xb2 may be selected from 1, 2, 3, and 4;

In some embodiments, in Formula 301, $L_{301}$ may be selected from:

a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, and a chrysenylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, and a chrysenylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group;

$R_{301}$ may be selected from:

a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group.

In an implementation, the host may include a compound represented by Formula 301A.

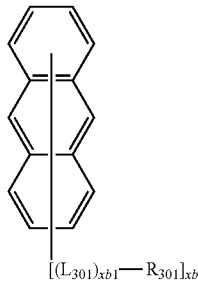
<Formula 301A>

The descriptions for components and/or variable groups of Formula 301A may be understood by referring to the descriptions provided herein.

In an implementation, the compound represented by Formula 301 may include at least one compound selected from Compounds H1 to H42.

H1

H2

H3

H4

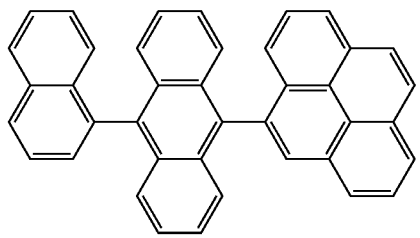
H5

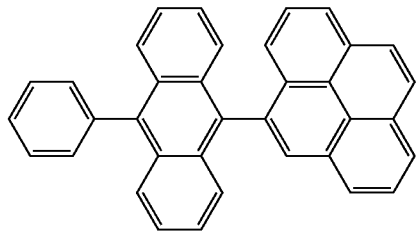
H6

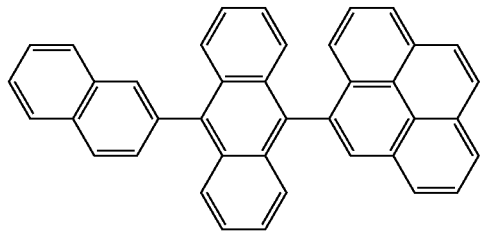
H7

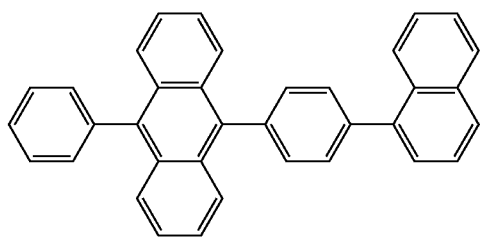
H8

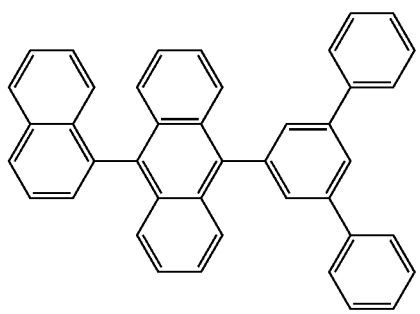
H9

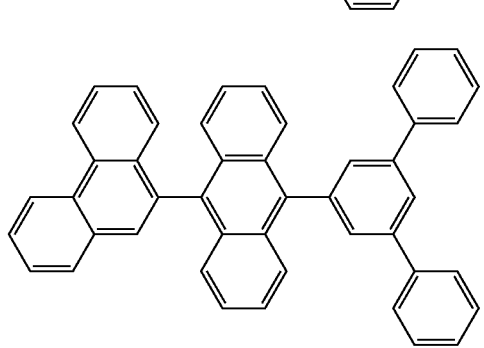
H10

H11
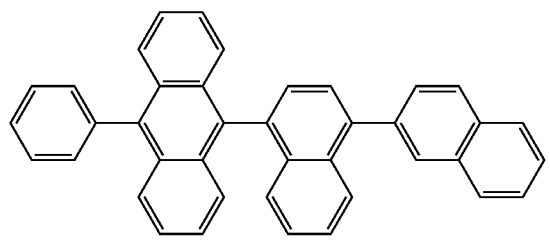
H12
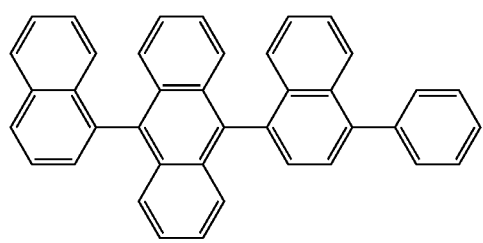
H13
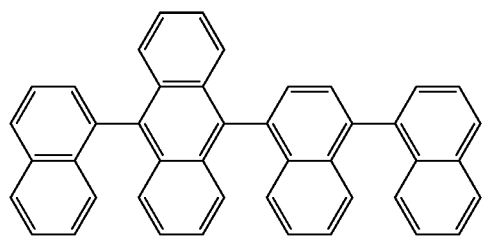
H14
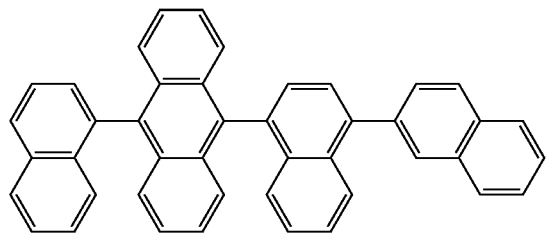
H15
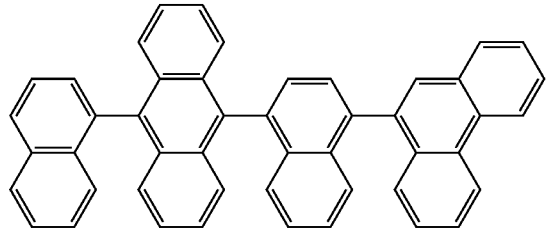
H16
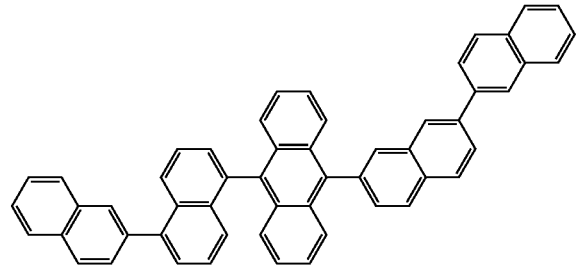
H17
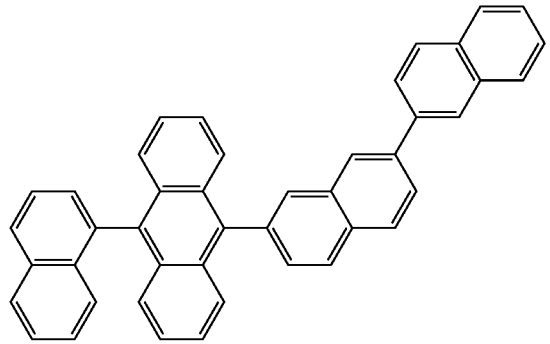
H18
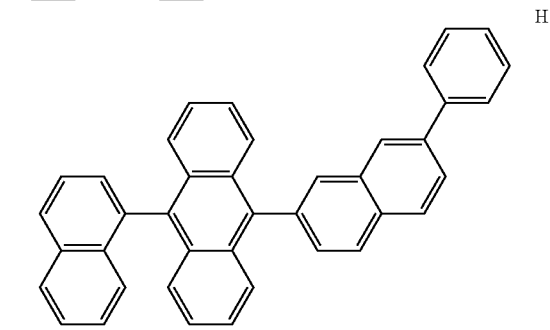
H19
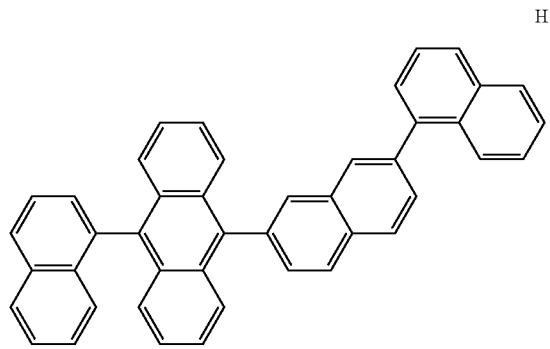
H20
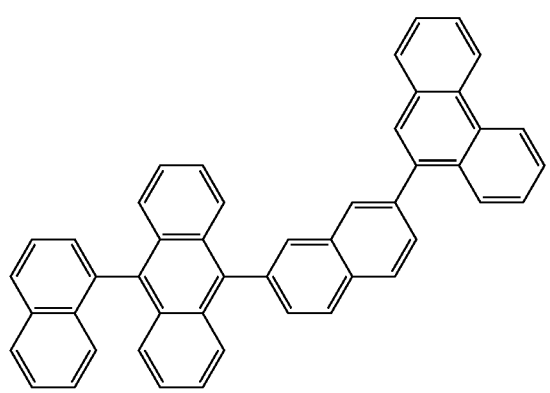
H21
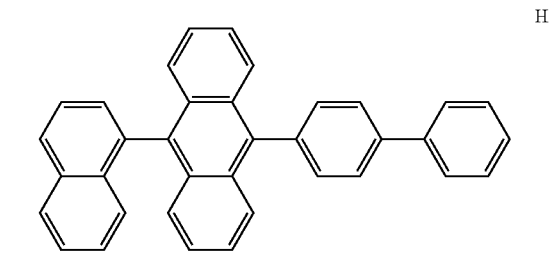

H22
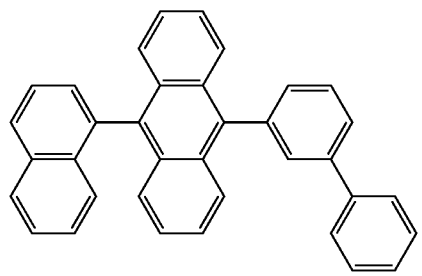
H27
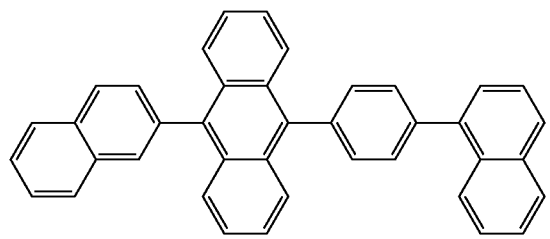
H23
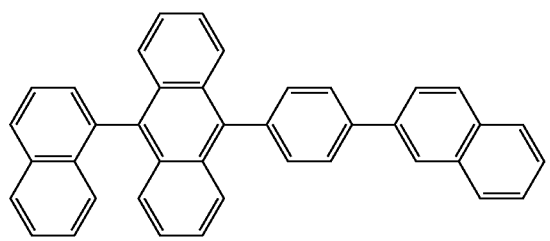
H28
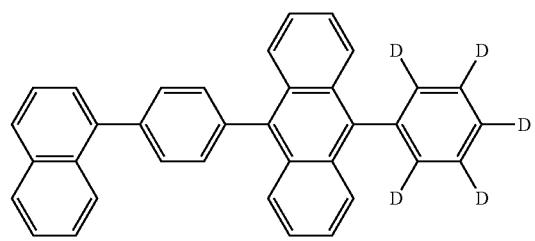
H24
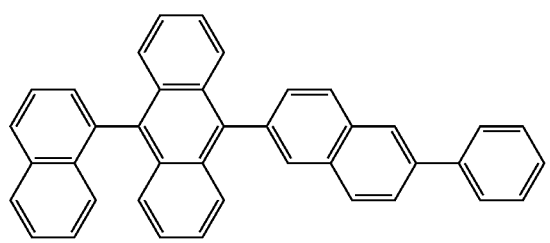
H29
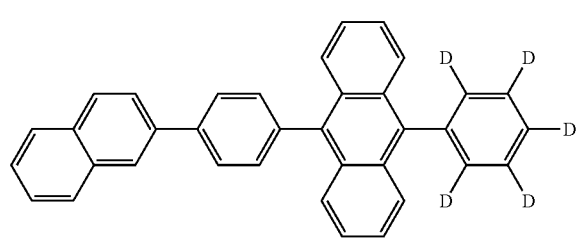
H30
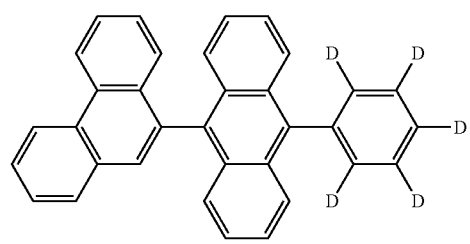
H25
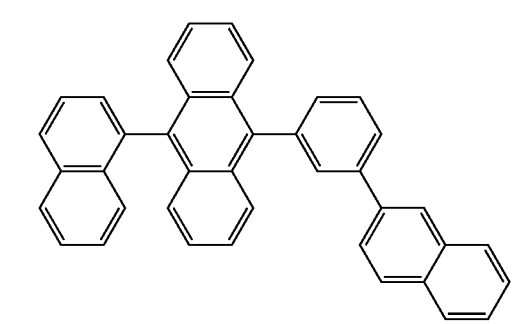
H31
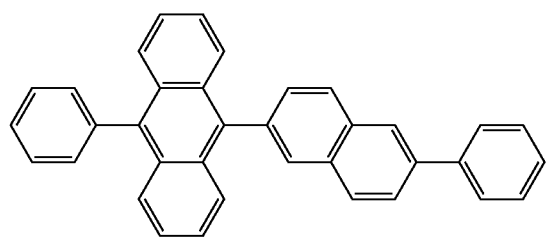
H26
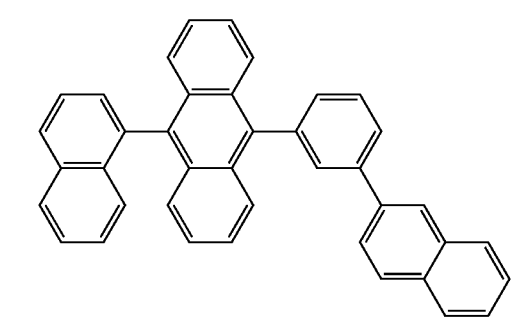
H32
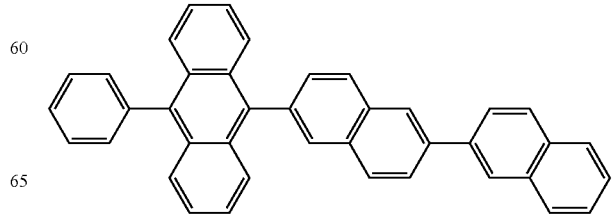

91
-continued
H33
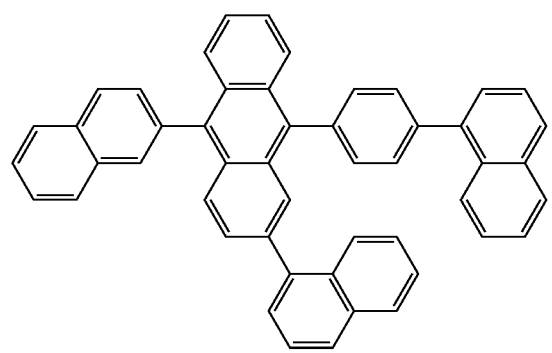
H34
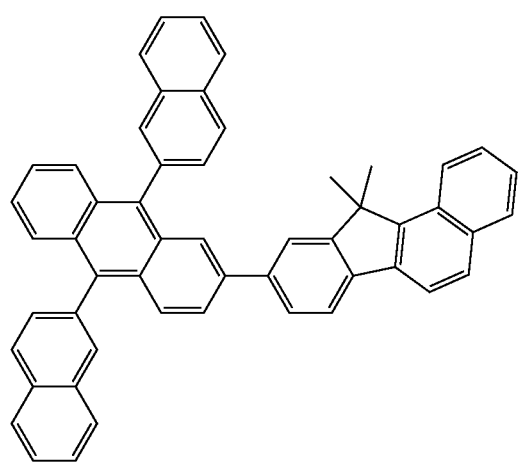
H35
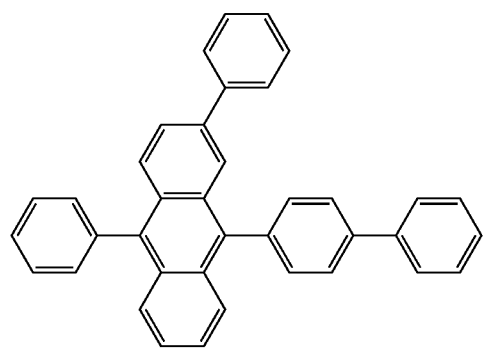
92
-continued
H36
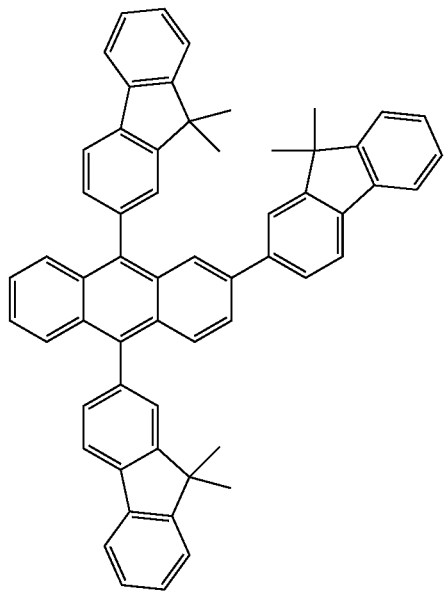
H37
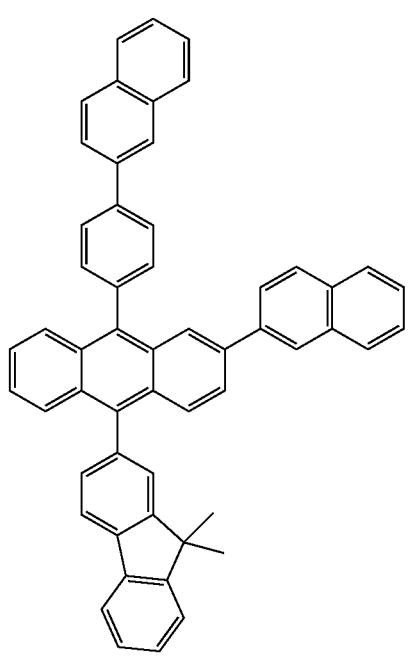
H38
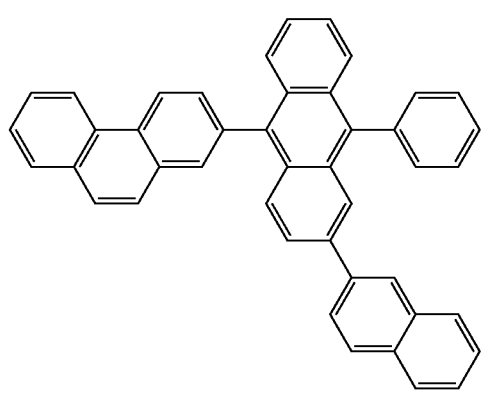

H39
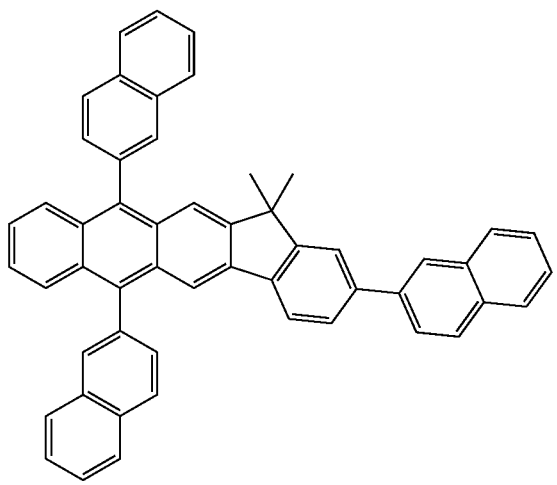
H42
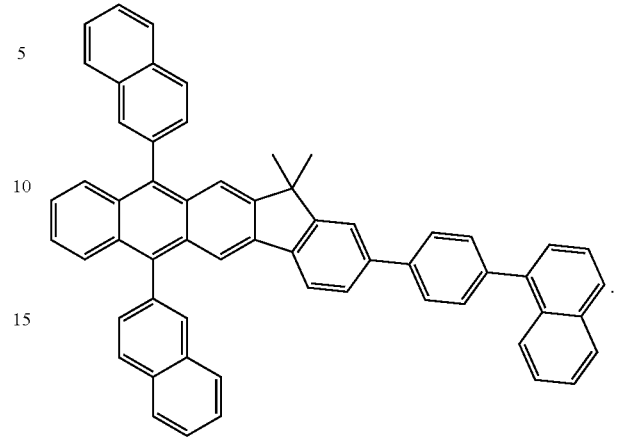
In an implementation, the host may include at least one selected from Compounds H43 to H49 below.
H40
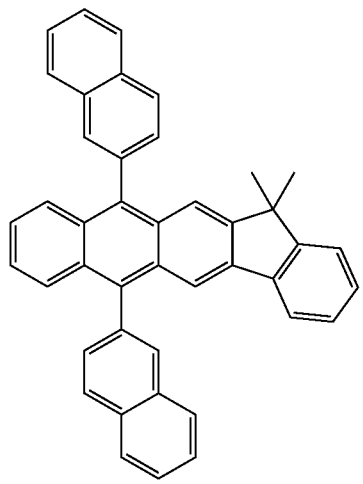
H43
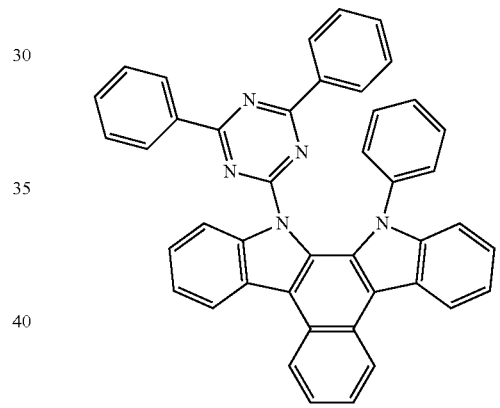
H41
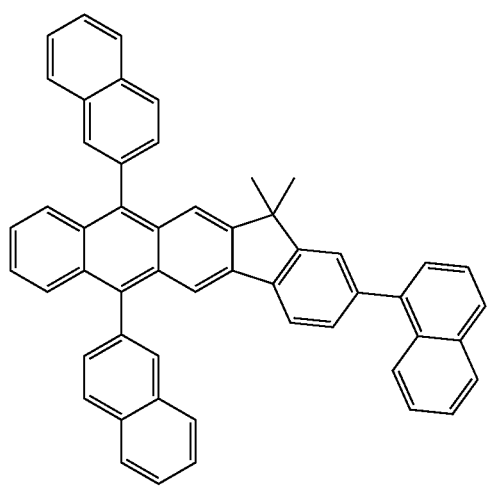
H44
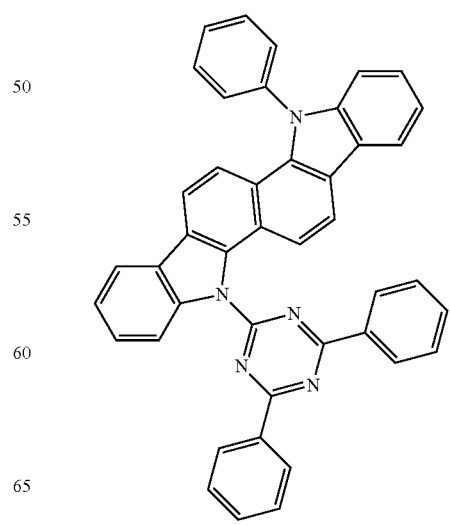

H45
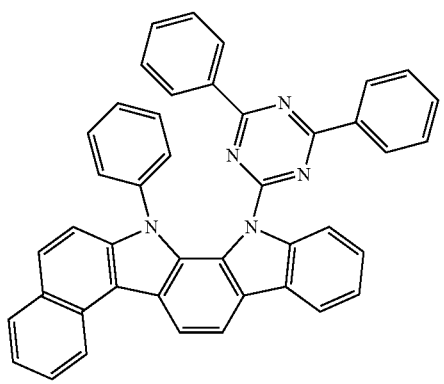

H46
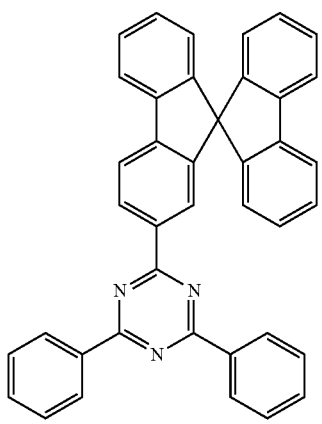

H47
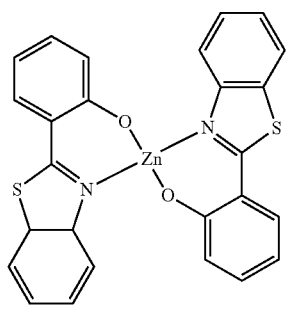

H48
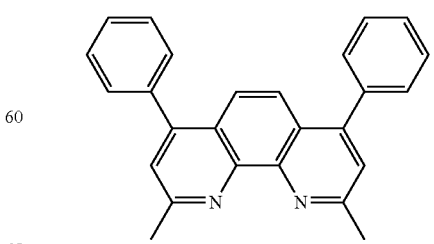

H49
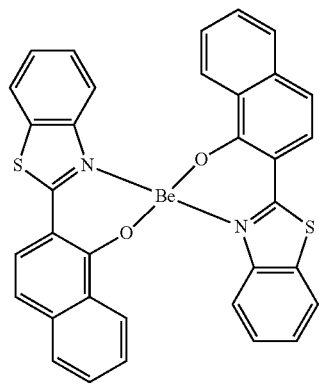

In an implementation, the dopant may include the condensed-cyclic compound represented by Formula 1.

An amount of the dopant in the emission layer may be, e.g., in a range of about 0.01 parts by weight to about 15 parts by weight, based on 100 parts by weight of the host.

A thickness of the emission layer may be in a range of about 100 Å to about 1,000 Å, e.g., about 200 Å to about 600 Å. When the thickness of the emission layer is within this range, excellent light-emission characteristics may be obtained without a substantial increase in driving voltage.

Then, an electron transport region may be disposed on the emission layer.

The electron transport region may include at least one selected from a hole blocking layer, an electron transport layer (ETL), and an electron injection layer.

For example, the electron transport region may have a structure of electron transport layer/electron injection layer or a structure of hole blocking layer/electron transport layer/electron injection layer, wherein layers of each structure are sequentially stacked from the emission layer in the stated order.

In some embodiments, the organic layer 150 of the organic light-emitting device may include an electron transport region disposed between the emission layer and the second electrode 190.

When the electron transport region includes a hole blocking layer, the hole blocking layer may be formed on the emission layer by using various methods, e.g., vacuum-deposition, spin coating, casting, LB method, inkjet printing, laser-printing, or LITI. When the hole blocking layer is formed by vacuum-deposition or spin coating, deposition and coating conditions for the hole blocking layer may be determined by referring to the deposition and coating conditions for the hole injection layer.

The hole blocking layer may include, e.g., at least one selected from BCP and Bphen.

BCP

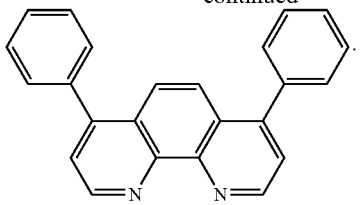

Bphen

A thickness of the hole blocking layer may be in a range of about 20 Å to about 1,000 Å, e.g., about 30 Å to about 300 Å. When the thickness of the hole blocking layer is within this range, excellent hole blocking characteristics may be obtained without a substantial increase in driving voltage.

The electron transport region may include an electron transport layer. The electron transport layer may be formed on the emission layer or the hole blocking layer by using various methods, e.g., vacuum deposition, spin coating, casting, LB method, ink-jet printing, laser-printing, or LITI. When the electron transport layer is formed by using vacuum deposition or spin coating, vacuum deposition and coating conditions for the electron transport layer may be determined by referring to the vacuum deposition and coating conditions for the hole injection layer.

In some embodiments, the electron transport layer may include at least one selected from a compound represented by Formula 601 and a compound represented by Formula 602.

$$Ar_{601}\text{-}[(L_{601})_{xe1}\text{-}E_{601}]_{xe2} \qquad \text{<Formula 601>}$$

In Formula 601, $Ar_{601}$ may be selected from:

a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene; and a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{301}$)($Q_{302}$)($Q_{303}$); wherein $Q_{301}$ to $Q_{303}$ may be each independently selected from a hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group;

$L_{601}$ may be the same as defined in connection with $L_{201}$;

$E_{601}$ may be selected from:

a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

xe1 may be selected from 0, 1, 2, and 3; and
xe2 may be selected from 1, 2, 3, and 4.

<Formula 602>

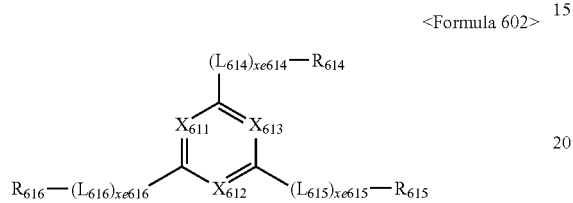

In Formula 602, $X_{611}$ may be N or C-$(L_{611})_{xe611}$-$R_{611}$, $X_{612}$ may be N or C-$(L_{612})_{xe612}$-$R_{612}$, $X_{613}$ may be N or C-$(L_{613})_{xe613}$-$R_{613}$, and at least one selected from $X_{611}$ to $X_{613}$ may be N;

$L_{611}$ to $L_{616}$ may each be the same as defined in connection with $L_1$ provided herein;

$R_{611}$ to $R_{616}$ may each independently be selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xe611 to xe616 may be each independently selected from 0, 1, 2, and 3.

The compound represented by Formula 601 and/or the compound represented by Formula 602 may each independently be selected from Compounds ET1 to ET15 illustrated below.

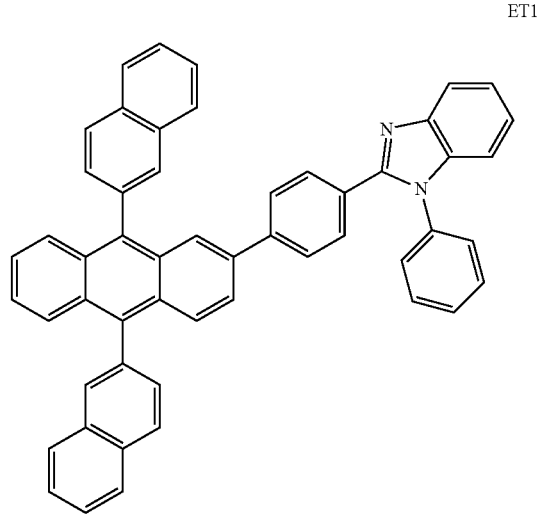

ET1

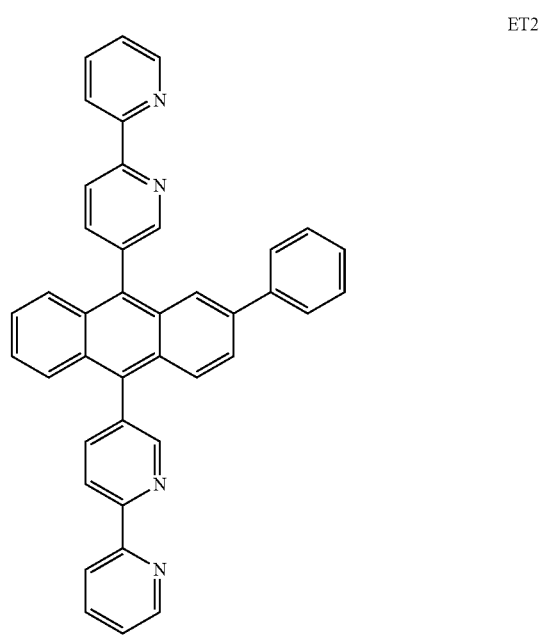

ET2

ET3
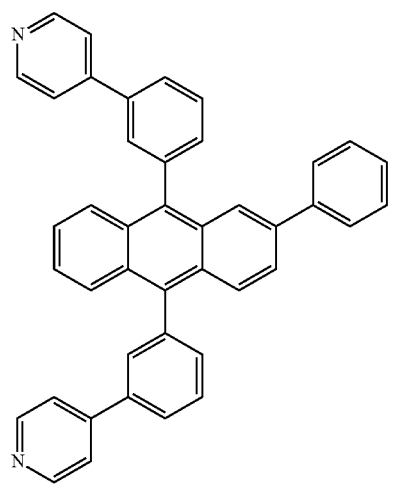
ET4
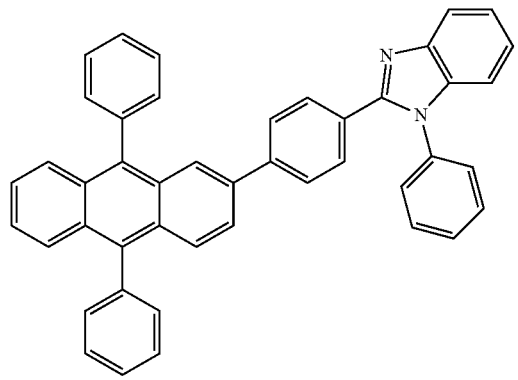
ET5
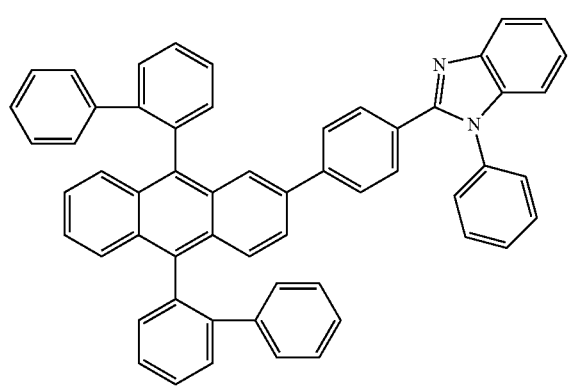
ET6
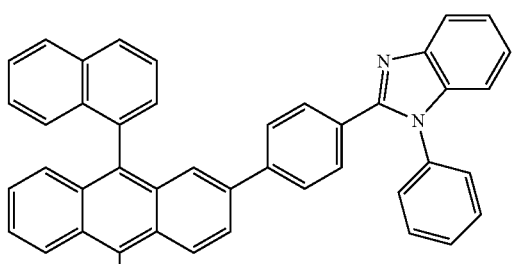
ET7
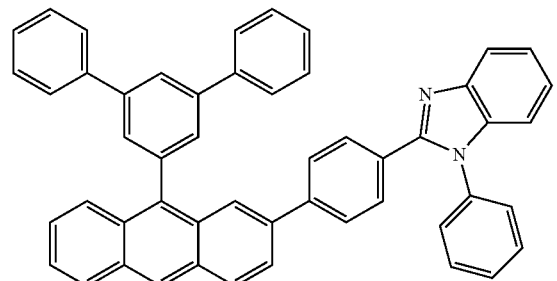
ET8
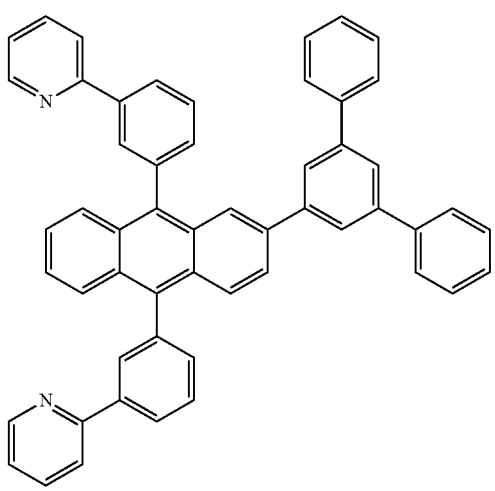

ET9
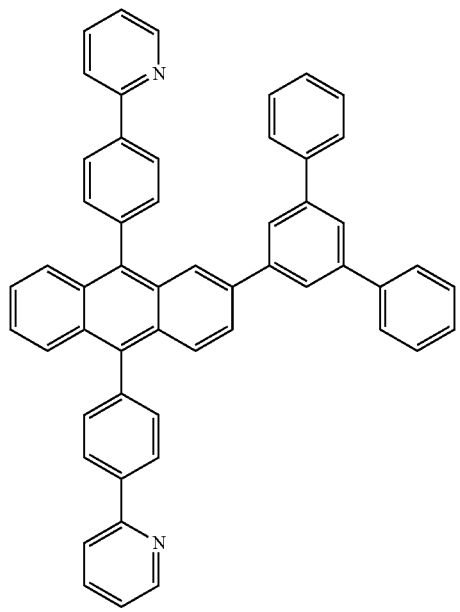
ET10
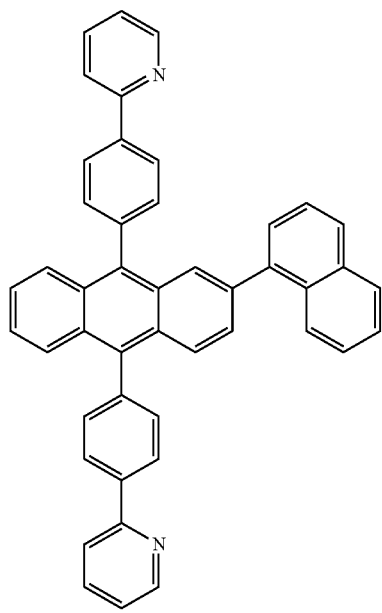
ET11
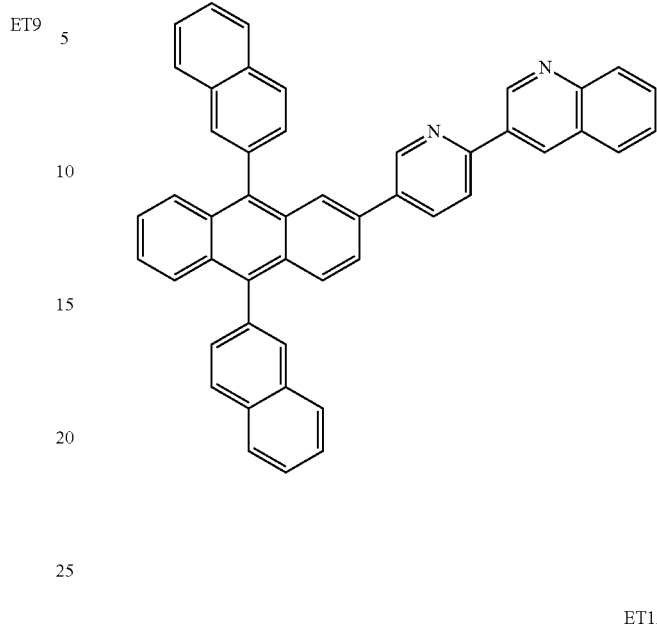
ET12
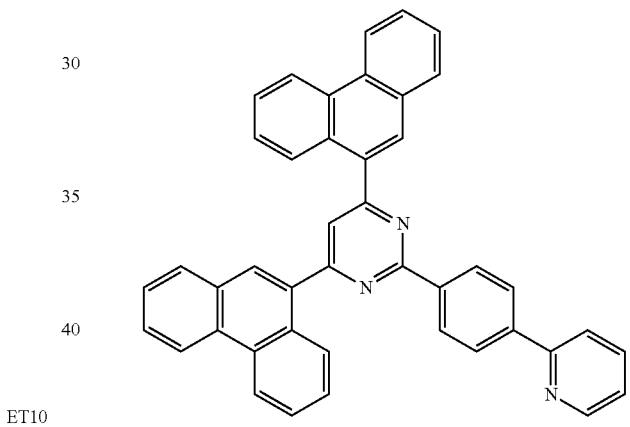
ET13
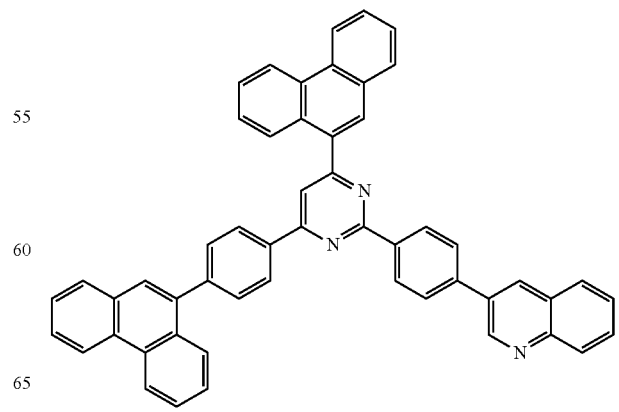

ET14

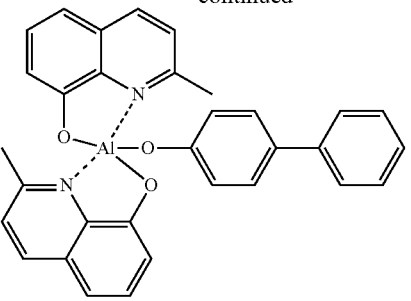

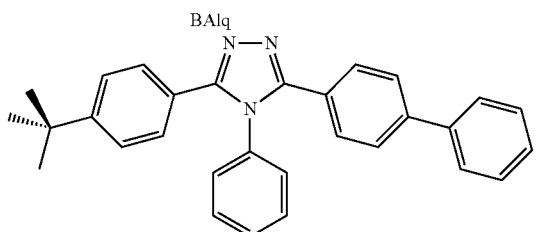
TAZ

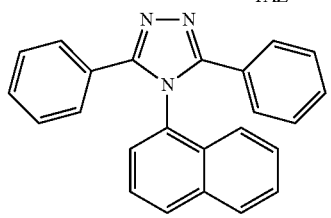
NTAZ

ET15

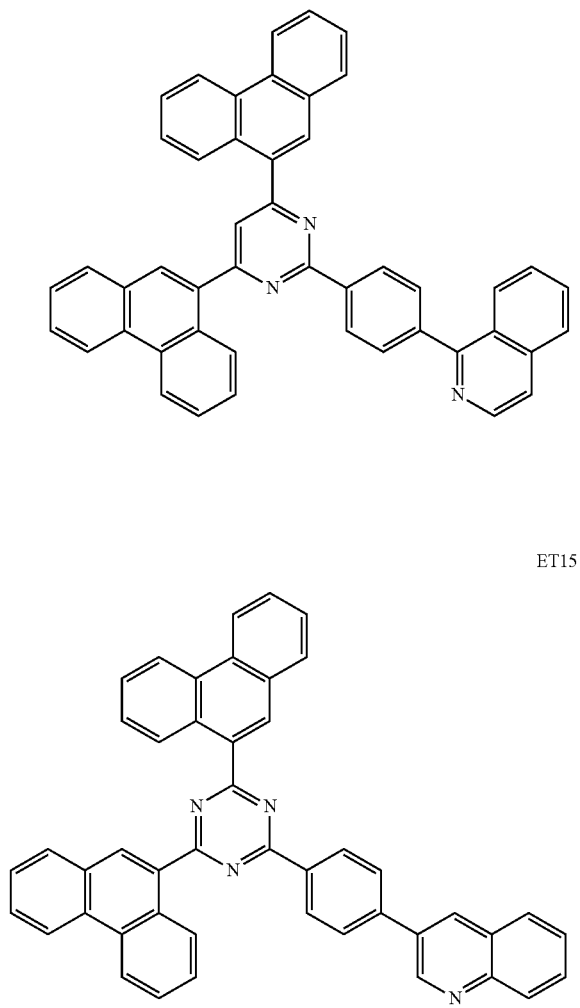

A thickness of the electron transport layer may be in a range of about 100 Å to about 1,000 Å, e.g., about 150 Å to about 500 Å. When the thickness of the electron transport layer is within this range, excellent electron transport characteristics may be obtained without a substantial increase in driving voltage.

The electron transport layer may further include a metal-containing material in addition to the materials described above.

The metal-containing material may include a Li complex. The Li complex may include, e.g., Compound ET-D1 (lithium quinolate, LiQ) or ET-D2.

In some embodiments, the electron transport layer may include at least one selected from BCP, Bphen, Alq₃, BAlq, TAZ, and NTAZ.

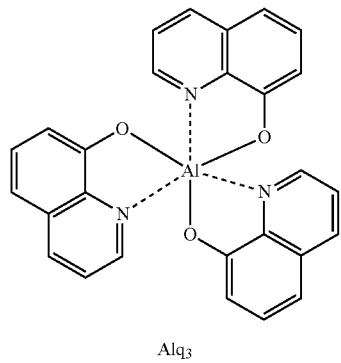
Alq₃

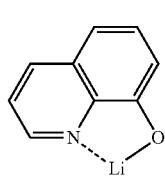
ET-D1

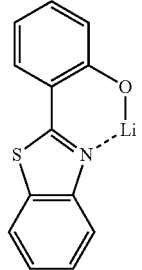
ET-D2

The electron transport region may include an electron injection layer that facilitates electron injection from the second electrode 190.

The electron injection layer may be formed on the electron transport layer by using various methods, e.g., vacuum-deposition, spin coating, casting, LB method, ink-jet printing, laser-printing, or LITI. When the electron injection layer is formed by vacuum-deposition or spin coating, vacuum-deposition and coating conditions for the electron injection layer may be determined by referring to the vacuum-deposition and coating conditions for the hole injection layer.

The electron injection layer may include at least one selected from, LiF, NaCl, CsF, Li$_2$O, BaO, and LiQ.

A thickness of the electron injection layer may be in a range of about 1 Å to about 100 Å, e.g., about 3 Å to about 90 Å. When the thickness of the electron injection layer is within this range, excellent electron injection characteristics may be obtained without a substantial increase in driving voltage.

The second electrode 190 may be disposed on the organic layer 150. The second electrode 190 may be a cathode that is an electron injection electrode, and in this regard, a material for forming the second electrode 190 may be a material having a low work function, and such a material may include a metal, alloy, an electrically conductive compound, or a mixture thereof. Examples of the material for the second electrode 190 may include lithium (Li), magnesium (Mg), aluminum (Al), aluminum-lithium (Al—Li), calcium (Ca), magnesium-indium (Mg—In), or magnesium-silver (Mg—Ag). In some embodiments, the material for forming the second electrode 190 may be ITO or IZO. The second electrode 190 may be a semi-transmissive electrode or a transmissive electrode.

Figure 2:
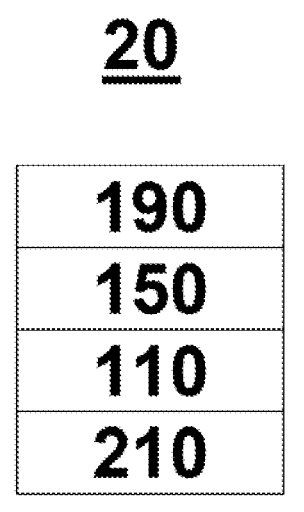
Figure 3:
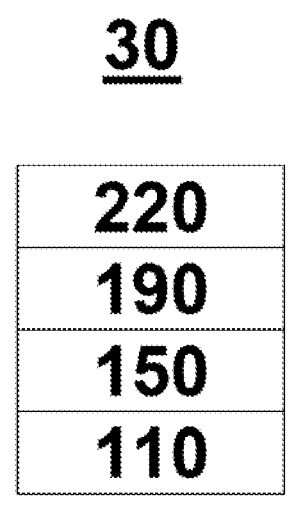
Figure 4:
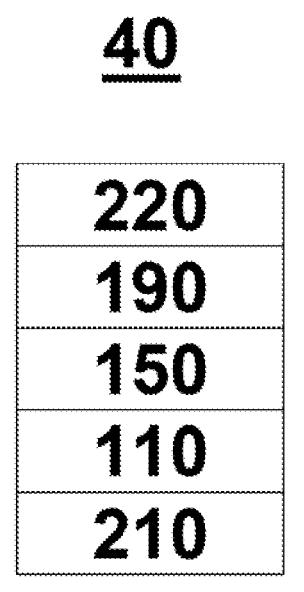

Referring to FIG. 2, an organic light-emitting device 20 may have a structure including a first capping layer 210, the first electrode 110, the organic layer 150, and the second electrode 190, which are sequentially stacked in the stated order. Referring to FIG. 3, an organic light-emitting device 30 may have a structure of the first electrode 110, the organic layer 150, the second electrode 190, and a second capping layer 220, wherein the layers are sequentially stacked in the stated order. Referring to FIG. 4, an organic light-emitting device 40 may have a structure of the first capping layer 210, the first electrode 110, the organic layer 150, the second electrode 190, and the second capping layer 220, wherein the layers are stacked in the stated order.

The first electrode 110, the organic layer 150, and the second electrode 190 according to FIGS. 2 to 4 may be understood by referring to the descriptions with respect to FIG. 1.

In the organic light-emitting device 20, 40, light extracted or emitted from the emission layer in the organic layer 150 may pass through the first electrode 110, which may be a semi-transmissive electrode or transmissive electrode, and through the first capping layer 210 to the outside. In the organic light-emitting device 30, 40, light extracted or emitted from the emission layer in the organic layer 150 may pass through second electrode 190, which may be a semi-transmissive electrode or transmissive electrode, and the second capping layer 220 to the outside.

The first capping layer 210 and the second capping layer 220 may help improve external luminous efficiency based on the principle of constructive interference.

In an implementation, the first capping layer 210 shown in FIG. 2 and/or the second capping layer 220 shown in FIG. 3 may include the condensed-cyclic compound represented by Formula 1.

In an implementation, at least one selected from the first capping layer 210 and second capping layer 220 shown in FIG. 4 may include the condensed-cyclic compound represented by Formula 1.

In an implementation, the organic layer 150 shown in FIGS. 2 to 4 may not include the condensed-cyclic compound represented by Formula 1.

Hereinbefore, the organic light-emitting device has been described with reference to FIGS. 1 to 4.

A $C_1$-$C_{60}$ alkyl group used herein refers to a linear or branched aliphatic hydrocarbon monovalent group having 1 to 60 carbon atoms, and detailed examples thereof are a methyl group, an ethyl group, a propyl group, an iso-butyl group, a sec-butyl group, a tert-butyl group, a pentyl group, an iso-amyl group, and a hexyl group. A $C_1$-$C_{60}$ alkylene group used herein refers to a divalent group having the same structure as a $C_1$-$C_{60}$ alkyl group.

A $C_1$-$C_{60}$ alkoxy group used herein refers to a monovalent group represented by —OA$_{101}$ (wherein A$_{101}$ is the $C_1$-$C_{60}$ alkyl group), and detailed examples thereof are a methoxy group, an ethoxy group and an isopropyloxy group.

A $C_2$-$C_{60}$ alkenyl group used herein refers to a hydrocarbon group formed by substituting at least one carbon double bond in the middle or at the terminal of the $C_2$-$C_{60}$ alkyl group, and detailed examples thereof are an ethenyl group, a propenyl group, and a butenyl group. A $C_2$-$C_{60}$ alkenylene group used herein refers to a divalent group having the same structure as a $C_2$-$C_{60}$ alkenyl group.

A $C_2$-$C_{60}$ alkynyl group used herein refers to a hydrocarbon group formed by substituting at least one carbon triple bond in the middle or at the terminal of the $C_2$-$C_{60}$ alkyl group, and detailed examples thereof are an ethynyl group and a propynyl group. A $C_2$-$C_{60}$ alkynylene group used herein refers to a divalent group having the same structure as a $C_2$-$C_{60}$ alkynyl group.

A $C_3$-$C_{10}$ cycloalkyl group used herein refers to a monovalent monocyclic saturated hydrocarbon group including 3 to 10 carbon atoms, and detailed examples thereof are a cyclopropyl group, a cyclobutyl group, a cyclopentyl group, a cyclohexyl group, and a cycloheptyl group. A $C_3$-$C_{10}$ cycloalkylene group used herein refers to a divalent group having the same structure as a $C_3$-$C_{10}$ cycloalkyl group.

A $C_1$-$C_{10}$ heterocycloalkyl group used herein refers to a monovalent monocyclic group including at least one hetero atom selected from N, O, Si, P, and S as a ring-forming atom and 1 to 10 carbon atoms, and detailed examples thereof are a tetrahydrofuranyl group and a tetrahydrothiophenyl group. A $C_1$-$C_{10}$ heterocycloalkylene group used herein refers to a divalent group having the same structure as a $C_1$-$C_{10}$ heterocycloalkyl group.

A $C_3$-$C_{10}$ cycloalkenyl group used herein refers to a monovalent monocyclic group that has 3 to 10 carbon atoms and at least one double bond in its ring, and which is not aromatic. Detailed examples thereof are a cyclopentenyl group, a cyclohexenyl group, and a cycloheptenyl group. A $C_3$-$C_{10}$ cycloalkenylene group used herein refers to a divalent group having the same structure as a $C_3$-$C_{10}$ cycloalkenyl group.

A $C_1$-$C_{10}$ heterocycloalkenyl group used herein refers to a monovalent monocyclic group including at least one hetero atom selected from N, O, Si, P, and S as a ring-forming atom, 1 to 10 carbon atoms, and at least one double bond in its ring. Detailed examples of the $C_1$-$C_{10}$ heterocycloalkenyl group are a 2,3-hydrofuranyl group and a 2,3-hydrothiophenyl group. A $C_1$-$C_{10}$ heterocycloalkenylene group used herein refers to a divalent group having the same structure as a $C_1$-$C_{10}$ heterocycloalkenyl group.

A $C_6$-$C_{60}$ aryl group used herein refers to a monovalent group including a carbocyclic aromatic system having 6 to 60 carbon atoms, and a $C_6$-$C_{60}$ arylene group used herein refers to a divalent group including a carbocyclic aromatic system having 6 to 60 carbon atoms. Detailed examples of the $C_6$-$C_{60}$ aryl group are a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include a plurality of rings, the rings may be fused to each other.

A $C_1$-$C_{60}$ heteroaryl group used herein refers to a monovalent group having a carbocyclic aromatic system including at least one hetero atom selected from N, O, Si, P, and S as a ring-forming atom and 1 to 60 carbon atoms. A $C_1$-$C_{60}$ heteroarylene group used herein refers to a divalent group having a carbocyclic aromatic system including at least one hetero atom selected from N, O, P, and S as a ring-forming atom and 1 to 60 carbon atoms. Detailed examples of the $C_1$-$C_{60}$ heteroaryl group are a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include a plurality of rings, the rings may be fused to each other.

A $C_6$-$C_{60}$ aryloxy group used herein indicates —$OA_{102}$ (wherein $A_{102}$ is the $C_6$-$C_{60}$ aryl group), and a $C_6$-$C_{60}$ arylthio group used herein indicates —$SA_{103}$ (wherein $A_{103}$ is the $C_6$-$C_{60}$ aryl group).

A monovalent non-aromatic condensed polycyclic group used herein refers to a monovalent group that has a plurality of rings condensed to each other, only carbon atoms (for example, the number of carbon atoms may be in a range of 8 to 60) as ring forming atoms, wherein the molecular structure as a whole is non-aromatic in the entire molecular structure. A detailed example of the monovalent non-aromatic condensed polycyclic group is a fluorenyl group. A divalent non-aromatic condensed polycyclic group used herein refers to a divalent group having the same structure as the monovalent non-aromatic condensed polycyclic group.

A monovalent non-aromatic condensed heteropolycyclic group used herein refers to a monovalent group that has a plurality of rings condensed to each other and a hetero atom selected from N, O, P, Si, and S, other than carbon atoms (for example, the number of carbon atoms may be in a range of 1 to 60), as a ring-forming atom, wherein the molecular structure as a whole is non-aromatic in the entire molecular structure. The monovalent non-aromatic condensed heteropolycyclic group includes a carbazolyl group. A divalent non-aromatic condensed hetero-polycyclic group used herein refers to a divalent group having the same structure as the monovalent non-aromatic condensed hetero-polycyclic group.

At least one of substituents of the substituted $C_3$-$C_{10}$ cycloalkylene group, substituted $C_1$-$C_{10}$ heterocycloalkylene group, substituted $C_3$-$C_{10}$ cycloalkenylene group, substituted $C_1$-$C_{10}$ heterocycloalkenylene group, substituted $C_6$-$C_{60}$ arylene group, substituted $C_1$-$C_{60}$ heteroarylene group, substituted divalent non-aromatic condensed polycyclic group, substituted divalent non-aromatic condensed heteropolycyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group may be selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —$Si(Q_{11})(Q_{12})(Q_{13})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —$Si(Q_{21})(Q_{22})(Q_{23})$; and —$Si(Q_{31})(Q_{32})(Q_{33})$;

wherein $Q_1$ to $Q_3$, $Q_{11}$ to $Q_{13}$, $Q_{21}$ to $Q_{23}$, and $Q_{31}$ to $Q_{33}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

"Ph" used herein refers to a phenyl group, "Me" refers to a methyl group, "Et" refers to an ethyl group, and "ter-Bu" or "But" refers to a tert-butyl group.

Hereinafter, an organic light-emitting device according to an embodiment will be described in detail with reference to Synthesis Examples and Examples. The wording "B was used instead of A" used in describing Synthesis Examples means that a molar equivalent of A was identical to a molar equivalent of B.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLE

Synthesis Example 1

Synthesis of Compound 7

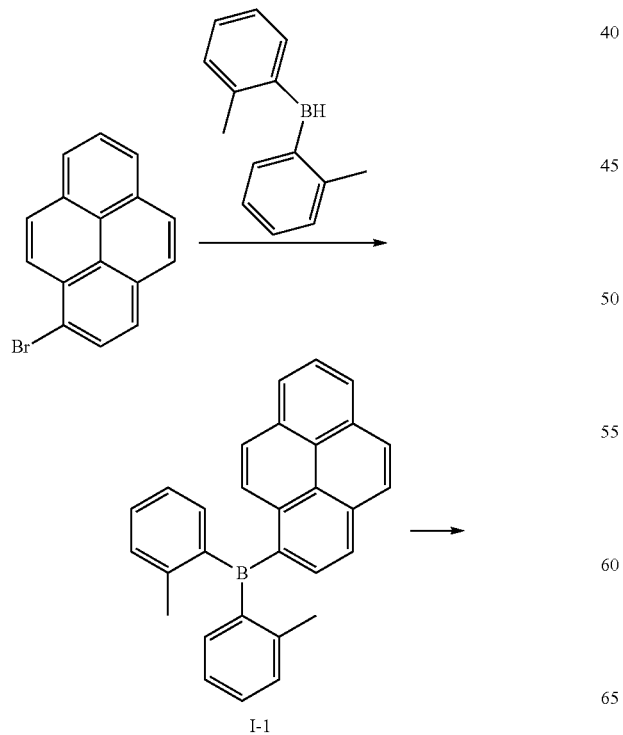

I-1

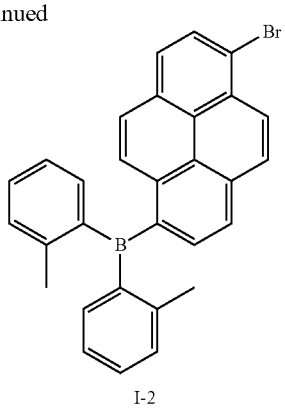

I-2

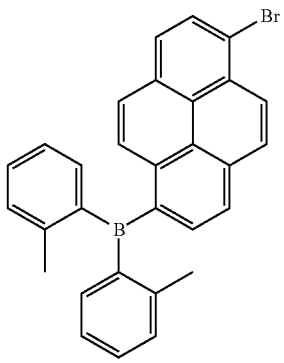

+

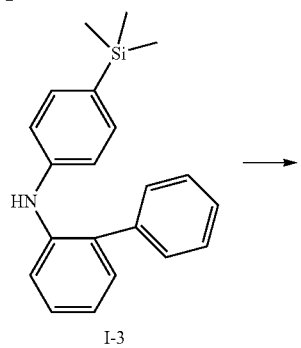

I-3

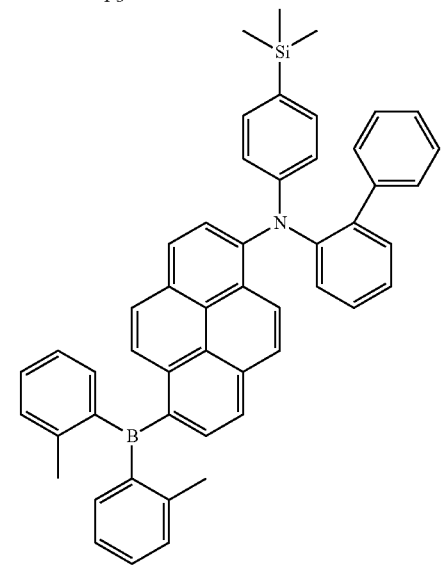

7

Synthesis of Intermediate I-1

1.12 g (4 mmol) of 1-bromo-pyrene was stirred in 100 mL of tetrahydrofuran (THF) at −78° C. for 30 minutes under a $N_2$ atmosphere. 2 mL of 2.5 M n-BuLi was slowly added dropwise thereto by using a dropping funnel, and then, was stirred for 30 minutes. Afterward, 0.95 g (4.5 mmol) of fluorodi-o-tolylborane was added thereto, and was additionally stirred at ambient temperature for 3 hours. Thereafter, an organic layer was extracted 5 times therefrom by using each of water and diethyl ether. Then, the obtained organic layer was dried by using magnesium sulfate ($MgSO_4$). A solvent was removed therefrom by evaporation. The obtained residue was separated and purified through silica gel chromatography to obtain 1.06 g (2.9 mmol) of Intermediate I-1 (yield: 72.5%). The obtained compound was identified by mass spectroscopy/fast atom bombardment (MS/FAB).

$C_{28}H_{19}B$ cal. 366.16. found 366.27.

Synthesis of Intermediate I-2

18.3 g (50 mmol) of Intermediate I-1 was dissolved in 800 mL of $CH_2Cl_2$. 8.9 g (50 mmol) of N-bromosuccinimide was added thereto, and then was stirred at ambient temperature for 12 hours. An organic layer was extracted three times therefrom by using each of 150 mL of water and 300 mL of diethyl ether. The obtained organic layer was dried by using $MgSO_4$. A solvent was removed therefrom by evaporation. The obtained residue was separated and purified through silica gel chromatography to obtain 17.8 g (40 mmol) of Intermediate I-2 (yield: 80%). The obtained compound was identified by MS/FAB.

$C_{28}H_{18}BBr$ cal. 445.07. found 445.17.

Synthesis of Intermediate I-3

0.94 g (4.11 mmol) of (4-bromophenyl)trimethylsilane, 0.51 g (3.00 mmol) of 2-aminobiphenyl, 0.03 g (0.03 mmol) of $Pd_2(dba)_3$, 0.003 g (0.03 mmol) of $PtBu_3$, and 0.86 g (9 mmol) of NaOtBu were dissolved in 30 mL of toluene, and then was stirred at 85° C. for 4 hours. After allowing the result to come to ambient temperature, an organic layer was extracted three times therefrom by using each of 30 mL of water and 30 mL of diethyl ether. The obtained organic layer was dried by using $MgSO_4$. A solvent was removed therefrom by evaporation. The obtained residue was separated and purified through silica gel chromatography to obtain 0.69 g (2.16 mmol) of Intermediate I-3 (yield: 72%). The obtained compound was identified by MS/FAB.

$C_{21}H_{23}NSi$ cal. 317.16. found 317.51.

Synthesis of Compound 7

3.20 g (6.77 mmol) of Intermediate I-2, 2.26 g (7.11 mmol) of Intermediate I-3, 0.06 g (0.07 mmol) of $Pd_2(dba)_3$, 0.01 g (0.07 mmol) of $PtBu_3$, and 0.97 g (10.2 mmol) of NaOtBu were dissolved in 30 mL of toluene, and then was stirred at 85° C. for 4 hours. After allowing the result to come to ambient temperature, an organic layer was extracted three times therefrom by using each of 30 mL of water and 30 mL of diethyl ether. The obtained organic layer was dried by using $MgSO_4$. A solvent was removed therefrom by evaporation. The obtained residue was separated and purified through silica gel chromatography to obtain 3.65 g (5.15 mmol) of Compound 7 (yield: 76%). The obtained compound was identified by MS/FAB and $^1H$ nuclear magnetic resonance (NMR).

Synthesis Example 2

Synthesis of Compound 18

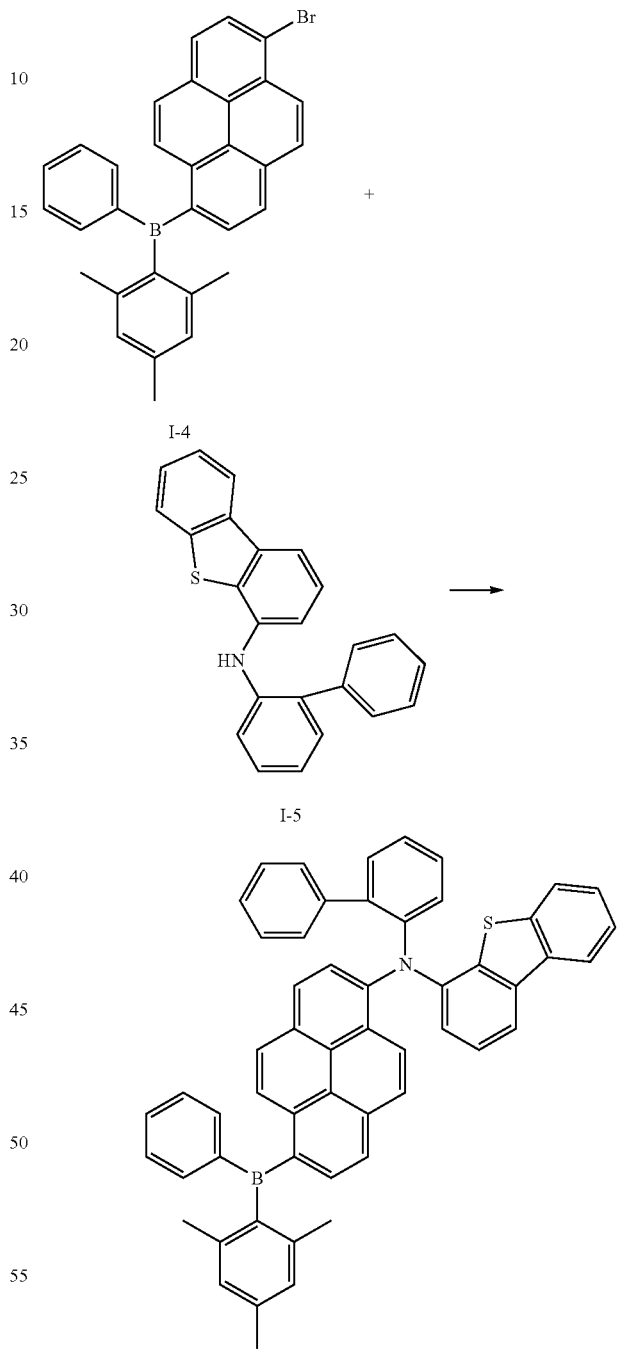

3.64 g (4.81 mmol) of Compound 18 (yield: 71%) was obtained in the same manner as in synthesizing Compound 7 in Synthesis Example 1, except that Intermediate I-4 was used instead of Intermediate I-2, and Intermediate I-5 was used instead of Intermediate I-3. The obtained compound was identified by MS/FAB and $^1H$ NMR.

Synthesis Example 3

Synthesis of Compound 21

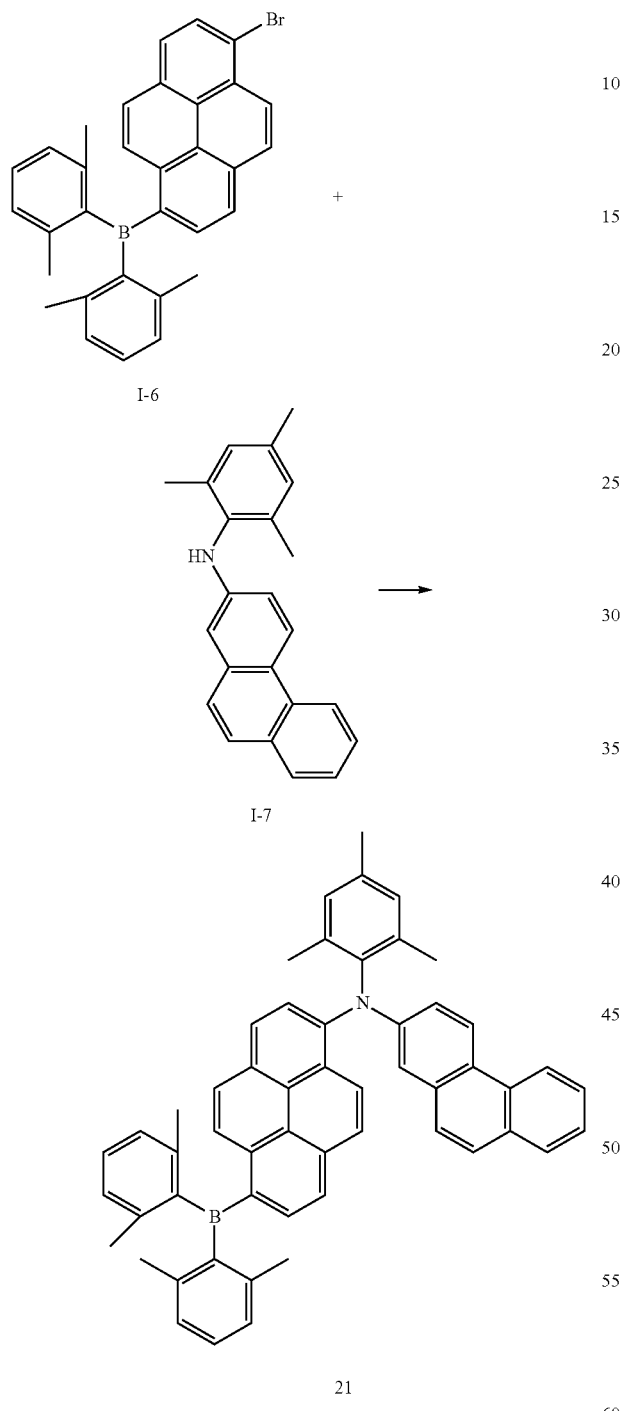

3.42 g (4.67 mmol) of Compound 21 (yield: 69%) was obtained in the same manner as in synthesizing Compound 7 in Synthesis Example 1, except that Intermediate I-6 was used instead of Intermediate I-2, and Intermediate I-7 was used instead of Intermediate I-3. The obtained compound was identified by MS/FAB and $^1$H NMR.

Synthesis Example 4

Synthesis of Compound 32

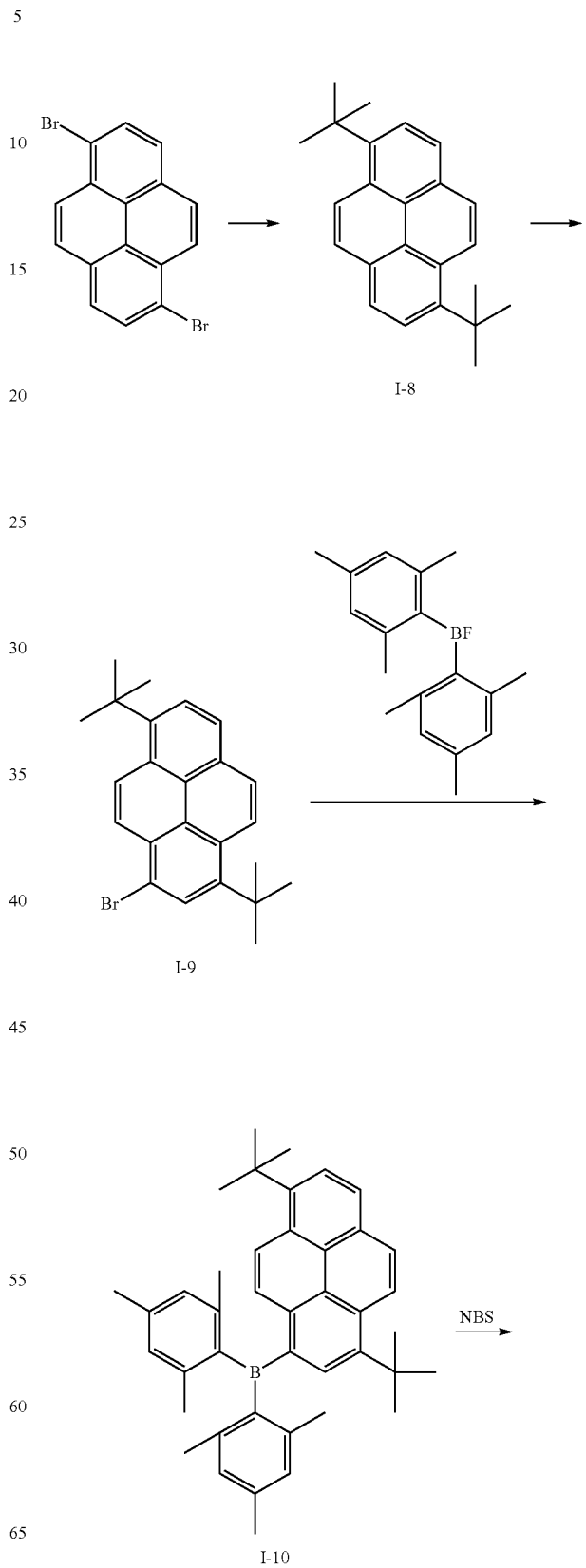

-continued

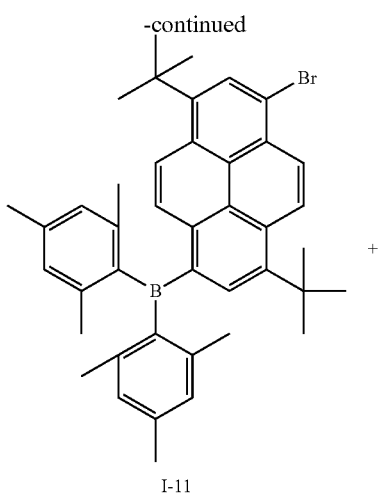

I-11

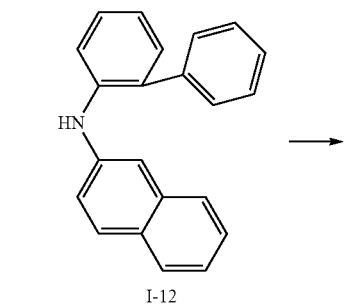

I-12

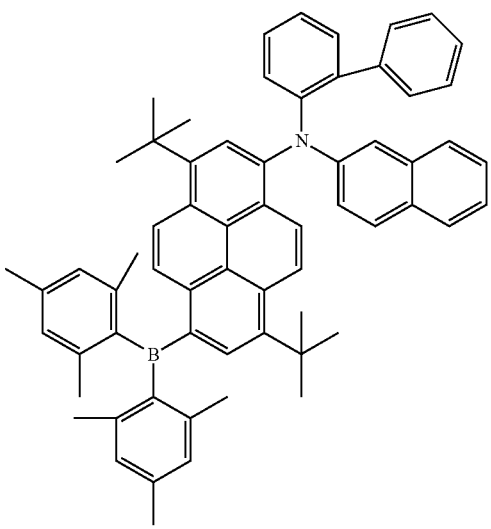

32

Synthesis of Intermediate I-8

7.2 g (20.0 mmol) of 1,6-dibromopyrene was dissolved in 60 mL of THF, and was cooled to −78° C. 48.0 mL of n-BuLi (2.5 M in hexane) was slowly added thereto, heated up to −30° C., and then stirred. 1 hour later, the result was cooled to −78° C. 2.77 g of t-butylchloride was slowly added thereto, and was stirred at ambient temperature for 4 hours. An organic layer was extracted three times therefrom by using each of 60 mL of water and 60 mL of diethyl ether. The obtained organic layer was dried by using $MgSO_4$. A solvent was removed therefrom by evaporation. The obtained residue was separated and purified through silica gel chromatography to obtain 4.099 g (13 mmol) of Intermediate I-8 (yield: 65%). The obtained compound was identified by MS/FAB.

$C_{24}H_{26}$ cal. 314.20. found 314.47.

Synthesis of Intermediate I-9

3.96 g (12.6 mmol) of Intermediate I-8 was dissolved in 30 mL of a mixture solution of diethyl ether/methanol (2.5/1). 3.8 mL of HBr (33 wt % in AcOH) was slowly added thereto at 0° C., and was stirred for 30 minutes. 1.73 mL of hydrogen peroxide (30 wt % in $H_2O$) was slowly added to the result solution at the same temperature, and was stirred at ambient temperature for 8 hours. Once the reaction was complete, an organic layer was extracted three times therefrom by using each of 30 mL of water and 30 mL of diethyl ether. The obtained organic layer was dried by using $MgSO_4$. A solvent was removed therefrom by evaporation. The obtained residue was separated and purified through silica gel chromatography to obtain 4.56 g (11.6 mmol) of Intermediate I-9 (yield: 92%). The obtained compound was identified by MS/FAB.

$C_{25}H_{28}Br$ cal. 392.11. found 393.37.

Synthesis of Intermediate I-10

1.46 g (2.6 mmol) of Intermediate I-10 (yield: 65%) was obtained in the same manner as in synthesizing Intermediate I-1 in Synthesis Example 1, except that Intermediate I-9 was used instead of 1-bromo-pyrene, and fluorodimesitylborane was used instead of fluorodi-o-tolylborane. The obtained compound was identified by MS/FAB and $^1$H NMR.

$C_{42}H_{47}B$ cal. 562.38. found 562.69.

Synthesis of Intermediate I-11

23.1 g (36 mmol) of Intermediate I-11 (yield: 72%) was obtained in the same manner as in synthesizing Intermediate I-2 in Synthesis Example 1, except that Intermediate I-10 was used instead of Intermediate I-1. The obtained compound was identified by MS/FAB and $_1$H NMR.

$C_{42}H_{46}BBr$ cal. 640.29. found 641.56.

Synthesis of Compound 32

3.30 g (3.86 mmol) of Compound 32 (yield: 57%) was obtained in the same manner as in synthesizing Compound 7 in Synthesis Example 1, except that Intermediate I-11 was used instead of Intermediate I-2, and Intermediate I-12 was used instead of Intermediate I-3. The obtained compound was identified by MS/FAB and $^1$H NMR.

Synthesis Example 5

Synthesis of Compound 36

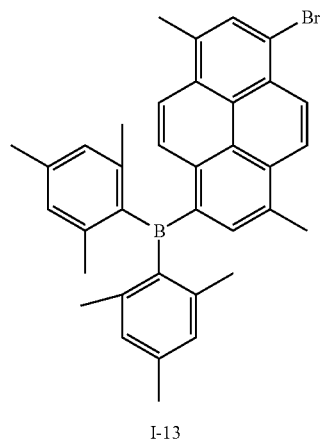

I-13

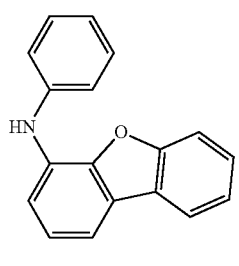

I-14

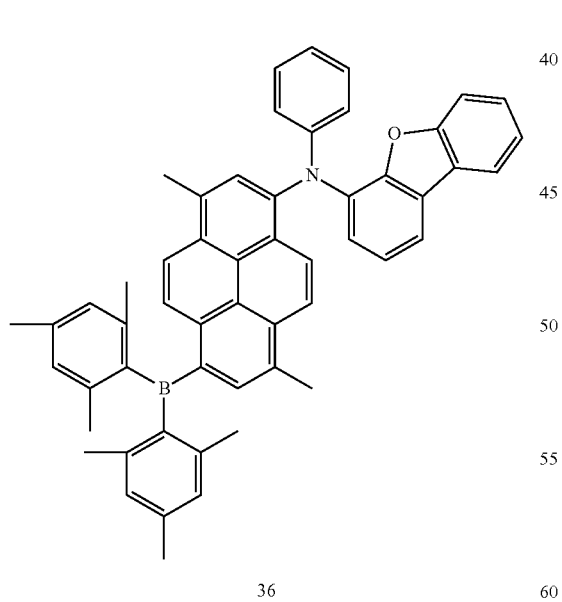

36

3.49 g (4.74 mmol) of Compound 36 (yield: 70%) was obtained in the same manner as in synthesizing Compound 7 in Synthesis Example 1, except that Intermediate I-13 was used instead of Intermediate I-2, and Intermediate I-14 was used instead of Intermediate I-3. The obtained compound was identified by MS/FAB and $^1$H NMR.

Synthesis Example 6

Synthesis of Compound 46

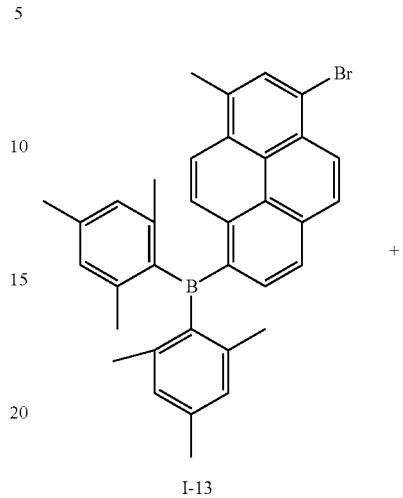

I-13

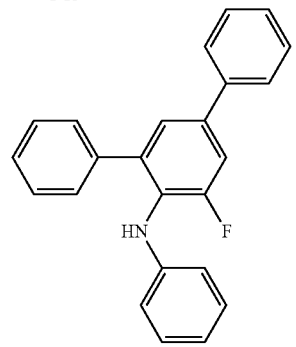

I-16

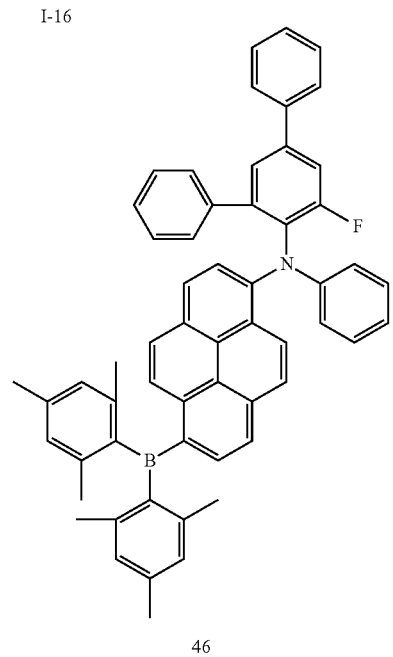

46

2.51 g (3.25 mmol) of Compound 46 (yield: 48%) was obtained in the same manner as in synthesizing Compound 7 in Synthesis Example 1, except that Intermediate I-15 was used instead of Intermediate I-2, and Intermediate I-16 was used instead of Intermediate I-3. The obtained compound was identified by MS/FAB and ¹H NMR.

Synthesis Example 7

Synthesis of Compound 52

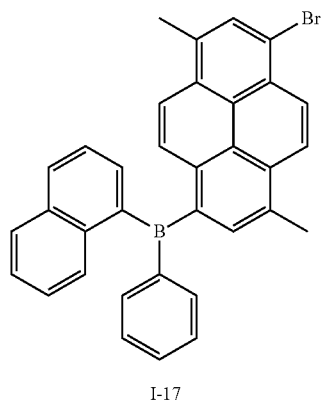

I-17

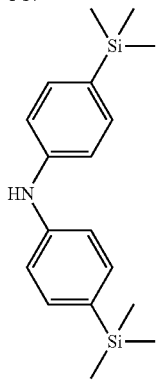

I-18

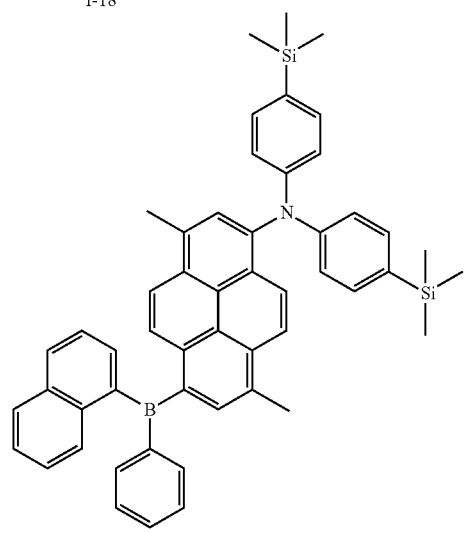

52

3.84 g (5.08 mmol) of Compound 52 (yield: 75%) was obtained in the same manner as in synthesizing Compound 7 in Synthesis Example 1, except that Intermediate I-17 was used instead of Intermediate I-2, and Intermediate I-18 was used instead of Intermediate I-3. The obtained compound was identified by MS/FAB and ¹H NMR.

Synthesis Example 8

Synthesis of Compound 64

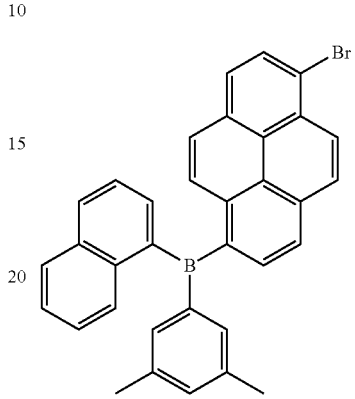

I-19

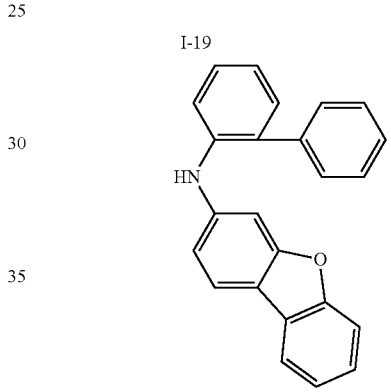

I-20

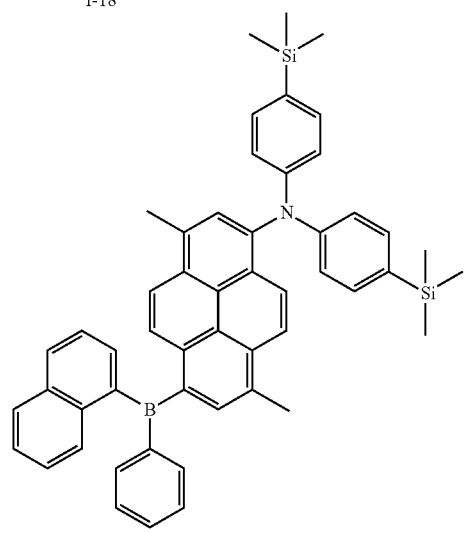

64

3.21 g (4.13 mmol) of Compound 64 (yield: 61%) was obtained in the same manner as in synthesizing Compound 7 in Synthesis Example 1, except that Intermediate I-19 was used instead of Intermediate I-2, and Intermediate I-20 was used instead of Intermediate I-3. The obtained compound was identified by MS/FAB and ¹H NMR.

Synthesis Example 9

Synthesis of Compound 79

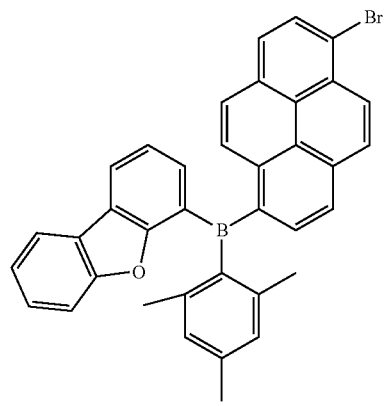

I-21

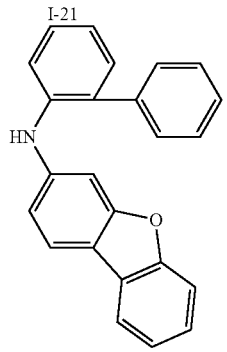

I-20

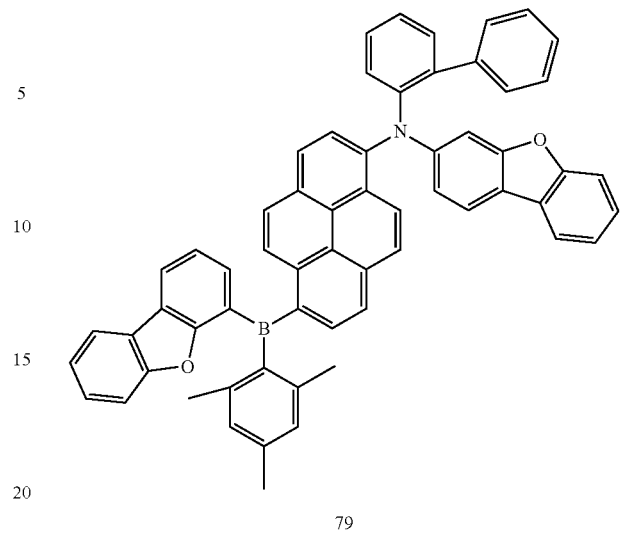

79

3.55 g (4.27 mmol) of Compound 79 (yield: 63%) was obtained in the same manner as in synthesizing Compound 7 in Synthesis Example 1, except that Intermediate I-21 was used instead of Intermediate I-2, and Intermediate I-20 was used instead of Intermediate I-3. The obtained compound was identified by MS/FAB and $_1$H NMR.

Compounds prepared in Synthesis Examples 1 to 9 were identified by $^1$H NMR and MS/FAB. The results are shown in Table 1.

Methods of synthesizing compounds other than Compounds shown in Table 1 may be understood by referring to the synthesis pathways and raw materials according to Synthesis Examples 1 to 9.

TABLE 1

| Compound | $^1$H NMR (CDCl$_3$, 400 MHz) | MS/FAB found | MS/FAB calc. |
|---|---|---|---|
| 7 | δ = 8.43 (d, 1H), 8.24 (d, 1H), 8.18 (d, 1H), 7.89 (d, 1H), 7.73 (d, 1H), 7.63-7.52 (m, 7H), 7.46 (t, 1H), 7.38-7.35 (m, 2H), 7.31-7.11 (m, 8H), 6.99-6.93 (m, 3H), 6.83 (d, 1H), 6.42-6.46 (m, 2H), 2.36-2.38 (m, 6H), 0.23-0.25 (m, 9H) | 709.81 | 709.33 |
| 18 | δ = 8.43 (d, 1H), 8.24 (d, 1H), 8.18 (d, 1H), 8.05 (d, 1H), 7.99 (d, 1H), 7.84-7.71 (m, 5H), 7.62-7.55 (m, 6H), 7.50-7.35 (m, 3H), 7.28-7.25 (m, 2H), 7.21-7.10 (m, 4H), 7.00 (t, 1H), 6.96 (d, 1H), 6.91 (d, 1H), 6.80 (s, 2H), 6.66 (d, 1H), 2.21-2.20 (m, 6H), 2.18 (m, 3H) | 757.69 | 757.30 |
| 21 | δ = 8.48-8.45 (m, 2H), 8.24 (d, 1H), 8.14 (d, 1H), 7.99-7.93 (m, 2H), 7.85 (d, 1H), 7.77 (d, 1H), 7.68-7.51 (m, 6H), 7.31 (d, 1H), 7.25 (s, 1H), 7.09-7.05 (m, 2H), 6.98-6.95 (m, 4H), 6.73-6.71 (m, 3H), 2.28 (m, 3H), 2.18-2.17 (m, 18H) | 731.51 | 731.37 |
| 32 | δ = 8.87 (d, 1H), 8.5 (d, 1H), 8.39 (d, 1H), 8.29 (d, 1H), 7.91 (s, 1H), 7.87 (d, 1H), 7.61-7.42 (m, 9H), 7.24 (s, 1H), 7.14 (d, 1H), 7.01-7.93 (m, 4H), 6.83-6.82 (m, 5H), 2.20 (m, 12H), 2.18 (m, 6H), 1.48 (s, 9H), 1.44 (s, 9H) | 855.93 | 855.50 |
| 36 | δ = 8.73 (d, 1H), 8.34 (d, 1H), 8.05 (d, 1H), 7.89 (d, 1H), 7.82 (d, 1H), 7.73 (s, 1H), 7.69 (d, 1H), 7.65 (d, 1H), 7.47 (d, 1H), 7.40 (d, 1H), 7.30 (s, 1H), 7.07-6.92 (m, 4H), 6.82 (m, 4H), 6.62 (t, 1H), 6.24-6.21 (m, 2H), 2.74 (q, 3H), 2.52 (q, 3H), 2.20-2.19 (m, 12H), 2.18 (m, 6H) | 735.47 | 735.37 |
| 46 | δ = 8.47 (d, 1H), 8.24 (d, 1H), 8.14 (d, 1H), 7.89 (d, 1H), 7.77 (d, 1H), 7.69-7.48 (m, 10H), 7.40 (t, 1H), 7.32-7.30 (m, 2H), 7.11 (d, 1H), 7.05 (dd, 1H), 7.06-7.01 (m, 2H), 6.81-6.80 (m, 4H), 6.60 (t, 1H), 6.11-6.07 (m, 2H), 2.20 (m, 12H), 2.18 (m, 6H) | 787.66 | 787.38 |
| 52 | δ = 8.49 (d, 1H), 8.25 (d, 1H), 8.24 (d, 1H), 7.93 (d, 1H), 7.87 (d, 2H), 7.78-7.75 (m, 3H), 7.58 (s, 1H), 7.44-7.26 (m, 10H), | 755.59 | 755.36 |

TABLE 1-continued

| | | MS/FAB | |
|---|---|---|---|
| Compound | $^1$H NMR (CDCl$_3$, 400 MHz) | found | calc. |
| | 7.07 (s, 1H), 6.57-6.53 (m, 4H), 2.71 (q, 3H), 2.57 (q, 3H), 0.24 (t, 18H) | | |
| 64 | δ = 8.50 (d, 1H), 8.33 (d, 1H), 8.25 (d, 1H), 8.22 (d, 1H), 7.93 (d, 1H), 7.92 (d, 1H), 7.81 (d, 1H), 7.78 (d, 1H), 7.77 (d, 1H), 7.75 (d, 1H), 7.73 (d, 1H), 7.59-7.33 (m, 12H), 7.25-7.08 (m, 4H), 6.99 (t, 1H), 6.83-6.80 (m, 4H), 6.64-6.63 (m, 2H), 2.12 (q, 6H) | 777.67 | 777.32 |
| 79 | δ = 8.54 (d, 1H), 8.26 (d, 1H), 7.98 (d, 1H), 7.92 (d, 2H), 7.85-7.72 (m, 5H), 7.59-7.36 (m, 12H), 7.26-7.12 (m, 5H), 6.99 (t, 1H), 6.85-6.80 (m, 5H), 2.21 (t, 6H), 2.18 (m, 3H) | 831.75 | 831.33 |

Example 1

A 15 ohms per square centimeter (Ω/cm$^2$) (1,200 Å (Angstroms)) ITO glass substrate (available from Corning Co., Ltd) was cut to a size of 50 millimeters (mm)×50 mm×0.7 mm, sonicated in isopropyl alcohol and pure water for 5 minutes in each solvent, cleaned with ultraviolet rays for 30 minutes, and then ozone, and was mounted on a vacuum deposition apparatus.

Compound HT13 was vacuum-deposited on the ITO anode of the glass substrate to form a hole injection layer having a thickness of about 600 Å. Then, Compound HT3 was vacuum-deposited on the hole injection layer to form a hole transport layer having a thickness of about 300 Å, thereby forming a hole transport region.

9,10-di-naphthalene-2-yl-anthracene (ADN), which is a host, and Compound 7, which is a dopant, were co-deposited on the hole transport region at a weight ratio of about 98:2, thereby forming an emission layer having a thickness of about 300 Å.

Alq$_3$ was vacuum-deposited on the emission layer to form an electron transport layer having a thickness of about 300 Å. Then, LiF was vacuum-deposited on the electron transport layer to form an electron injection layer having a thickness of about 10 Å, thereby forming an electron transport region.

Aluminum was vacuum-deposited on the electron transport region to form a cathode having a thickness of about 3,000 Å, thereby completing the manufacture of an organic light-emitting device.

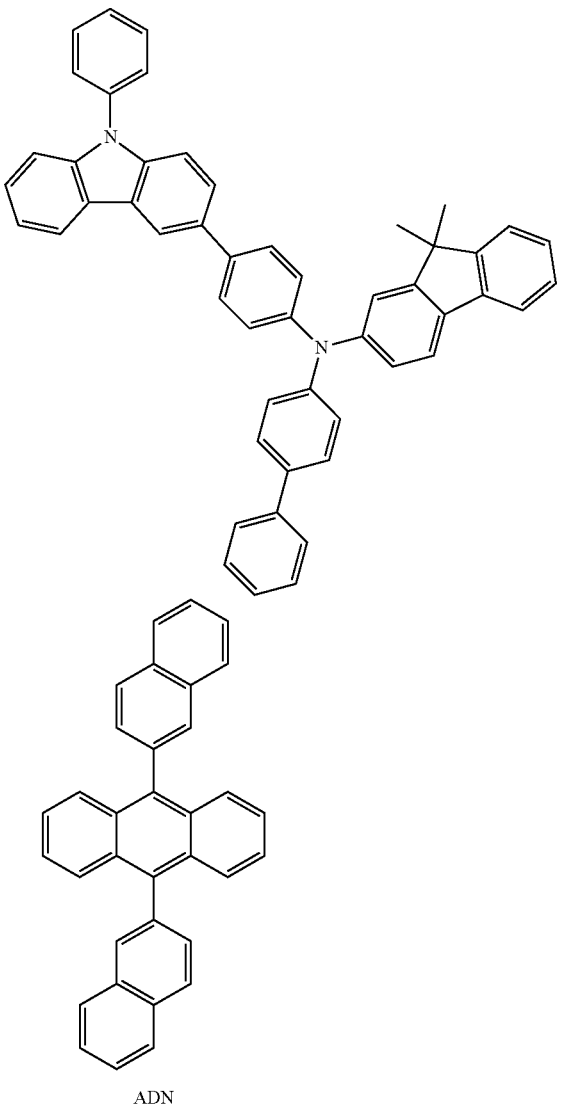

Examples 2 to 9

Organic light-emitting devices were manufactured in the same manner as in Example 1, except that Compounds 18, 21, 32, 36, 46, 52, 64, and 79 were used as a dopant instead of Compound 7 to form the emission layer.

Comparative Examples 1 to 4

Organic light-emitting devices were manufactured in the same manner as in Example 1, except that TPD and Compounds A to C were used as a dopant instead of Compound 7 to form the emission layer.

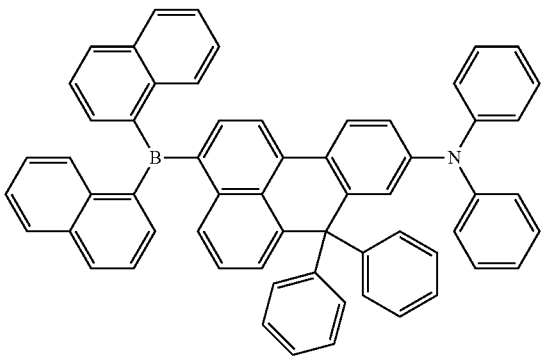

Compound B

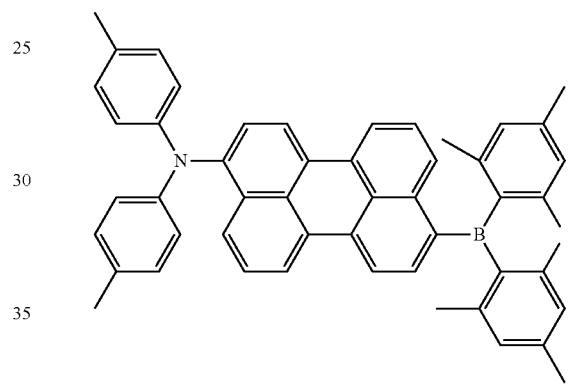

Compund C

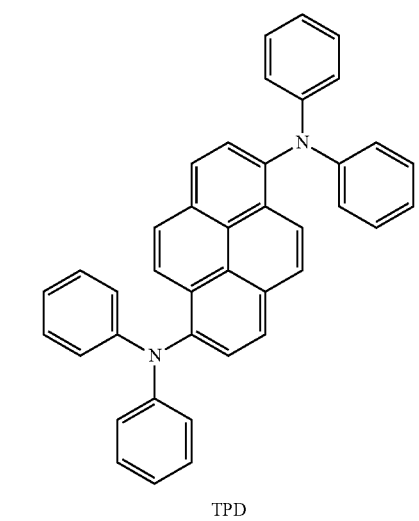

TPD

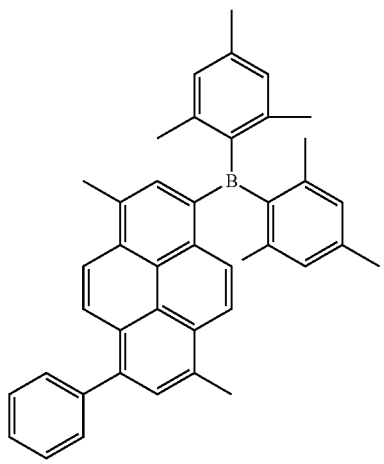

Compound A

Evaluation Example 1

The driving voltage, current density, luminance, efficiency, and half-lifespan of the organic light-emitting devices manufactured according to Examples 1 to 9, and Comparative Examples 1 to 4 were measured by using Kethley SMU 236 and a luminance meter PR650, and results thereof are shown in Table 2. The half-lifespan indicates a period of time required for the luminance of the organic light-emitting device to reach 50% with respect to an initial luminance.

TABLE 2

|  | Dopant | Driving voltage (V) | Current Density (mA/cm$^2$) | Luminance (cd/m$^2$) | Efficiency (cd/A) | Emission color | half lifespan (hr @100 mA/cm$^2$) |
|---|---|---|---|---|---|---|---|
| Example 1 | Compound 7 | 6.74 | 50 | 2,980 | 5.96 | blue | 289 |
| Example 2 | Compound 18 | 6.68 | 50 | 3,085 | 6.17 | blue | 281 |
| Example 3 | Compound 21 | 6.71 | 50 | 3,020 | 6.04 | blue | 305 |
| Example 4 | Compound 32 | 6.72 | 50 | 3,160 | 6.32 | blue | 327 |

TABLE 2-continued

| | Dopant | Driving voltage (V) | Current Density (mA/cm$^2$) | Luminance (cd/m$^2$) | Efficiency (cd/A) | Emission color | half lifespan (hr @100 mA/cm$^2$) |
|---|---|---|---|---|---|---|---|
| Example 5 | Compound 36 | 6.71 | 50 | 3,200 | 6.40 | blue | 341 |
| Example 6 | Compound 46 | 6.72 | 50 | 3,115 | 6.23 | blue | 311 |
| Example 7 | Compound 52 | 6.75 | 50 | 3,190 | 6.38 | blue | 336 |
| Example 8 | Compound 64 | 6.74 | 50 | 3,175 | 6.35 | blue | 343 |
| Example 9 | Compound 79 | 6.75 | 50 | 3,225 | 6.45 | blue | 350 |
| Comparative Example 1 | TPD | 6.96 | 50 | 2,730 | 5.46 | blue | 248 |
| Comparative Example 2 | <Compound A> | 7.87 | 50 | 1,615 | 3.23 | blue | 118 |
| Comparative Example 3 | Compound B | 7.35 | 50 | 2,415 | 4.83 | blue | 187 |
| Comparative Example 4 | Compound C | 6.95 | 50 | 2,560 | 5.12 | blue | 217 |

Referring to Table 2, it may be seen that the organic light-emitting devices manufactured according to Examples 1 to 9 exhibited improved driving voltage, improved luminance, improved efficiency, and improved half-lifespan, compared to the organic light-emitting devices manufactured according to Comparative Examples 1 to 4.

For example, Compound A only includes a boryl group, and Compound B does not include a pyrene core, and thus, the organic light-emitting devices prepared in Comparative Examples 2 and 3 may have low efficiency and lifespan compared to those prepared in Examples 1 to 9. In addition, Compound C includes a perylene-based core, and thus, emission wavelength of the organic light-emitting device prepared in Comparative Example 4 may be shifted to a longer wavelength region, compared to emission wavelengths of the organic light-emitting devices prepared in Examples 1 to 9, and the organic light-emitting device prepared in Comparative Example 4 may have a broad emission wavelength (e.g., a wave length having a relatively large full width at half maximum (FWHM)) due to intermolecular reaction of Compound C. Thus, the organic light-emitting device prepared in Comparative Example 4 may have a low efficiency compared to efficiencies of the organic light-emitting devices prepared in Examples 1 to 9.

As described above, according to the one or more of the above exemplary embodiments, the organic light-emitting device including the condensed-cyclic compound may have a low driving voltage, high efficiency, high luminance, and long lifespan.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A condensed-cyclic compound represented by Formula 1C:

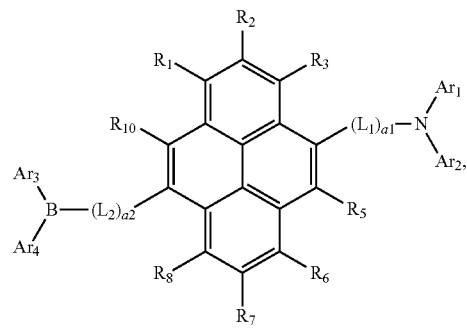

<Formula 1C> wherein in Formula 1C, $L_1$ and $L_2$ are each independently a group represented by one of the following Formulae 3-1 to 3-35:

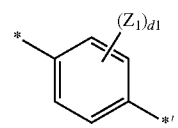

Formula 3-1

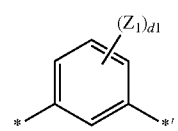

Formula 3-2

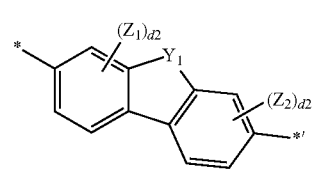

Formula 3-3

-continued
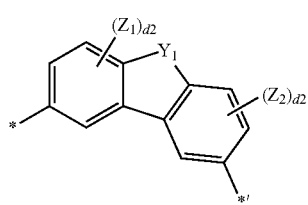
Formula 3-4
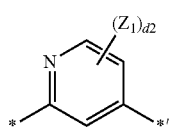
Formula 3-13
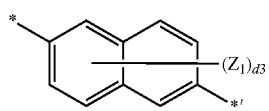
Formula 3-5
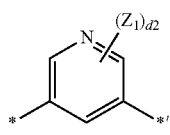
Formula 3-14
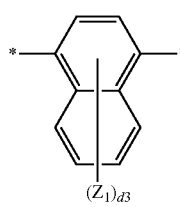
Formula 3-6
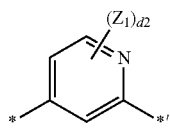
Formula 3-15
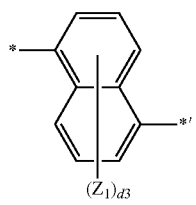
Formula 3-7
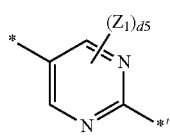
Formula 3-16
Formula 3-8
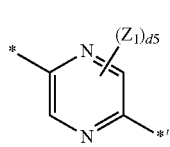
Formula 3-17
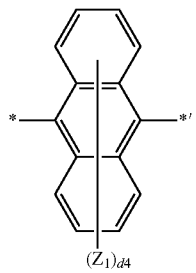
Formula 3-9
Formula 3-18
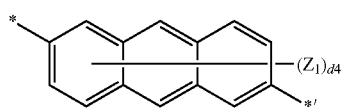
Formula 3-10
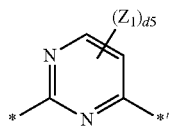
Formula 3-19
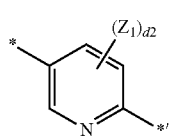
Formula 3-11
Formula 3-20
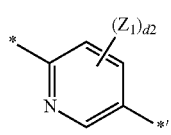
Formula 3-12
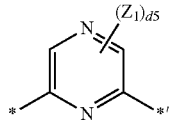
Formula 3-21
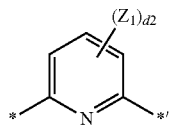
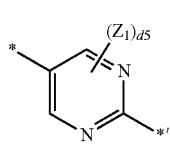
Formula 3-22
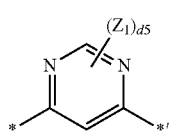
Formula 3-23

-continued

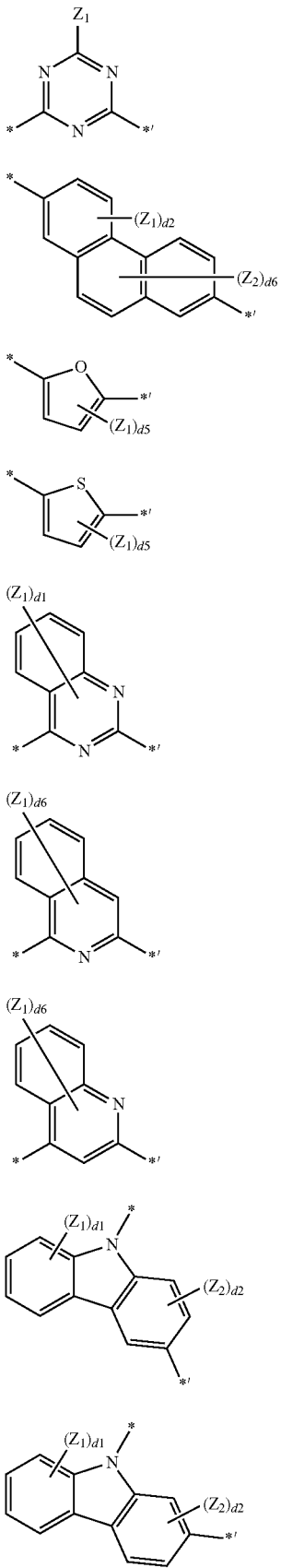

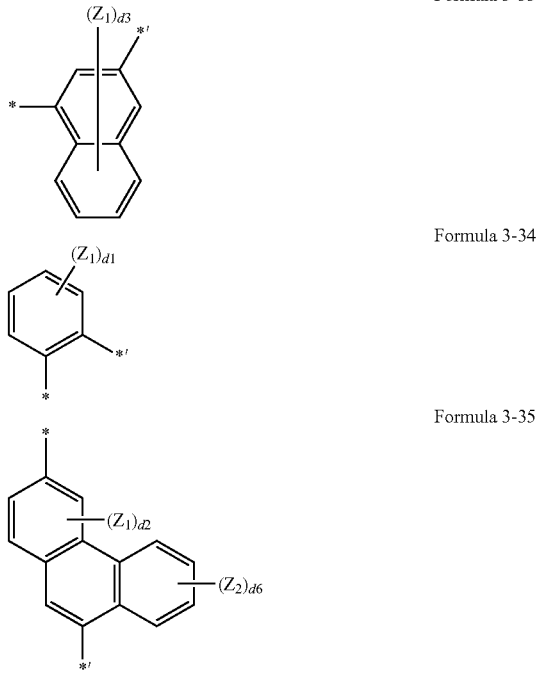

wherein, in Formulae 3-1 to 3-35, $Y_1$ is selected from O, S, $C(Z_3)(Z_4)$, $N(Z_5)$, and $Si(Z_6)(Z_7)$;

$Z_1$ to $Z_7$ are each independently selected from a hydrogen, a deuterium, —F, —Cl, —Br, —I, a cyano group, a $C_1$-$C_{20}$ alkyl group, a $C_1$-$C_{20}$ alkoxy group, a phenyl group, a naphthyl group, a fluorenyl group, a spirofluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

d1 is an integer selected from 1 to 4;
d2 is an integer selected from 1 to 3;
d3 is an integer selected from 1 to 6;
d4 is an integer selected from 1 to 8;
d5 is an integer selected from 1 and 2;
d6 is an integer selected from 1 to 5; and
*and *' each indicate a binding site to an adjacent atom;
a1 is selected from 0 or 1;
a2 is 0;
$Ar_1$ and $Ar_2$ are the same and are both a group represented by one of Formulae 5-24 to 5-28, and 5-43,
$Ar_3$ is a group represented by one of the following Formulae 5-1 to 5-43;
$Ar_4$ is a group represented by one of the following Formulae 6-1 to 6-7, 6-9 to 6-14, 6-16, 6-18 to 6-22, 6-24 to 6-38 and 6-41;
$R_{10}$ is hydrogen;
$R_1$ to $R_3$ and $R_5$ to $R_8$ are each independently selected from a hydrogen, a deuterium, —F, —Cl, —Br, —I, a cyano group, a $C_1$-$C_{20}$ alkyl group, a $C_1$-$C_{20}$ alkoxy group, —$Si(Q_1)(Q_2)(Q_3)$, and a group represented by one of the following Formulae 5-1 to 5-43; wherein $Q_1$ to $Q_3$ are each independently selected from a $C_1$-$C_{10}$ alkyl group, a $C_1$-$C_{10}$ alkoxy group, a phenyl group, and a naphthyl group:

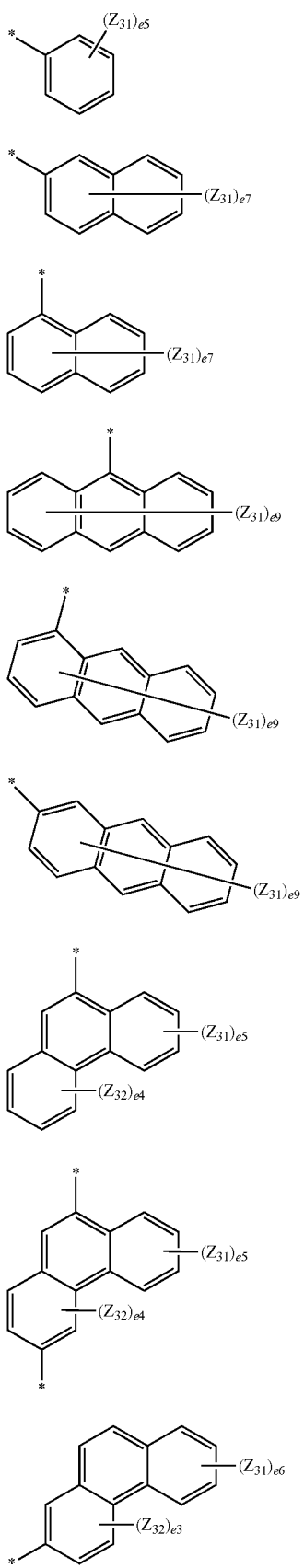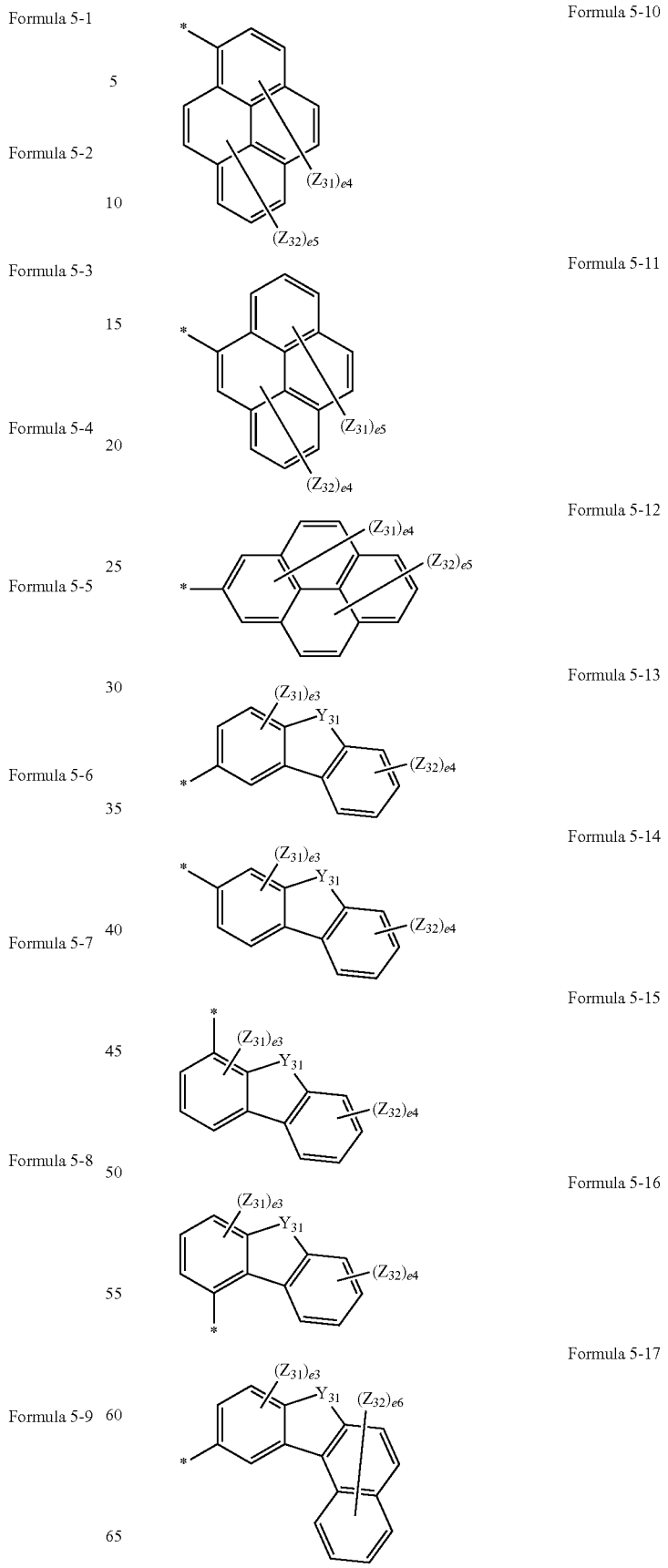

-continued
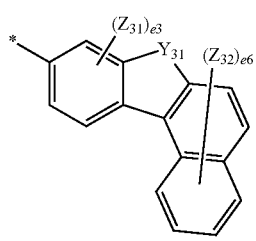
Formula 5-18
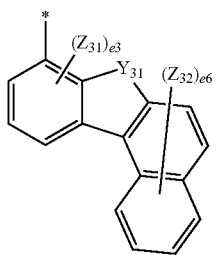
Formula 5-19
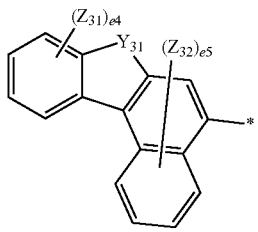
Formula 5-20
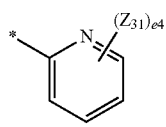
Formula 5-21
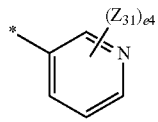
Formula 5-22
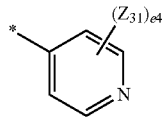
Formula 5-23
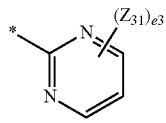
Formula 5-24
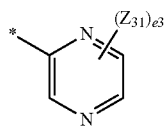
Formula 5-25
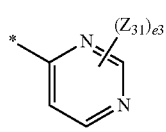
Formula 5-26
-continued
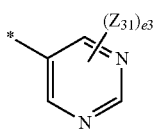
Formula 5-27
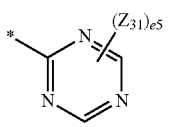
Formula 5-28
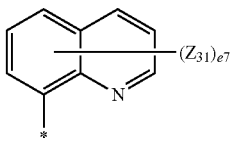
Formula 5-29
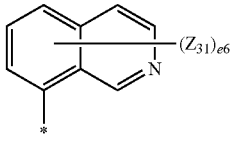
Formula 5-30
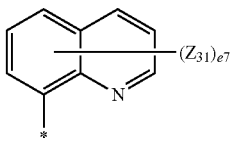
Formula 5-31
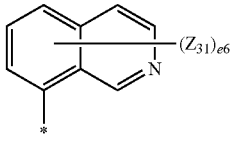
Formula 5-32
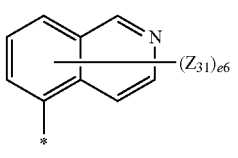
Formula 5-33
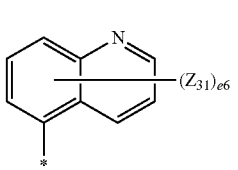
Formula 5-34
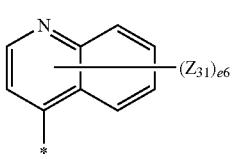
Formula 5-35
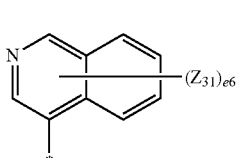
Formula 5-36
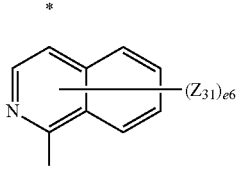
Formula 5-37

-continued

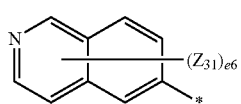
Formula 5-38

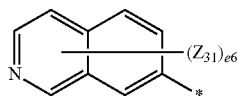
Formula 5-39

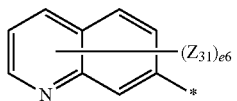
Formula 5-40

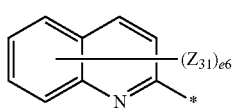
Formula 5-41

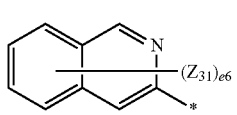
Formula 5-42

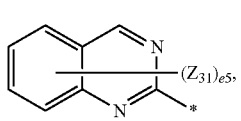
Formula 5-43 wherein, in Formulae 5-1 to 5-43, $Y_{31}$ is selected from O, S, $C(Z_{33})(Z_{34})$, $N(Z_{35})$, and $Si(Z_{36})(Z_{37})$;

$Z_{31}$ to $Z_{37}$ are each independently selected from a hydrogen, a deuterium, —F, —Cl, —Br, —I, a cyano group, a $C_1$-$C_{20}$ alkyl group, a $C_1$-$C_{20}$ alkoxy group, a phenyl group, a naphthyl group, a fluorenyl group, a spirofluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

e3 is an integer selected from 1 to 3, e4 is an integer selected from 1 to 4, e5 is an integer selected from 1 to 5, e6 is an integer selected from 1 to 6, e7 is an integer selected from 1 to 7, e8 is an integer selected from 1 to 8, e9 is an integer selected from 1 to 9, and

* indicates a binding site to an adjacent atom,

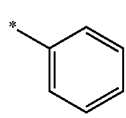
Formula 6-1

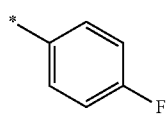
Formula 6-2

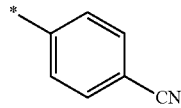
Formula 6-3

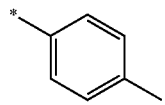
Formula 6-4

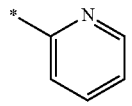
Formula 6-5

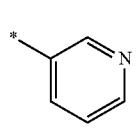
Formula 6-6

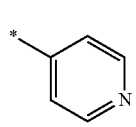
Formula 6-7

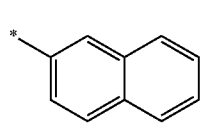
Formula 6-9

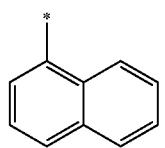
Formula 6-10

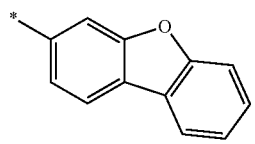
Formula 6-11

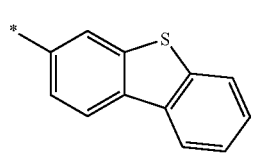
Formula 6-12

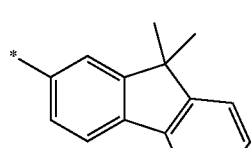
Formula 6-13

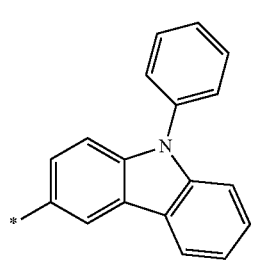
Formula 6-14

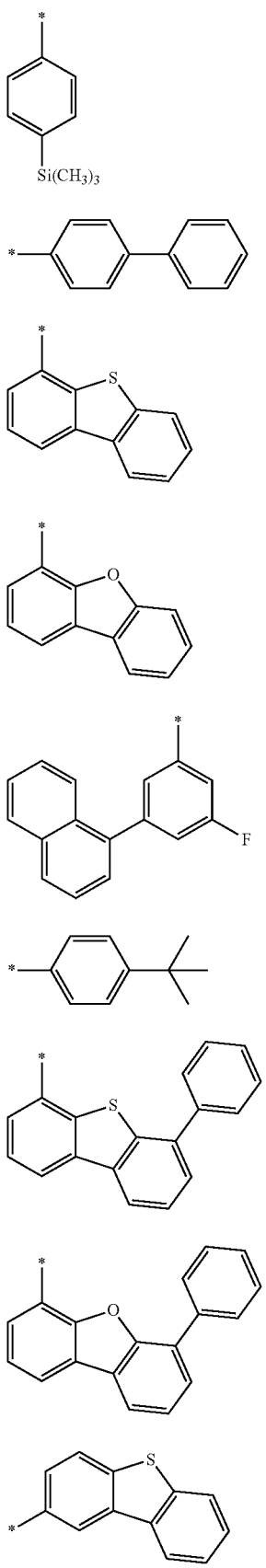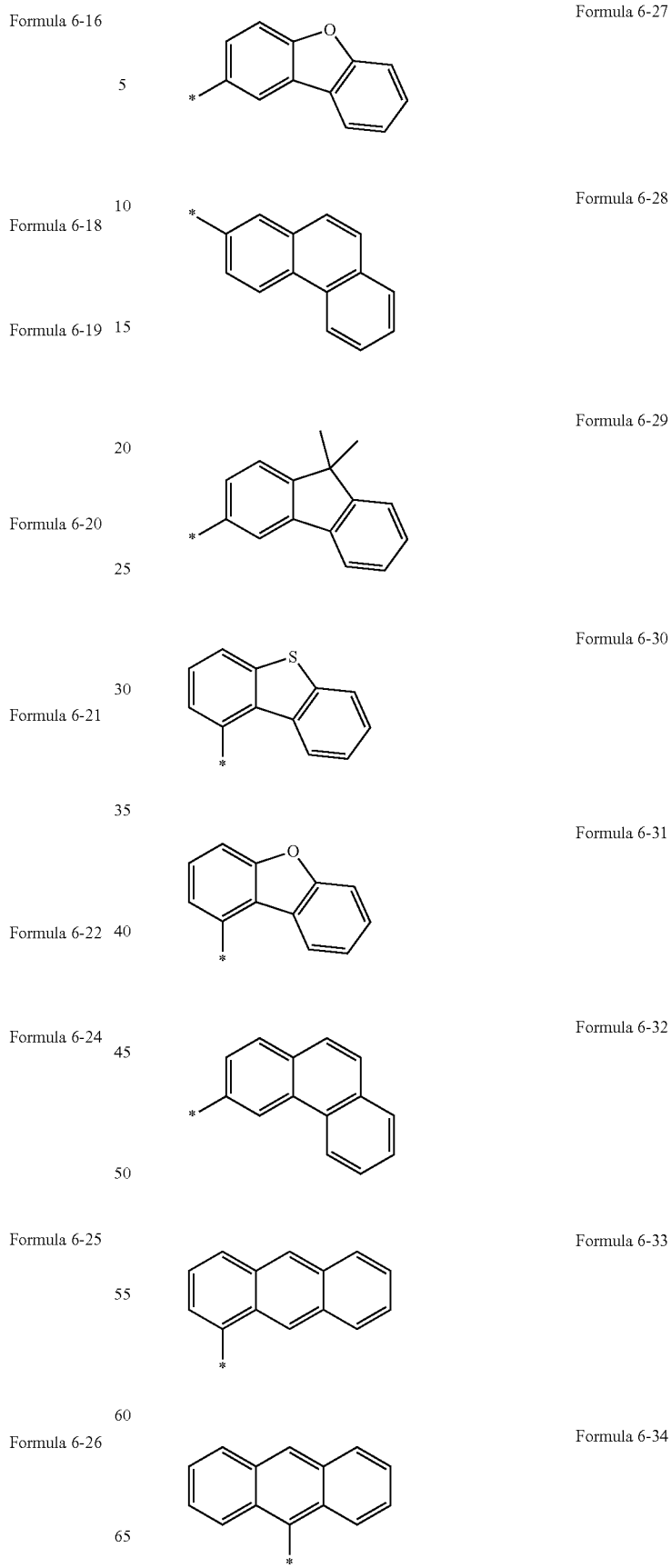

Formula 6-35

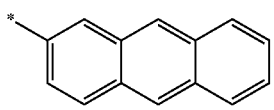

Formula 6-36

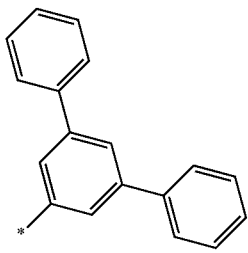

Formula 6-37

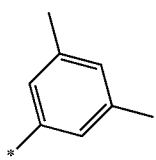

Formula 6-38

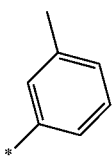

Formula 6-41

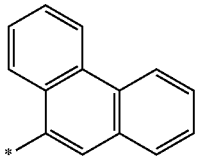

2. An organic light-emitting device, comprising:
a first electrode;
a second electrode facing the first electrode; and
an organic layer between the first electrode and the second electrode, the organic layer including an emission layer,
wherein the organic layer includes the condensed-cyclic compound as claimed in claim 1.

* * * * *

UNITED STATES PATENT AND TRADEMARK OFFICE
CERTIFICATE OF CORRECTION

PATENT NO.        : 11,793,063 B2                                                                                       Page 1 of 3
APPLICATION NO.   : 14/797853
DATED             : October 17, 2023
INVENTOR(S)       : Seokhwan Hwang et al.

It is certified that error appears in the above-identified patent and that said Letters Patent is hereby corrected as shown below:

In the Claims

In Column 132, Lines 57-60, in Claim 1, in Formula 3-22, delete " 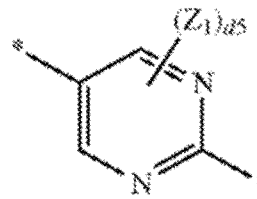 " and insert

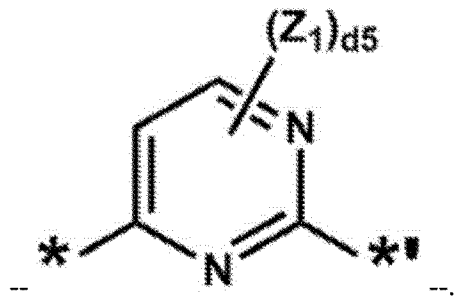 --.

In Column 134, Lines 17-27, in Claim 1, in Formula 3-35, delete " 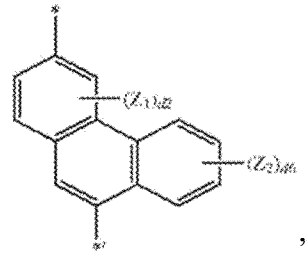 " and Signed and Sealed this
Twenty-seventh Day of February, 2024

Katherine Kelly Vidal
*Director of the United States Patent and Trademark Office*

CERTIFICATE OF CORRECTION (continued)
U.S. Pat. No. 11,793,063 B2 insert -- 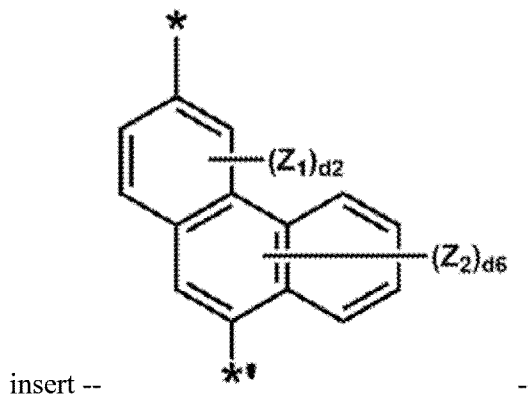 --.

In Column 135, Lines 41-48, in Claim 1, in Formula 5-7, delete " 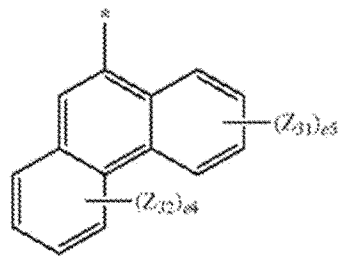 " and insert -- 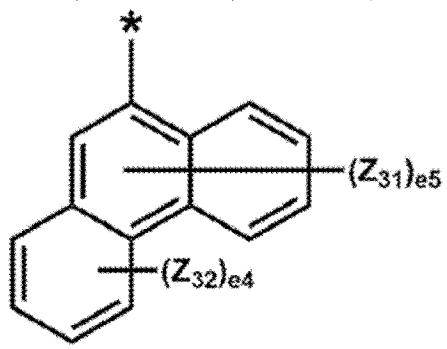 --.

In Column 135, Lines 50-69, in Claim 1, in Formula 5-8, delete " 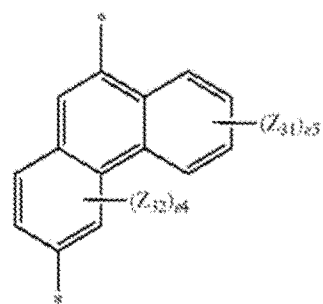 " and

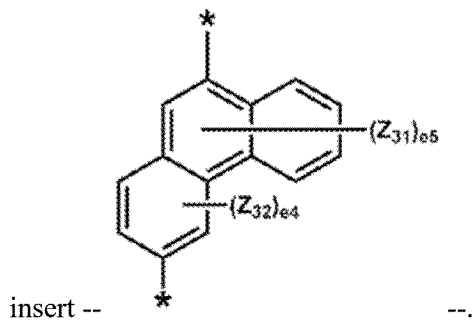
insert -- 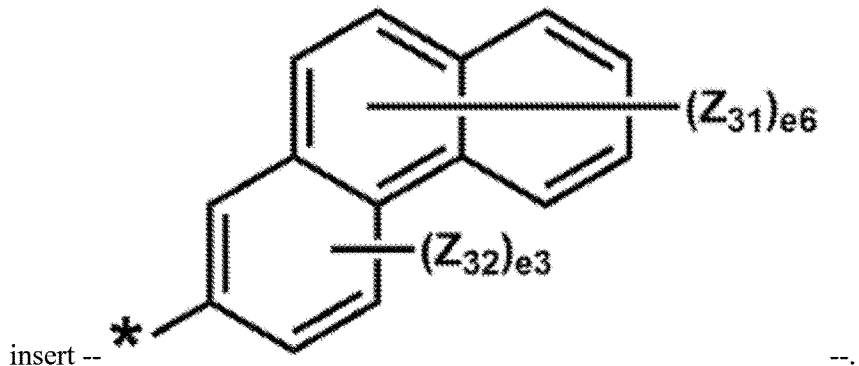 --.
In Column 135, Lines 61-67, in Claim 1, in Formula 5-9, delete " 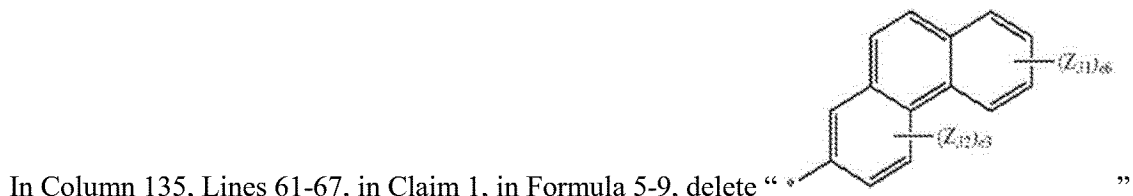 " and
insert -- 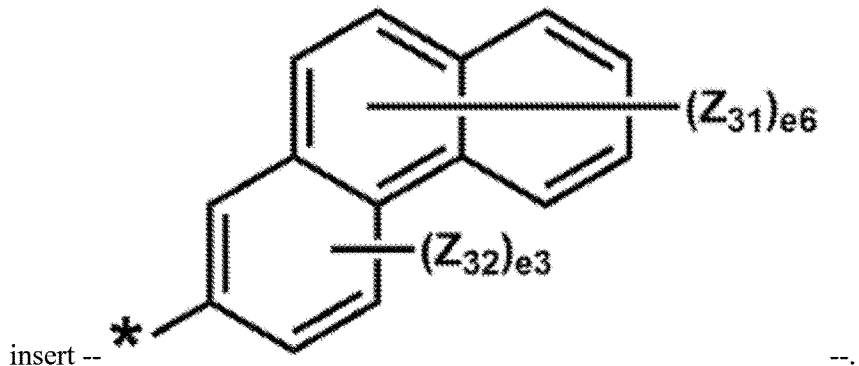 --.